US012641740B2

(12) United States Patent
Lee et al.

(10) Patent No.: US 12,641,740 B2
(45) Date of Patent: May 26, 2026

(54) FLEXIBLE DISPLAY AND ELECTRONIC DEVICE INCLUDING THE SAME

(71) Applicant: Samsung Electronics Co., Ltd.,
Suwon-si (KR)

(72) Inventors: Wonsun Lee, Suwon-si (KR); Jinwan An, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 169 days.

(21) Appl. No.: 18/416,356

(22) Filed: Jan. 18, 2024

(65) Prior Publication Data

US 2024/0284622 A1    Aug. 22, 2024

Related U.S. Application Data

(63) Continuation of application No. PCT/KR2024/000614, filed on Jan. 12, 2024.

(30) Foreign Application Priority Data

Feb. 21, 2023    (KR) ........................ 10-2023-0022970
Mar. 8, 2023    (KR) ........................ 10-2023-0030564

(51) Int. Cl.
*H05K 5/03*        (2006.01)
*C03C 15/00*        (2006.01)
(Continued)

(52) U.S. Cl.
CPC ............... *H05K 5/03* (2013.01); *C03C 15/00* (2013.01); *C03C 21/002* (2013.01); *H04M 1/0268* (2013.01); *H05K 5/0226* (2013.01)

(58) Field of Classification Search
CPC ...................... G06F 1/1652; H04M 1/00–1/82
See application file for complete search history.

(56) References Cited

U.S. PATENT DOCUMENTS 11,204,628 B2    12/2021    Paek et al.
11,581,510 B2    2/2023    Min
(Continued)

FOREIGN PATENT DOCUMENTS

KR        10-2424037 A        10/2019
KR        10-2069040 B1        1/2020
(Continued)

OTHER PUBLICATIONS

International Search Report and Written Opinion dated Apr. 12, 2024, issued in International Patent Application No. PCT/KR2024/000614.
(Continued)

*Primary Examiner* — Prashant J Khatri
(74) *Attorney, Agent, or Firm* — Jefferson IP Law, LLP

(57)    ABSTRACT

A flexible display is provided. The flexible display includes a display panel and a transparent member disposed on the display panel. The transparent member may a first glass portion having a first thickness, and a second glass portion having a second thickness thinner than the first thickness. An upper surface of the second glass portion is recessed in a direction toward the display panel with respect to an upper surface of the first glass portion. A lower surface of the second glass portion is recessed in an opposite direction to the display panel with respect to a lower surface of the first glass portion.

19 Claims, 43 Drawing Sheets

(51) Int. Cl.
    *C03C 21/00*       (2006.01)
    *H04M 1/02*       (2006.01)
    *H05K 5/02*       (2006.01)

(56)       References Cited

U.S. PATENT DOCUMENTS

| | | |
|---|---|---|
| 11,627,679 B2 | 4/2023 | Sunwoo et al. |
| 11,780,771 B2 | 10/2023 | Park et al. |
| 2020/0292731 A1* | 9/2020 | Park ...................... G06F 1/1641 |
| 2020/0324521 A1* | 10/2020 | Park ......................... B24B 7/24 |
| 2022/0048813 A1 | 2/2022 | Kim et al. |
| 2022/0194847 A1 | 6/2022 | Kim et al. |
| 2022/0203479 A1 | 6/2022 | Kwon et al. |
| 2022/0263043 A1* | 8/2022 | Sunwoo ................. H10K 59/12 |
| 2022/0404869 A1 | 12/2022 | Kim et al. |
| 2024/0198456 A1 | 6/2024 | Kwon et al. |

FOREIGN PATENT DOCUMENTS

| | | | |
|---|---|---|---|
| KR | 10-2020-0082363 A | 7/2020 | |
| KR | 10-2272926 B1 | 7/2021 | |
| KR | 10-2022-0092664 A | 7/2022 | |
| KR | 10-2022-0155944 A | 11/2022 | |
| KR | 10-2022-0168640 A | 12/2022 | |
| KR | 10-2023-0000011 A | 1/2023 | |
| KR | 10-2023-0082413 A | 6/2023 | |
| WO | WO-2017119627 A1 * | 7/2017 | ............. G09F 9/301 |

OTHER PUBLICATIONS

Extended European Search Report dated Mar. 6, 2026; European Appln. No. 24760474.7-1218/4625100 PCT/KR2024000614.

\* cited by examiner

*FIG.29*

| THICKNESS (t, um) | | REINFORCEMENT DEPTH (DOL, um) | | REINFORCEMENT DEPTH PROPORTION (DOL/t) | | EXPANSION RATE | | EXPANSION LENGTH (mm) | | DIFFERENCE IN EXPANSION LENGTH (mm) |
|---|---|---|---|---|---|---|---|---|---|---|
| FIRST PORTION | SECOND PORTION | FIRST PORTION | SECOND PORTION | FIRST PORTION | SECOND PORTION | FIRST PORTION | SECOND PORTION | FIRST PORTION | SECOND PORTION | |
| 50 | 30 | 5 | 5 | 10.0% | 16.7% | 0.09% | 0.14% | 0.09 | 0.14 | 0.06 |
| 80 | 40 | 8 | 8 | 10.0% | 20.0% | 0.09% | 0.17% | 0.09 | 0.17 | 0.09 |
| 50 | 30 | 4.5 | 4.5 | 9.0% | 15.0% | 0.08% | 0.13% | 0.08 | 0.13 | 0.05 |
| 80 | 40 | 6.0 | 6.0 | 7.5% | 15.0% | 0.06% | 0.13% | 0.06 | 0.13 | 0.06 |

FIG.30

| THICKNESS (t, um) | | REINFORCEMENT DEPTH (DOL, um) | | REINFORCEMENT DEPTH PROPORTION (DOL/t) | | EXPANSION RATE | | EXPANSION LENGTH (mm) | | DIFFERENCE IN EXPANSION LENGTH (mm) |
|---|---|---|---|---|---|---|---|---|---|---|
| FIRST PORTION | SECOND PORTION | FIRST PORTION | SECOND PORTION | FIRST PORTION | SECOND PORTION | FIRST PORTION | SECOND PORTION | FIRST PORTION | SECOND PORTION | |
| 50 | 30 | 7.5 | 4.5 | 15.0% | 15.0% | 0.13% | 0.13% | 0.13 | 0.13 | 0.00 |
| 80 | 40 | 12 | 6 | 15.0% | 15.0% | 0.13% | 0.13% | 0.13 | 0.13 | 0.00 |
| 100 | 50 | 15 | 7.5 | 15.0% | 15.0% | 0.13% | 0.13% | 0.13 | 0.13 | 0.00 |
| 150 | 50 | 22.5 | 7.5 | 15.0% | 15.0% | 0.13% | 0.13% | 0.13 | 0.13 | 0.00 |

FLEXIBLE DISPLAY AND ELECTRONIC DEVICE INCLUDING THE SAME

CROSS-REFERENCE TO RELATED APPLICATION(S)

This application is a continuation application, claiming priority under § 365(c), of an International application No. PCT/KR2024/000614, filed on Jan. 12, 2024, which is based on and claims the benefit of a Korean patent application number 10-2023-0022970, filed on Feb. 21, 2023, in the Korean Intellectual Property Office, and of a Korean patent application number 10-2023-0030564, filed on Mar. 8, 2023, in the Korean Intellectual Property Office, the disclosure of each of which is incorporated by reference herein in its entirety.

BACKGROUND

1. Field

The disclosure relates to a bendable flexible display and an electronic device including the same.

2. Description of Related Art

Recently, there is increasing interest in bendable electronic devices (also referred to as 'flexible electronic devices') including a bendable flexible display (simply 'flexible display'). The window member used in the flexible display requires flexibility in order to prevent deformation when folded or bent as well as impact resistance from surface hardness or strength.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a transparent member with enhanced flexibility and strength and a flexible display including the same.

Additional aspects will be set forth in part in the description which follows and, in part, will be apparent from the description, or may be learned by practice of the presented embodiments.

In accordance with an aspect of the disclosure, a flexible display is provided. The flexible display includes a display panel and a transparent member disposed on the display panel. The transparent member may a first glass portion having a first thickness, and a second glass portion having a second thickness thinner than the first thickness. An upper surface of the second glass portion is recessed in a direction toward the display panel with respect to an upper surface of the first glass portion. A lower surface of the second glass portion is recessed in an opposite direction to the display panel with respect to a lower surface of the first glass portion.

In accordance with another aspect of the disclosure, an electronic device is provided. The electronic device includes a housing including a first housing and a second housing, a hinge module connected with the first housing and the second housing, and a flexible display at least partially received in the first housing and the second housing. The flexible display includes a display panel and a transparent member disposed on the display panel. The transparent member may a first glass portion having a first thickness, and a second glass portion having a second thickness thinner than the first thickness. An upper surface of the second glass portion is recessed in a direction toward the display panel with respect to an upper surface of the first glass portion. A lower surface of the second glass portion is recessed in an opposite direction to the display panel with respect to a lower surface of the first glass portion.

In accordance with another aspect of the disclosure, a flexible transparent member is provided. The flexible transparent member includes a second glass portion having a second thickness thinner than the first thickness and a resin portion disposed on the second glass portion. An upper surface of the second glass portion is recessed in a downward direction with respect to an upper surface of the first glass portion. A lower surface of the second glass portion is recessed in an upward direction with respect to a lower surface of the first glass portion. The resin portion is filled in the recessed region.

According to various embodiments of the disclosure, it is possible to evenly disperse internal stress by etching the upper side and the lower side of a thin portion of the transparent member with different thicknesses.

According to various embodiments of the disclosure, it is possible to prevent warpage by forming a chemically reinforced area to have different reinforcement depths in a thick portion and a thin portion in a transparent member with different thicknesses.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 29 and 30 are tables illustrating a difference in expansion length of a transparent member with different thicknesses according to a chemical reinforcement depth proportion according to various embodiments of the disclosure.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
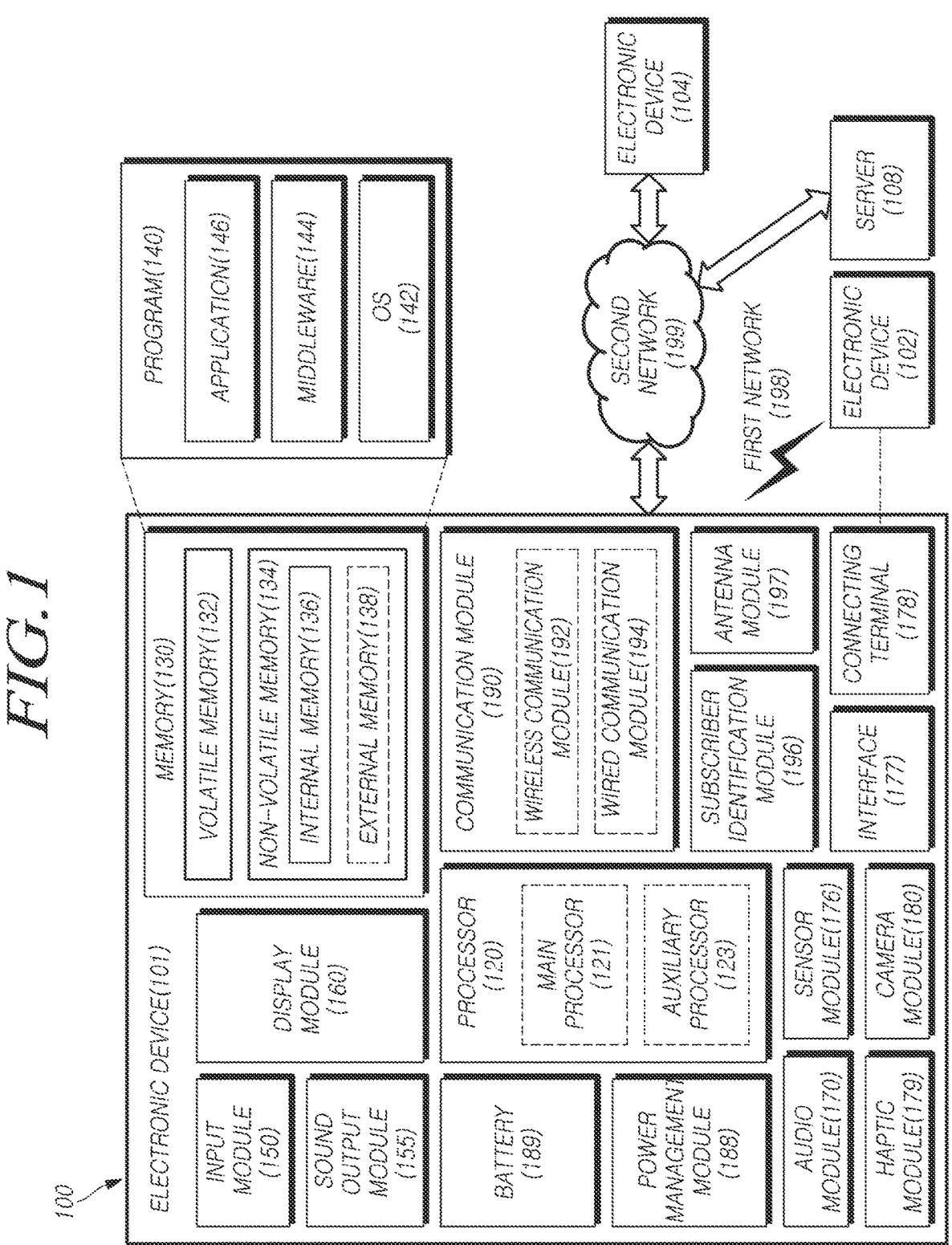
FIG. 1 is a view illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with a first external electronic device 102 via a first network 198 (e.g., a short-range wireless communication network), a second external electronic device 104, or a server 108 via a second network 199 (e.g., a long-range wireless communication network). According to an embodiment of the disclosure, the electronic device 101 may communicate with the second external electronic device 104 via the server 108. According to an embodiment of the disclosure, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, and an antenna module 197. In an embodiment of the disclosure, at least one (e.g., the connecting terminal 178) of the components may be omitted from the electronic device 101, or one or more other components may be added in the electronic device 101. According to an embodiment of the disclosure, some (e.g., the sensor module 176, the camera module 180, or the antenna module 197) of the components may be integrated into a single component (e.g., the display module 160).

The processor 120 may execute, for example, a software (e.g., a program 140) to control at least one other component (e.g., a hardware or software component) of the electronic device 101 coupled with the processor 120, and may perform various data processing or computation. According to an embodiment of the disclosure, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use less power than the main processor 121 or designated to perform a specific function. The auxiliary processor 123 may be implemented as separate from, or as part of the main processor 121.

The auxiliary processor 123 may control at least some functions or states (e.g., power, temperature, active, or inactive) related to at least one component (e.g., the display module 160, the sensor module 176, or the communication module 190) among the components of the electronic device 101, instead of the main processor 121 while the main processor 121 is in an inactive (e.g., a sleep) state, or together with the main processor 121 while the main processor 121 is in an active state (e.g., executing an application). According to an embodiment of the disclosure, the auxiliary processor 123 (e.g., an ISP or a CP) may be implemented as part of another component (e.g., the camera module 180 or the communication module 190) functionally related to the auxiliary processor 123. According to an embodiment of the disclosure, the auxiliary processor 123 (e.g., the NPU) may include a hardware structure specified for artificial intelligence model processing. The artificial intelligence model may be generated via machine learning. Such learning may be performed, e.g., by the electronic device 101 in which the artificial intelligence performs operation, or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored in the memory 130 as software and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor configured to detect a touch, or a pressure sensor configured to measure the intensity of a force generated by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an accelerometer, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the first external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the first external electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, ISPs, or flashes.

The power management module 188 may manage power supplied to the electronic device 101. According to an embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the first external electronic device 102, the second external electronic device 104, or the server 108) and performing communication via the established communication channel. The communication module 190 may include one or more CPs that are operable independently from the processor 120 (e.g., the AP) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a $5^{th}$ generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a $4^{th}$ generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment of the disclosure, the antenna module 197 may include one antenna including a radiator formed of a conductor or conductive pattern formed on a substrate (e.g., a printed circuit board (PCB)). According to an embodiment of the disclosure, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment of the disclosure, other parts (e.g., radio frequency integrated circuit (RFIC)) than the radiator may be further formed as part of the antenna module 197.

According to various embodiments of the disclosure, the antenna module 197 may form a mmWave antenna module. According to an embodiment of the disclosure, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the second external electronic device 104 via the server 108 coupled with the second network 199. The external electronic devices 102 or 104 each may be a device of the same or a different type from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment of the disclosure, the external electronic device 104 may include an Internet-of-things (IoT) device. The server 108 may be an intelligent server using machine learning and/or a neural network. According to an embodiment of the disclosure, the second external electronic device 104 or the server 108 may be included in the second network 199. The electronic device 101 may be applied to intelligent services (e.g., a smart home, a smart city, a smart car, or healthcare) based on 5G communication technology or IoT-related technology.

Figure 2A:
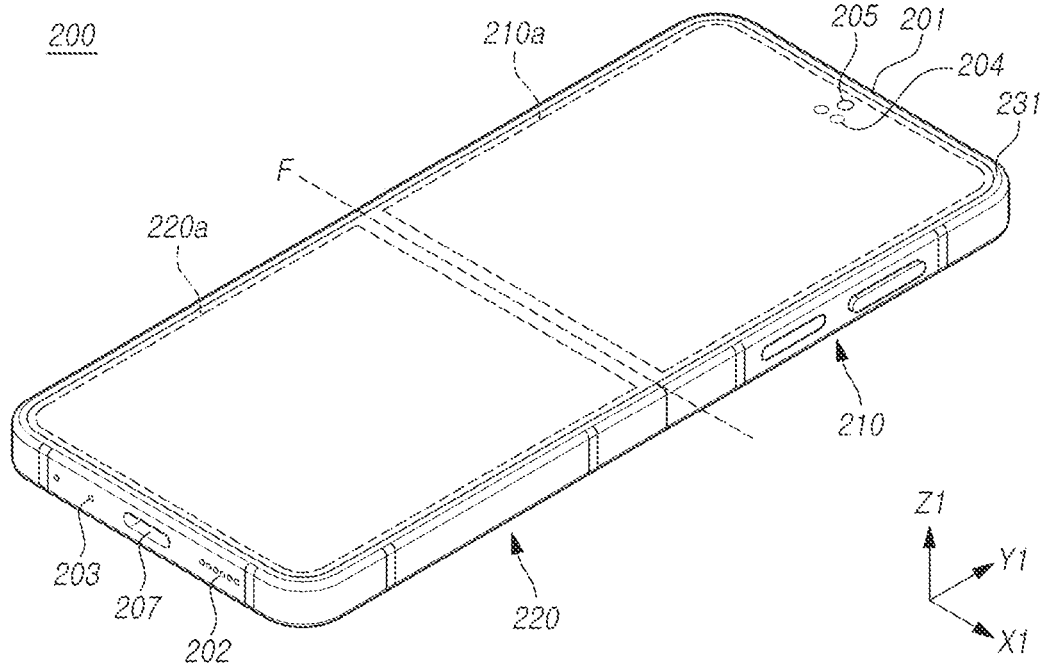
FIG. 2A is a perspective view illustrating an electronic device in an unfolding state according to an embodiment of the disclosure.
Figure 2B:
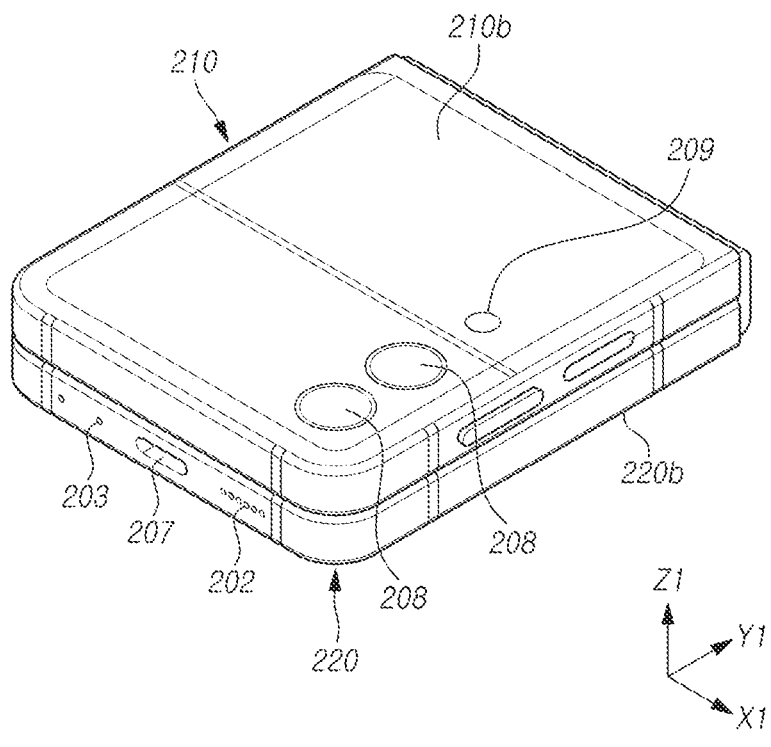
FIG. 2B is a perspective view of an electronic device in a folding state according to an embodiment of the disclosure.
Figure 3:
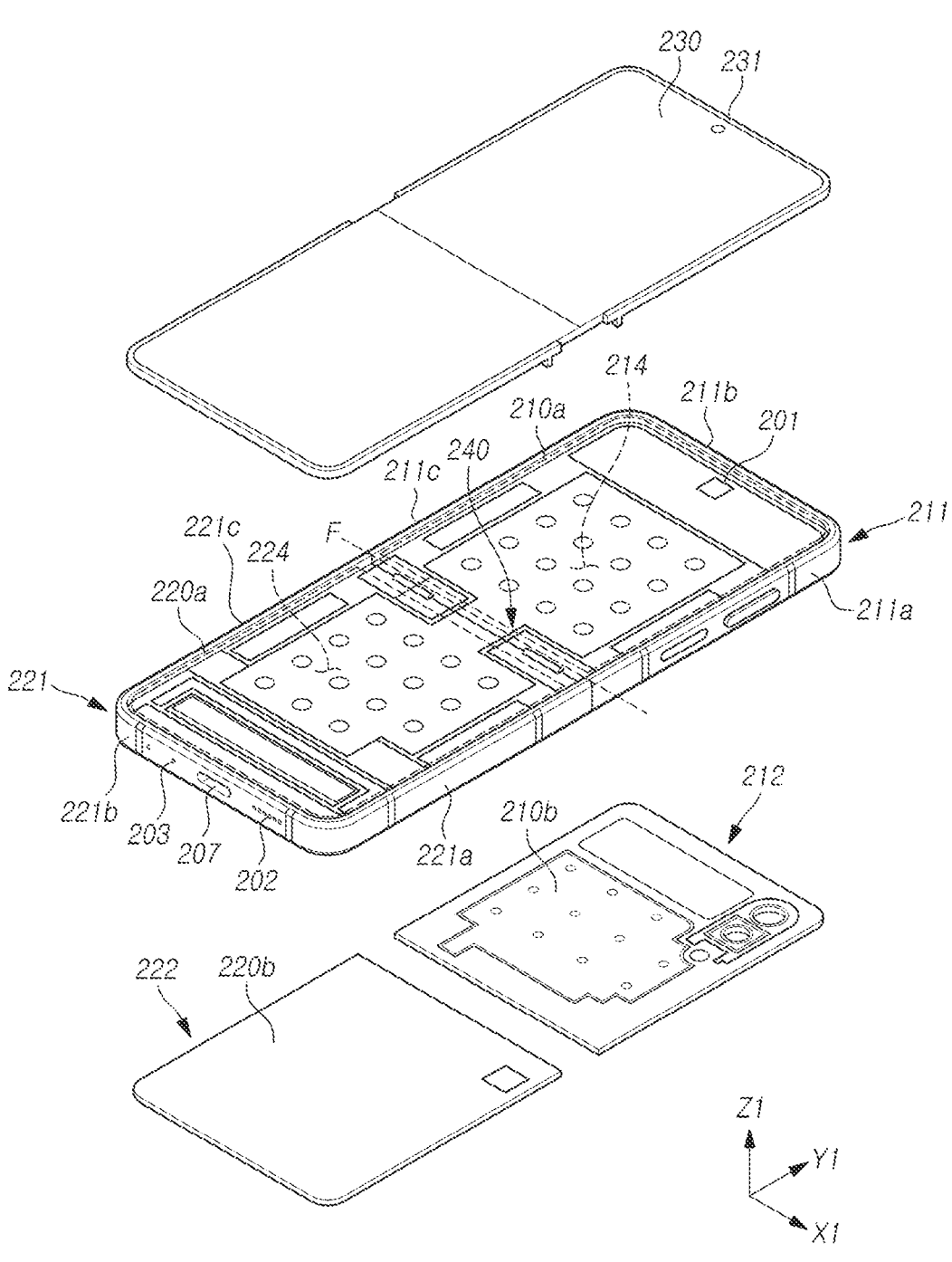
FIG. 3 is an exploded view illustrating an electronic device according to an embodiment of the disclosure.

FIG. 2A is a perspective view illustrating an electronic device in an unfolding state according to an embodiment of the disclosure. FIG. 2B is a perspective view of an electronic device in a folding state according to an embodiment of the disclosure. FIG. 3 is an exploded view illustrating an electronic device according to an embodiment of the disclosure. The electronic device shown in FIGS. 2A, 2B, and 3 is for illustrative purposes only, and the disclosure is not limited by the drawings. The XYZ coordinate system shown in FIGS. 2A, 2B, and 3 is for illustrative purposes of describing the layout of the components and does not limit the scope of the claims.

Referring to FIGS. 2A, 2B, and 3, an electronic device 200 (e.g., the electronic device 101 of FIG. 1) may include at least one pair of housings 210 and 220. The pair of housings 210 and 220 may be rotatably coupled to fold about, e.g., a hinge (e.g., a hinge 240 of FIG. 3) while facing each other. For example, the pair of housings 210 and 220 may include a first housing 210 and a second housing 220. The first housing 210 and the second housing 220 may be disposed on two opposite sides of the folding axis F. One end area of the first housing 210 and one end area of the second housing 220 may be disposed side by side with the hinge 240 interposed therebetween. The first housing 210 and the second housing 220 may have symmetrical shapes with respect to a plane including the folding axis F and extending in the Z1-axis direction. Here, the folding axis F may be an axis in the X1 direction, formed by the hinge 240.

The first housing 210 may have substantially the same length as the second housing 220 (e.g., length in the Y1-axis direction), but is not limited thereto. The first housing 210 may have substantially the same width as the second housing 220 (e.g., width in the X1-axis direction), but is not limited thereto.

Hereinafter, 'unfolding state (or flat state)' or 'unfolded state' may refer to a state in which the angle between the first housing 210 and the second housing 220 is substantially 180 degrees. 'Folding state' or a 'folded state' may refer to a state in which the angle formed between the first housing 210 and the second housing 220 is substantially 0 degrees. 'Intermediate state' may refer to any state between the unfolding state and the folding state. The electronic device 200 may rotate about the hinge 240 such that the first housing 210 and the second housing 220 form an angle from 0 degrees to 180 degrees, for example. The electronic device 200 may rotate about the hinge 240 such that the first housing 210 and the second housing 220 form an angle from 180 degrees to 360 degrees, for example.

The first housing 210 may include a first surface 210a and a second surface 210b. For example, the first surface 210a may be provided to face in a first direction (e.g., +Z1-axis direction). The first surface 210a may be, e.g., a surface on which at least a portion of a flexible display 230 is disposed. The first surface 210a may refer to, e.g., a virtual surface overlapping at least a portion of the flexible display 230. For example, the second surface 210b may be provided to face in a second direction (e.g., −Z1-axis direction). The second surface 210b may be, e.g., a surface on which a first rear cover 212 is disposed. The second surface 210b may be parallel to the first surface 210a. The second surface 210b may refer to a plane defined by, e.g., the first rear cover 212.

The second housing 220 may include a third surface 220a and a fourth surface 220b. For example, the third surface

220a may be provided to face in the first direction (e.g., +Z1-axis direction). The third surface 220a may be, e.g., a surface on which at least a portion of the flexible display 230 is disposed. The third surface 220a may refer to, e.g., a virtual surface overlapping at least a portion of the flexible display 230. For example, the fourth surface 220b may be provided to face in a second direction (e.g., −Z1-axis direction). The fourth surface 220b may be, e.g., a surface on which a second rear cover 222 is disposed. The fourth surface 220b may be parallel to the third surface 220a. The fourth surface 220b may refer to a plane defined by, e.g., the second rear cover 222.

When the electronic device 200 is unfolded, the first surface 210a and the third surface 220a may be positioned within one arbitrary virtual plane (e.g., an x-y plane). For example, the first surface 210a and the third surface 220a may form the same plane when the electronic device 200 is unfolded. For example, the first surface 210a and the third surface 220a may be disposed to form 180 degrees with respect to the x-y plane in the unfolding state. When the electronic device 200 is unfolded, the second surface 210b and the fourth surface 220b may be positioned within another arbitrary virtual plane (e.g., an x-y plane). For example, the second surface 210b and the fourth surface 220b may form the same plane in the unfolding state of the electronic device 200. For example, the second surface 210a and the fourth surface 220b may be disposed to form 180 degrees with respect to the x-y plane in the unfolding state.

In the folding state of the electronic device 200, at least a portion of the first surface 210a and at least a portion of the third surface 220a may face each other. For example, in the folding state of the electronic device 200, the angle between the first surface 210a and the third surface 220a may be 0 degrees from the x-y plane. As the electronic device 200 is folded from the unfolding state, the angle between the first surface 210a and the third surface 220a from the x-y plane may gradually decrease. For example, the angle formed between the first surface 210a and the third surfaces 220a from the x-y plane in the intermediate state may be determined between about 0 degrees and about 180 degrees. In the folding state of the electronic device 200, the second surface 210b and the fourth surface 220b may be parallel to each other. For example, the second surface 210b and the fourth surface 220b may face in opposite directions in the folding state of the electronic device 200.

The pair of housings 210 and 220 included in the electronic device 200 is not limited to the shape and coupling shown but may rather be implemented in other shapes or via a combination and/or coupling of other components.

The first housing 210 may include a first side frame 211. The first side frame 211 may constitute a side surface of the first housing 210. The first side frame 211 may form part of the exterior of the first housing 210. The first side frame 211 may be provided to protect components received inside the electronic device 200 from the outside.

The first side frame 211 may include a first side member 211a, a second side member 211b, and/or a third side member 211c. The first side member 211a may have a first length along a first length direction (e.g., Y1-axis direction). The second side member 211b may extend from the first side member 211a in a substantially vertical direction (e.g., the X1-axis direction). The second side member 211b may extend to have a second length equal to or different from the first length. The third side member 211c may extend from the second side member 211b in a substantially vertical direction (e.g., the Y1-axis direction). The third side member 211c may extend in a direction substantially parallel to the first side member 211a. The third side member 211c may have a first length along the first length direction (e.g., Y1-axis direction).

The first side member 211a, the second side member 211b, and the third side member 211c may be disposed to be visible from the outside. At least a portion of the first side member 211a, the second side member 211b, and/or the third side member 211c may be formed of a curved surface. The first side frame 211 may be formed in a quadrilateral shape (e.g., square or rectangle) by the first side member 211a, the second side member 211b, and the third side member 211c. The first side member 211a, the second side member 211b, and the third side member 211c may be integrally formed but are not limited thereto.

The second housing 220 may include a second side frame 221. The second side frame 221 may constitute a side surface of the second housing 220. The second side frame 221 may form part of the exterior of the second housing 220. The second side frame 221 may be provided to protect components received inside the electronic device 200 from the outside.

The second side frame 221 may include a fourth side member 221a, a fifth side member 221b, and/or a sixth side member 221c. The fourth side member 221a may have a third length along a first length direction (e.g., Y1-axis direction). The fifth side member 221b may extend from the fourth side member 221a in a substantially vertical direction (e.g., the X1-axis direction). The fifth side member 221b may extend to have a fourth length equal to or different from the third length. The sixth side member 221c may extend from the fifth side member 221b in a substantially vertical direction (e.g., the Y1-axis direction). The sixth side member 221c may extend in a direction substantially parallel to the fourth side member 221a. The sixth side member 221c may have a third length along the first length direction (e.g., Y1-axis direction).

The fourth side member 221a, the fifth side member 221b, and the sixth side member 221c may be disposed to be visible from the outside. At least a portion of the fourth side member 221a, the fifth side member 221b, and/or the sixth side member 221c may be formed of a curved surface. The second side frame 221 may be formed in a quadrilateral shape (e.g., square or rectangle) by the fourth side member 221a, the fifth side member 221b, and the sixth side member 221c. The first length may be substantially equal to the third length. The second length may be substantially equal to the fourth length. The fourth side member 221a, the fifth side member 221b, and the sixth side member 221c may be integrally formed but are not limited thereto.

In the unfolding state of the electronic device 200, the first side member 211a and the fourth side member 221a may be positioned substantially in a straight line. In the unfolding state of the electronic device 200, the second side member 211b and the fifth side member 221b may be parallel to each other. In the unfolding state of the electronic device 200, the third side member 211c and the sixth side member 221c may be positioned substantially in a straight line.

In the folding state of the electronic device 200, the first side member 211a and the fourth side member 221a may overlap each other. In the folding state of the electronic device 200, the second side member 211b and the fifth side member 221b may overlap each other. In the folding state of the electronic device 200, the third side member 211c and the sixth side member 221c may overlap each other.

The first housing 210 may include a first rear cover 212. The first rear cover 212 may form at least a portion of the second surface 210b of the first housing 210. The first rear cover 212 may be combined with the first side frame 211. The first rear cover 212 may be integrally formed with, e.g., the first side frame 211.

The second housing 220 may include a second rear cover 222. The second rear cover 222 may form at least a portion of the fourth surface 220b of the second housing 220. The second rear cover 222 may be combined with the second side frame 221. The second rear cover 222 may be integrally formed with, e.g., the second side frame 221.

The first rear cover 212 and/or the second rear cover 222 may be formed of at least one of, or a combination of at least two of, laminated or colored glass, ceramic, Glastic, polymer, or metal (e.g., aluminum, stainless steel (STS), or magnesium).

The electronic device 200 may include a flexible display 230 (e.g., a foldable display or display). The flexible display 230 may be disposed across the first housing 210, the hinge 240, and the second housing 220. The flexible display 230 may be disposed from the first surface 210a of the first housing 210 across the hinge structure 240 up to at least a portion of the third surface 220a of the second housing 220. The flexible display 230 may be disposed so that the first surface 210a of the first housing 210 and the third surface 220a of the second housing 220 overlap. A portion of the flexible display 230 corresponding to the hinge 240 may be bent according to the rotation of the hinge 240.

In the unfolding state, the flexible display 230 may be disposed to be visible from the outside. In a folding state, the flexible display 230 may be disposed to be invisible from the outside.

The electronic device 200 may include a protective cover 231. The protective cover 231 may be positioned to protect an edge portion of the flexible display 230. The protective cover 231 may form part of the exterior of the electronic device 200.

The electronic device 210 may include at least one of an input device (e.g., a microphone 203), a sound output device (e.g., a receiver 201 for phone calls or speaker 202), sensor modules 204, the camera module (a first camera module 205 or a second camera module 208), a connector port 207, a key input device (not shown), or an indicator (not shown), disposed in a first inner space 214 of the first housing 210 or a second inner space 224 of the second housing 220. The electronic device 200 may be configured to omit at least one of the above-described components or add other components.

The input device may include a plurality of microphones disposed to detect the direction of sound. The sound output device may include, e.g., the receiver 201 for phone calls and the speaker 202. The sound output devices 201 and 202 may be disposed to face the outside through at least one speaker hole, formed in the first housing 210 or the second housing 220. The connector port 207 may be disposed to face the outside through a connector port hole, formed in the first housing 210 or the second housing 220.

The sensor module 204 may produce an electrical signal or data value corresponding to the internal operation state or external environment state of the electronic device 200. The sensor module 204 may include at least one of a proximity sensor, an illuminance sensor, a time of flight (TOF) sensor, an ultrasonic sensor, a fingerprint recognition sensor, a gesture sensor, a gyro sensor, an air pressure sensor, a magnetic sensor, an accelerometer, a grip sensor, a color sensor, an IR sensor, a biometric sensor, a temperature sensor, or a humidity sensor.

The camera module may include the first camera module 205 disposed on the front (e.g., surface in the +Z1-axis direction) of the electronic device 200 or a second camera module 208 disposed on the rear surface (e.g., surface in the −Z1-axis direction) of the electronic device 200. The first camera module 205 and/or the second camera module 208 may include one or more lenses, an image sensor, and/or an ISP. For example, the first camera module 205 may be disposed under the flexible display 230 and be configured to capture a subject through a portion of the active area of the flexible display 230. The flash 209 may be disposed on the second camera module 208. The flash 209 may include, e.g., a light emitting diode (LED) or a xenon lamp.

Figure 4A:
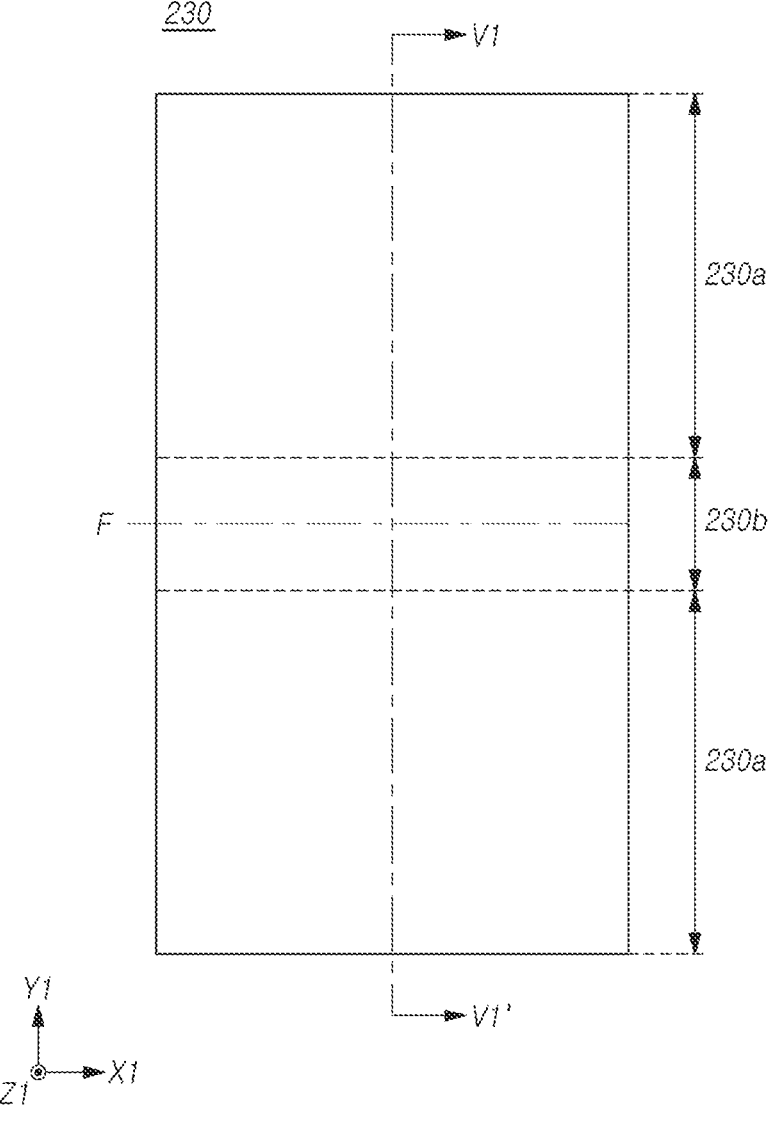
FIG. 4A is a plan view illustrating a flexible display according to an embodiment of the disclosure.
Figure 4B:
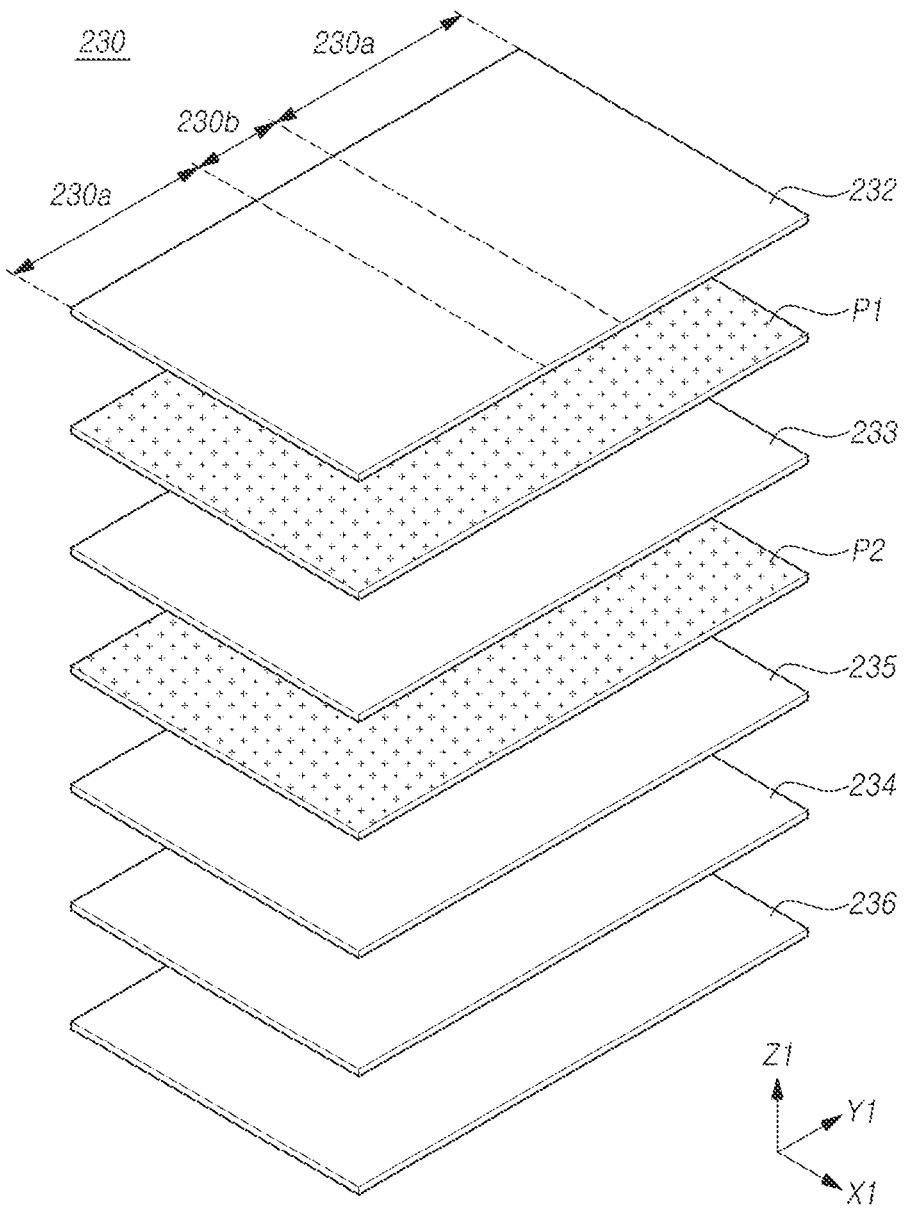
FIG. 4B is an exploded perspective view of a flexible display according to an embodiment of the disclosure.

FIG. 4A is a plan view illustrating a flexible display according to an embodiment of the disclosure. FIG. 4B is an exploded perspective view of a flexible display according to an embodiment of the disclosure;

Referring to FIG. 4A and FIG. 4B, the flexible display 230 may include a first area 230a and a second area 230b extending from the first area 230a. The first area 230a may refer to a flat area that maintains a flat surface even when the electronic device (e.g., the electronic device 200 of FIG. 2A) is folded about the folding axis F. Alternatively, the first area 230a may refer to an area that is not deformed when the electronic device 200 is folded about the folding axis F. Alternatively, the first area 230a may refer to a non-flexible area. The second area 230b may refer to a bending area or a flexible area that is bent when the electronic device 200 is folded about the folding axis F. Alternatively, the second area 230b may refer to a deformable area when the electronic device 200 is folded around the folding axis F. The second area 230b may be positioned between two first areas 230a. The second area 230b may be formed to be symmetrical with respect to, e.g., the folding axis F, but is not limited thereto. The second area 230b may refer to, e.g., an area having a predetermined length with respect to the folding axis F.

The flexible display 230 may include a display panel and a transparent member (e.g., the transparent member of FIGS. 7A to 10, 11A, 11B, 11C, and 12). Like the flexible display 230, the display panel may include a flexible area (e.g., the second area 230b)(or deformable area) and a non-flexible area (e.g., the first area 230a) adjacent to the flexible area.

The display panel may be provided to display an image. The display panel may be, e.g., a light emitting display panel, but is not limited thereto. The display panel may be, e.g., an organic light emitting display panel or a quantum dot light emitting display panel. The light emitting layer of the organic light emitting display panel may include an organic light emitting material. The light emitting layer of the quantum dot light emitting display panel may include quantum dots and quantum rods. The display panel may be flexible.

The transparent member 300 (or window) may be disposed on, e.g., the display panel. Different components (e.g., input detection units) may be disposed between the transparent member 300 and the display panel. The transparent member 300 may include an optically transparent insulating material. Accordingly, the image generated by the display panel may be easily transferred to the user through the transparent member 300.

The transparent member 300 may transmit the image from the display panel while mitigating the external impact, thereby preventing the display panel from being damaged or malfunctioning due to the external impact. Here, the external impact is a force applied from the outside, such as pressure and stress, and may refer to a force that causes damage to the display panel.

Referring to FIG. 4B, the flexible display 230 may include a protective member 232 (e.g., a protective film), a transparent member 233, and a display panel 234. According to one embodiment, the flexible display 230 may be configured to sequentially stack the protective member 232, the transparent member 233, and the display panel 234 from the top. Each component may be adhered by adhesive members P1 and P2, but is not limited thereto.

The adhesive members P1 and P2 may include at least one of an optically clear adhesive film (OCA), an optically clear adhesive resin (OCR), a pressure sensitive adhesive film (PSA), and heat reactive adhesive, a general adhesive, or a double-sided tape. The adhesive members P1 and P2 may include a photocuring adhesive material or a heat curing adhesive material, and the material is not particularly limited. The adhesive members P1 and P2 may include, for example, a first adhesive member P1 provided to adhere the protective member 232 and the transparent member 233, and a second adhesive member P2 provided to adhere the transparent member 233 and the display panel 234.

The first adhesive member P1 may be disposed to be attached to at least a portion of the upper surface of the transparent member 233. The second adhesive member P2 may be disposed to be attached to at least a portion of the lower surface of the transparent member 233. However, it is not limited thereto, and as will be described later, the first adhesive member P1 may be attached to a portion of the upper surface of the transparent member 233, and the second adhesive member P2 may be attached to the remaining portion of the upper surface of the transparent member 233. Adhesive members with different physical properties may be provided around the transparent member 233 in various ways and structures.

The configuration shown in FIG. 4B is an example for convenience of explanation, and the flexible display 230 may further include additional configurations. For example, although not shown, various types of layers, such as a touch sensing layer, may be provided on the upper side of the display panel 234. The touch sensing layer may be configured to obtain the coordinate accuracy of an external input. The touch sensing layer may be, for example, a capacitive touch-sensitive member. However, it is not limited thereto and may be replaced with another type of touch sensing layer including two types of touch electrodes, such as an electromagnetic induction type.

According to one embodiment, the display panel 234 may be disposed below the transparent member 233. For example, the display panel 234 may be disposed below the transparent member 233 with a polarizing layer 235 interposed therebetween. The display panel 234 may be a display panel such as an organic light emitting display panel, an electrophoretic display panel, an electrowetting display panel, or a quantum dot display panel, but the type is not limited. A light emitting layer of the organic light emitting display panel may include an organic light emitting material. A light emitting layer of the quantum dot display panel may include quantum dots and quantum rods. At least a portion of the display panel 234 may be bendable. For example, the display panel 234 may be formed so that at least a portion of the display panel 234 is deformable.

According to one embodiment, the flexible display 230 may include a polarization layer 235. The polarization layer 235 may be disposed on the display panel 234. For example, the polarizing layer 235 may be disposed between the transparent member 233 and the display panel 234. The polarization layer 235 may reduce the external light reflectance of the flexible display 230 by absorbing or destructively interfering with light incident from the outside. For example, the polarizing layer 235 may be formed integrally with the display panel 234 through a continuous process. For example, the polarization layer 235 may be a component of the display panel 234. In case that the polarizing layer 235 and the display panel 234 are formed integrally, the adhesive member between them can be omitted. In case that the polarizing layer 235 is manufactured separately and attached to the display panel 234, the polarizing layer 235 and the display panel may be attached by an adhesive member.

According to one embodiment, the transparent member 233 may be disposed on the display panel 234. The transparent member 233 may be attached to the display panel 234 by using an adhesive member to directly contact the display panel 234. However, it is not limited thereto, and various types of layers, such as the polarizing layer 235 or the touch sensing layer (not shown), may be provided between the transparent member 233 and the display panel 234.

According to one embodiment, the surface of the transparent member 233 may be chemically strengthened to supplement rigidity. A detailed description of the transparent member 233 will be provided later.

According to one embodiment, the protective member 232 (e.g., protective film) may be disposed on the top layer of the flexible display 230. The protective member 232 may be disposed on the upper side of the transparent member 233 to protect the transparent member 233 from external impact. The protective member 232 may protect the transparent member 233 from external shock and may help prevent glass pieces from scattering when the transparent member 233 is damaged.

The protective member 232 and the transparent member 233 may be adhered by the first adhesive member P1. As the protective member 232 and the transparent member 233 are adhered to each other, the first adhesive member P1 may be disposed between the protective member 232 and the transparent member 233.

According to one embodiment, the protective member 232 may be attached to the transparent member 233 to be detachable. In case that the protective member 232 is damaged due to an external impact, a new protective member 232 may be attached on the transparent member 233. Therefore, an adhesive force of the first adhesive member P1 may be weaker than an adhesive force of the second adhesive member P2.

According to one embodiment, the protective member 232 may include polyethylene terephthalate (PET) or polyimide (PI), but is not limited thereto, and may include a material used for the transparent member 233 or the polymer member 236 to be described later. For example, a thickness of the protective member 232 may be substantially the same as a thickness of the transparent member 233 or may be relatively thinner. As an example, the protective member 232 may be omitted from the configuration of the flexible display 230. If the protection member 232 is omitted, the first adhesive member P1 may also be omitted.

According to one embodiment, the flexible display 230 may include a polymer member 236 disposed below the display panel 234. For example, the polymer member 236 may have a dark color applied to help display a background when the display is off. For example, the polymer member 236 may serve as a buffering member to prevent or reduce damage to the flexible display 230 by absorbing shock from the outside of the electronic device.

The polymer member 236 may include a plastic film as a base layer. The polymer member 236 may include a plastic film containing polyethersulfone (PES), polyacrylate (PAR), polyether imide (PEI), polyethylene naphthalate (PEN), polyethylene terephthalate (PET), polyphenylene sulfide (PPS), polyarylate, polyimide (PI), polycarbonate (PC), or combinations thereof.

Although not shown, a metal sheet layer may be disposed below the display panel 234. The metal sheet layer may help reinforce the rigidity of electronic devices. The metal sheet layer may be used, for example, to shield ambient noise and dissipate heat radiating from surrounding heat dissipating components. The metal sheet layer may include at least one of STS, Cu, Al, or other alloy materials.

Figure 5:
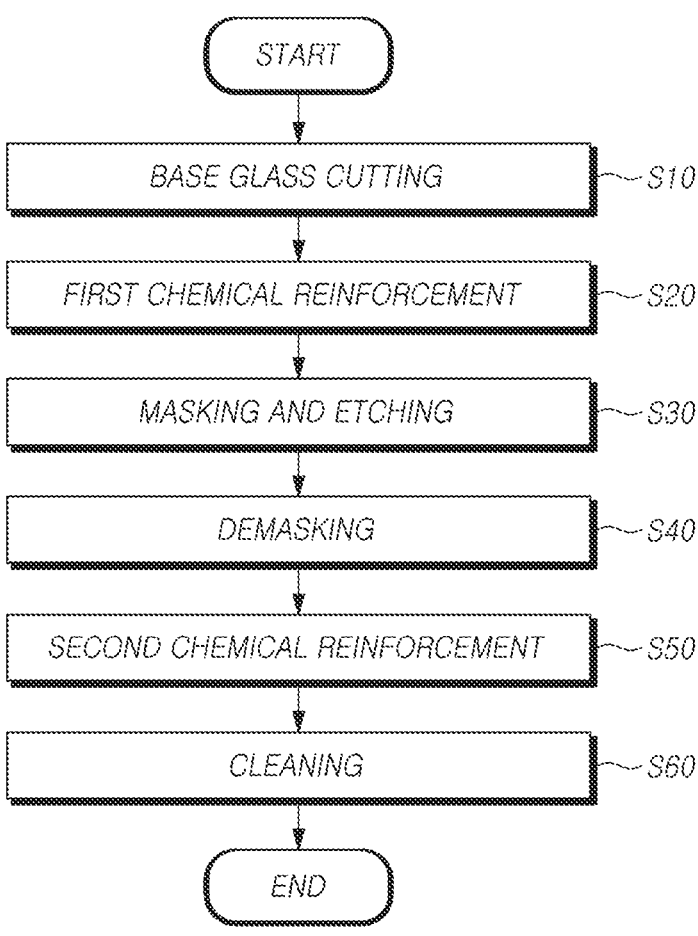
FIG. 5 is a flowchart illustrating a process for manufacturing a transparent member included in a flexible display of FIG. 4 according to an embodiment of the disclosure.

FIG. 5 is a flowchart illustrating a manufacturing process of a transparent member included in a flexible display of FIG. 4A according to an embodiment of the disclosure.

Referring to FIG. 5, a transparent member (e.g., the transparent member 300 of FIG. 7A) according to an embodiment may be manufactured through a base glass cutting process (S10), a first chemical-reinforcing of the cut glass process (S20), a masking a portion of the first chemical-reinforced glass and then performing shape etching process (S30), demasking after etching process (S40), a second chemical-reinforcing the surface of the masked glass process (S50), or cleaning the surface to remove foreign substances process (S60).

According to an example, in process S10, a process of cutting the base glass to the size of a flexible display (e.g., the flexible display 230 of FIG. 4) may be performed. In process S10, a process of cutting the base glass to a predetermined size may be performed.

According to an example, in process S20, a process of first chemical-reinforcing the surface of the cut glass may be performed. The first chemical-reinforcing process may proceed for a first period. Here, a depth of reinforcing by the first chemical-reinforcing process may vary depending on the length of the first period. The longer the first period, the more areas can be chemically reinforced through the first chemical-reinforcing process.

Here, chemical reinforcement may be performed by ion substitution. Here, the ion substitution may refer to a method of exchanging small-sized ions present in the glass with large-sized ions.

As an example of the ion substitution, as $Na^+$ ions (sodium ions) inside the glass are substituted with $K^+$ ions (potassium ions), internal stress may be generated, reinforcing the strength of the glass. If $K^+$ ions penetrate into the glass through chemical reinforcement, $Na^+$ ions in the glass may be discharged to the outside, so that ion substitution may be performed.

As an example of the ion substitution, a two-step substitution process in which $Li^+$ ions (lithium ions) in the glass are first substituted with $Na^+$ ions, and then the $Na^+$ ions are substituted with $K^+$ ions is performed, thereby generating internal stress to reinforce the strength of the glass.

The ion substitution is not limited to the above method, and may be performed in various ways in which ions in the glass (especially the surface of the glass) are substituted with relatively large ions.

According to an example, in process S20, a $KNO_3$ (potassium nitrate) solution may be used to chemically reinforce the glass, but is not limited thereto. For example, a potassium hydroxide (KOH) solution may be used for chemical reinforcement. For example, chemical reinforcement may be performed by immersing glass in a chemical solution containing $KNO_3$.

Chemical reinforcement may be performed in a temperature environment of, e.g., 300° C. to 400° C., but is not limited thereto, and may vary depending on the material of the glass used. Chemical reinforcement may be sequentially performed from the surface layer of the glass. The chemical reinforcement depth at which the chemical reinforcement is performed may be proportional to the temperature and the reinforcement time. In process S20, the chemical reinforcement depth of the glass may be adjusted by adjusting the temperature and reinforcement time.

According to an example, in process S30, a process of performing shape etching after masking a portion of the surface of the glass that has undergone first chemical reinforcement may be performed. Before the shape etching, a masking member may be attached to a portion that is not to be etched. For example, masking may be performed on the portion corresponding to the non-flexible area or the first area (e.g., the first area 230a of FIG. 4A) of the flexible display 230. Shape etching may be performed after masking is completed. The thickness of the unmasked portion may decrease due to shape etching. The thinned portion may be a portion corresponding to the second area (e.g., the second area 230b of FIG. 4A) of the flexible display 230. Etching may be performed by a laser irradiation method, for example.

According to an embodiment of the disclosure, in the shape etching process, not only the upper surface but also the lower surface may be etched in the unmasked portion of the glass. Therefore, notches or recesses may be formed in the upper and lower surfaces of the glass. By forming notches or recesses in the upper and lower sides of the glass, stress may be evenly dispersed. If the stress is evenly dispersed, the glass may be prevented from being twisted by the stress.

According to an example, in process S40, after the shape etching is completed, the masking member attached to the glass surface may be removed. As a component, such as a separate jig, rather than the masking member, is used, the process of removing the masking member may be omitted.

According to an example, in process S50, a process of second chemical-reinforcing the surface of the demasked glass may be performed. The etched portion of the glass may be in a state in which the area first chemically reinforced in process S20 has been removed by etching. Second chemical reinforcement may be performed on the portion where the chemically reinforced area has been removed. Since the second chemical enhancement may be performed in substantially the same manner as the first chemical enhancement, a detailed description will be omitted. Second chemical reinforcement may be performed on all surfaces as well as on the etched portion of the glass. However, since there are not many ions to be substituted in the portion where the reinforced area remains due to the first chemical reinforcement, there may be no significant difference in the chemical reinforcement depth before and after process S50 is performed. For the portion where the chemically reinforced area is removed by etching, a new chemically reinforced area may be formed by second chemical reinforcement. The second chemical reinforcement process may proceed for a second period that is relatively shorter than the first period.

According to an example, the chemical reinforcement depth formed through the first chemical reinforcement and the chemical reinforcement depth formed through the second chemical reinforcement may be different. For example, the chemical reinforcement depth formed in the first chemical reinforcement may be greater than the chemical reinforcement depth formed in the second chemical reinforcement.

According to an example, in the first chemical enhancement process S20, the surface strength of the portion corresponding to the non-flexible area of the flexible display 230 may be reinforced, and in the second chemical enhancement process S50, the surface strength of the portion corresponding to the flexible area of the flexible display 230 may be reinforced. By performing separate processes on each portion, a different chemical reinforcement depth may be formed for each portion.

According to an example, in process S60, a process of cleaning the glass that has undergone the second chemical reinforcement process may be performed. In the cleaning process, a process of rinsing materials remaining on the surface of the transparent member may be performed. In the cleaning process, a healing process for surface treatment of the transparent member may be performed. In the healing process, the surface of the transparent member may be dissolved or etched by a healing liquid.

FIGS. 6A, 6B, 6C, 6D, and 6E are cross-sectional views illustrating a manufacturing process of a transparent member according to various embodiments of the disclosure.

FIGS. 6A, 6B, 6C, 6D, and 6E are cross-sectional views illustrating a characteristic portion of the transparent member 300 according to various embodiments of the disclosure. For convenience of description, the thickness of the transparent member 300 may be somewhat exaggerated. The transparent member 300 manufactured through the processes of FIGS. 6A, 6B, 6C, 6D, and 6E may be disposed on the display panel of the flexible display (e.g., the flexible display 230 of FIG. 4A) of FIG. 4A. Like the flexible display 230, the display panel may include a flexible area (e.g., the second area 230b) and a non-flexible area (e.g., the first area 230a) adjacent to the flexible area.

Figure 6A:
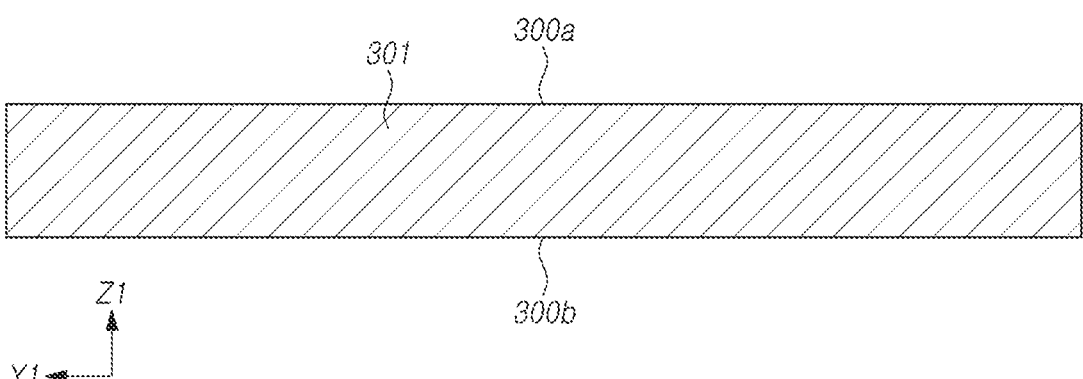
FIGS. 6A, 6B, 6C, 6D, and 6E are cross-sectional views illustrating a process for manufacturing a transparent member according to various embodiments of the disclosure.

FIG. 6A may correspond to process S10 of FIG. 5. If the base glass is cut to an appropriate size, a base layer 301 overall having a constant thickness is formed.

Figure 6B:
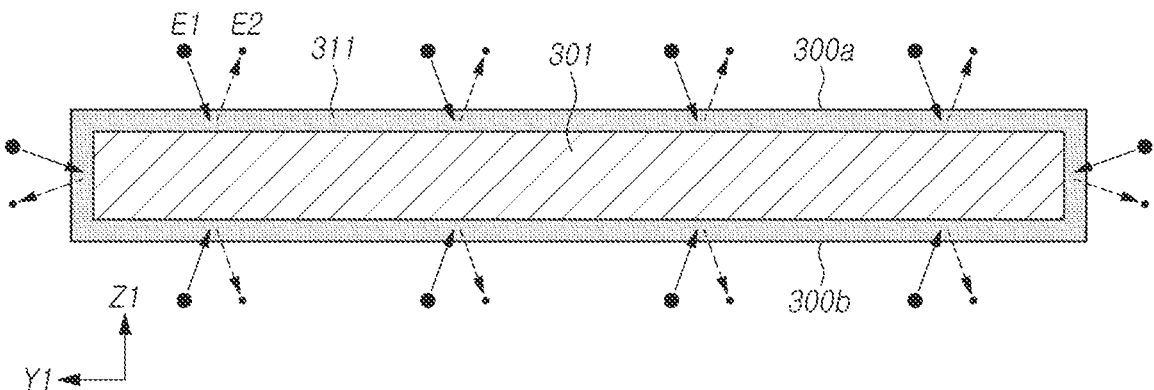

FIG. 6B may correspond to process S20 of FIG. 5. First chemical reinforcement may be performed on the surface of the base layer 301 overall having a constant thickness. During the first chemical reinforcement, chemical reinforcement may be performed not only on an upper surface 300a and a lower surface 300b of the base layer 301, but also on a side surface connecting the upper surface 300a and the lower surface 300b. In the first chemical reinforcement process, e.g., a relatively large ion E1 may be substituted with a relatively small ion E2 in the base layer 301. For example, the relatively large ion may be $K^+$, and the relatively small ion may be $Na^+$, but is not limited thereto. After the first chemical reinforcement process, a first area 311 having a predetermined reinforcement depth may be formed on all surfaces of the base layer 301.

Figure 6C:
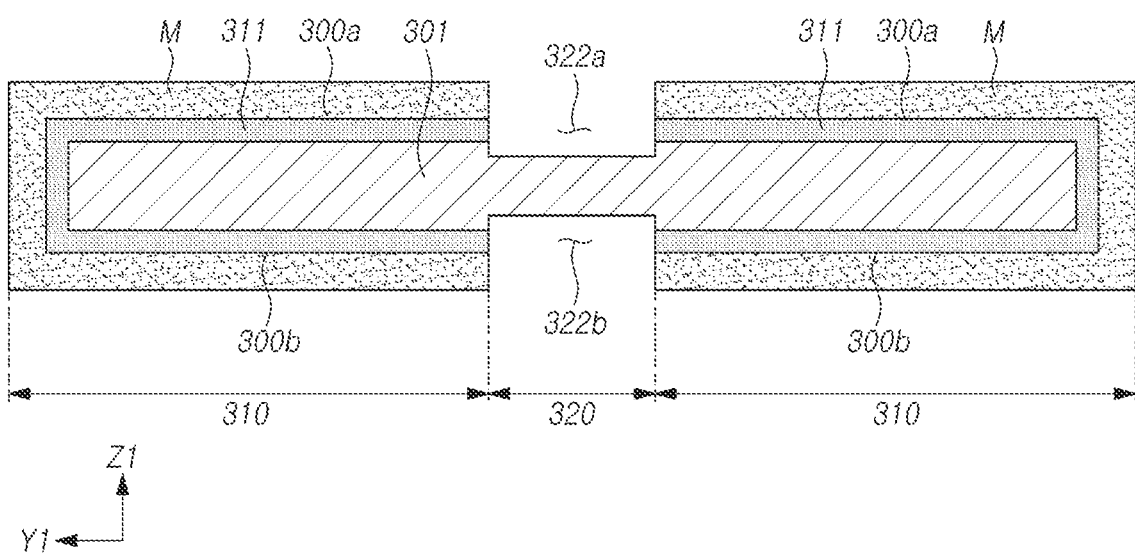

FIG. 6C may correspond to process S30 of FIG. 5. In order to perform etching only on a specific portion, a masking member M may be disposed or attached on a portion of the surface of the first area 311 or the base layer 301. The portion where the masking member M is disposed or attached may not be etched.

According to an example, the masking member may be disposed or attached to a first area (e.g., the first area 230a of FIG. 4A) of the flexible display (e.g., the flexible display 230 of FIG. 4A) or a portion (hereinafter, referred to as a first glass portion 310) corresponding to the non-flexible area of the surface of the base layer 301.

According to an example, the masking member may not be disposed or attached to a second area (e.g., the second area 230b of FIG. 4A) of the flexible display 230 or a portion (hereinafter, referred to as a second glass portion 320) corresponding to the flexible area of the surface of the base layer 301, and thus recesses 322a and 322b may be formed by shape etching. In the second glass portion 320, a first recess 322*a* and a second recess 322*b* may be formed in an upper side and a lower side, respectively, by shape etching. The first recess 322*a* may be a recess formed by being etched from the upper surface 300*a*, and the second recess 322*b* may be a recess formed by being etched from the lower surface 300*b*. However, it is not limited thereto, and a groove may be formed by etching only on either the upper or lower side of the base layer 301. For example, one of the first groove 322*a* or the second groove 322*b* may be omitted.

By forming recesses in the upper and lower sides of the second glass portion 320, the two first glass portions 310 disposed on two opposite sides of the second glass portion 320 may be physically separated from each other. By forming recesses 322*a* and 322*b* in the upper and lower sides of the second glass portion 320, stress may be dispersed to the two first glass portions 310. When any one of the first recess 322*a* and the second recess 322*b* is omitted, stress may be unevenly dispersed, causing warpage. For example, if the second recess 322*b* is omitted, the first glass portions 310 and the second glass portion 320 may form the same plane on the lower surface of the transparent member 300, so that stress may not be evenly dispersed, causing warpage.

Figure 6D:
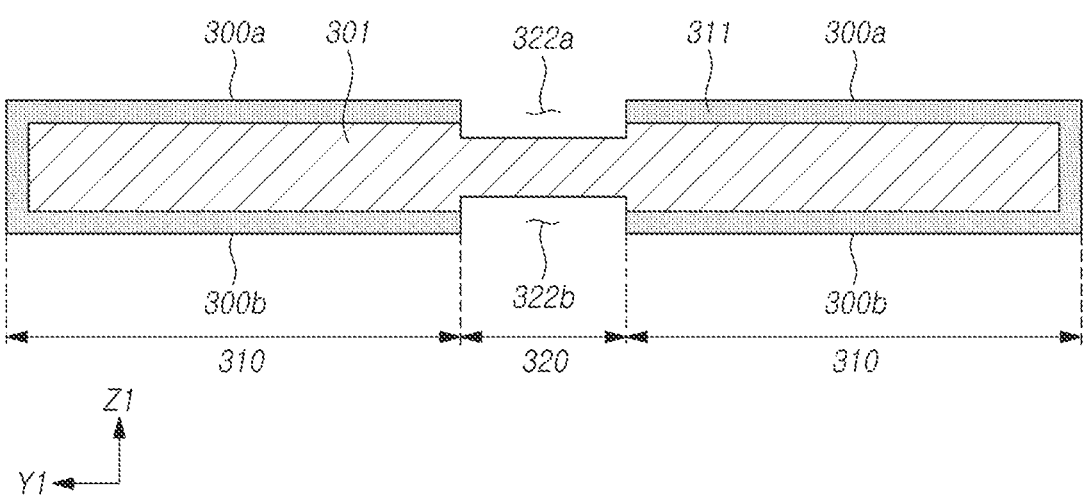

FIG. 6D may correspond to process S40 of FIG. 5. After the shape etching process is finished, the masking member M may be removed to prepare for the second chemical reinforcement process. When the masking member M is not used for shape etching, the process of FIG. 6D may be omitted.

Figure 6E:
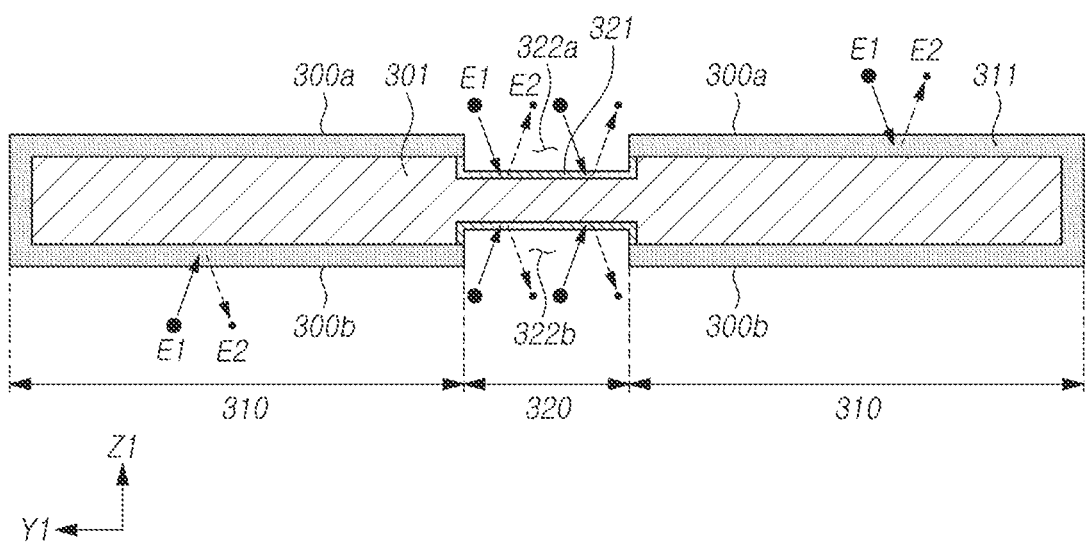

FIG. 6E may correspond to process S50 of FIG. 5. After etching, a second chemical reinforcement process may be performed on the transparent member 300. The second chemical reinforcement process may have a different process temperature and time from those of, e.g., the first chemical process. The second chemical reinforcement process may be performed on all portions of the transparent member 300. However, since the first glass portion 310, which is an unetched portion, still has the first area 311 formed by the first chemical process, and the first area 311 has already been ion-substituted, the second chemical reinforcement process may make no significant difference in the chemical reinforcement depth. The surface of the second glass portion 320, which is the etched portion, may be a surface that is not chemically reinforced. A second area 321 may be formed on the surface of the second glass portion 320 by ion substitution in the second chemical reinforcement process.

As illustrated in process S50 of FIGS. 6E and 5, the degree of chemical reinforcement of the second glass portion 320, which is relatively thin, may be determined by the second chemical reinforcement process regardless of the degree of chemical reinforcement of the surface of the first glass portion 310 in the first chemical reinforcement process.

FIGS. 6A, 6B, 6C, 6D, and 6E illustrate a process for manufacturing a transparent member according to an embodiment of the disclosure. Various shapes of transparent members may be manufactured using the process of FIG. 5. Various shapes are described below.

Figure 7A:
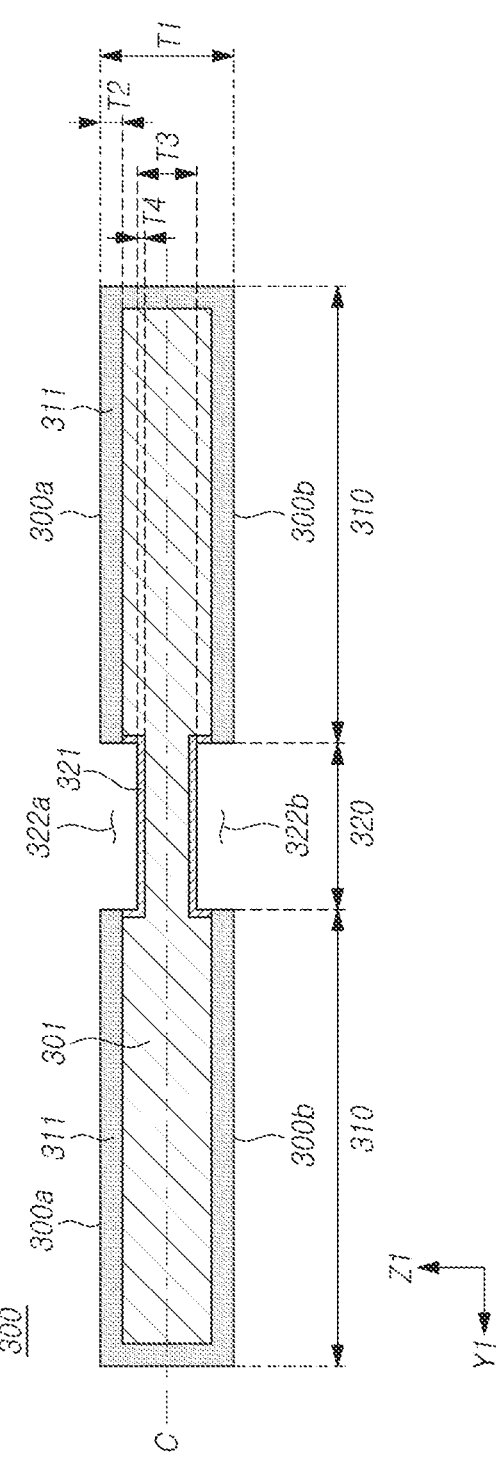
FIG. 7A is a cross-sectional view illustrating a transparent member according to an embodiment of the disclosure.
Figure 7B:
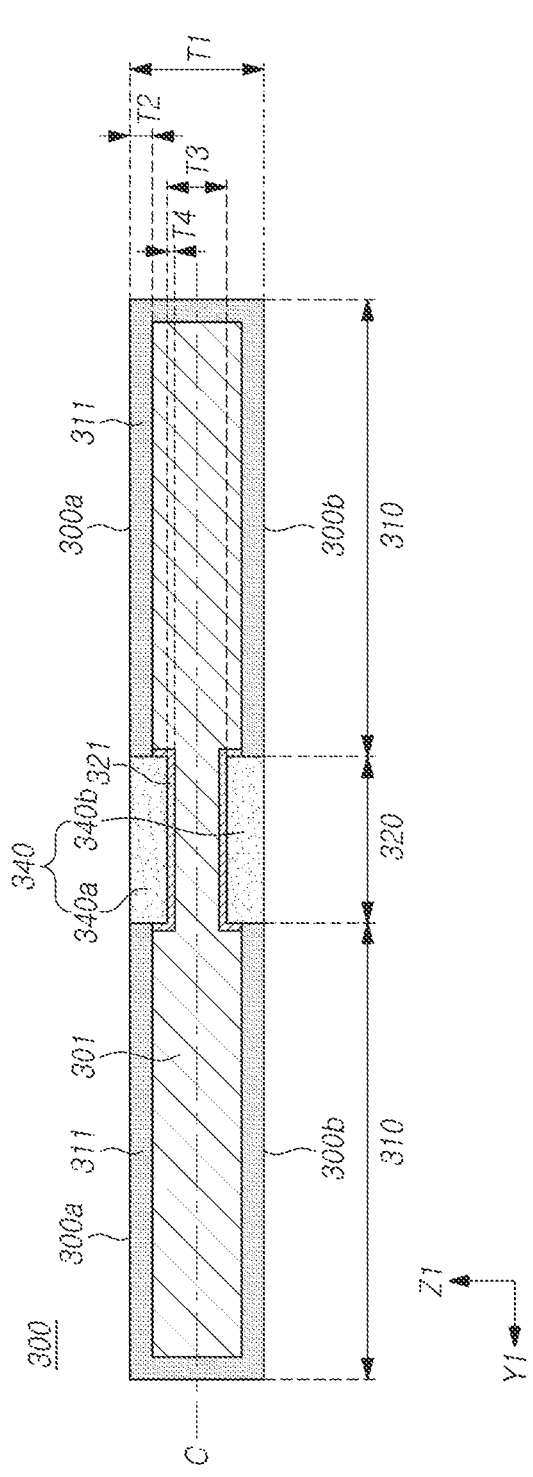
FIG. 7B is a cross-sectional view of a transparent member on which a resin is disposed in FIG. 7A.

FIG. 7A is a cross-sectional view illustrating a transparent member according to an embodiment of the disclosure. FIG. 7B is a cross-sectional view of a transparent member on which a resin is disposed in FIG. 7A.

The transparent member 300 of FIG. 7A and FIG. 7B may be a cross section of the transparent member 300 with respect to the cross section taken along line V1-V1' of the flexible display (e.g., the flexible display 230 of FIG. 4A) of FIG. 4A. For convenience of description, the thickness of the transparent member 300 may be somewhat exaggerated in FIG. 7A and FIG. 7B.

Referring to FIG. 7A and FIG. 7B, the transparent member 300 may include a first glass portion 310 and a second glass portion 320. The first glass portion 310 may extend from one edge of the second glass portion 320. The second glass portion 320 may be disposed, e.g., between two first glass portions 310.

According to an example, the first glass portion 310 may correspond to a non-flexible area of the flexible display 230 or a display panel (not shown). The first glass portion 310 may have a first thickness T1. Here, the first thickness T1 may refer to a length between the upper surface 300*a* and the lower surface 300*b* of the transparent member 300 in the first glass portion 310. Alternatively, the first thickness T1 may refer to the length of the first glass portion 310 in the Z1-axis direction. The first thickness T1 may be larger than, e.g., the second thickness T3. The first thickness T1 may be, e.g., 50 $\mu$m to 500 $\mu$m, but is not limited thereto.

According to an example, the first glass portion 310 may include a first area 311. The first area 311 may have a first depth T2. Here, the first depth T2 may refer to the length of the chemically reinforced area from the surface of the first glass portion 310. The first depth T2 may be determined, e.g., in the first chemical reinforcement process S20 of FIG. 5. For example, the first depth T2 may refer to an average depth measured based on a surface of the first glass portion 310. The first depth T2 may have, e.g., a length of 5% to 20% of the first thickness T1, but is not limited thereto.

According to an example, the second glass portion 320 may correspond to a flexible area of the flexible display 230 or a display panel (not shown). The second glass portion 320 may have a second thickness T3. Here, the second thickness T3 may refer to a length between the upper surface 300*a* and the lower surface 300*b* of the transparent member 300 in the second glass portion 320. Alternatively, the second thickness T3 may refer to the length of the second glass portion 320 in the Z1-axis direction. The second thickness T3 may be smaller than, e.g., the first thickness T1. The second thickness T3 may be, e.g., 30 $\mu$m to 60 $\mu$m, but is not limited thereto.

According to an example, the second glass portion 320 may include a second area 321. The second area 321 may have a second depth T4 different from the first depth T2. Here, the second depth T4 may refer to the length of the chemically reinforced area from the surface of the second glass portion 320. For example, the second depth T4 may refer to an average depth measured based on a surface of the first glass portion 320. The second depth T4 may be determined, e.g., in the second chemical reinforcement process S50 of FIG. 5. The second depth T4 may have, e.g., a length of 5% to 20% of the second thickness T3, but is not limited thereto.

According to an example, the second glass portion 320 may include recesses 322*a* and 322*b* formed in the upper side and the lower side. The recesses 322*a* and 322*b* may include, e.g., a first recess 322*a* in the second glass portion 320 toward the upper surface 300*a* of the transparent member 300 and a second recess 322*b* in the second glass portion 320 toward the lower surface 300*b* of the transparent member 300. In the second glass portion 320, recesses 322*a* and 322*b* may be formed in the upper and lower sides, thereby forming a top-bottom notch structure. According to an embodiment of the disclosure, by forming recesses 322*a* and 322*b* in both upper and lower sides of the second glass portion 320, stress may be dispersed to the first glass portions 310 positioned on two opposite sides of the second glass portion 320. However, it is not limited thereto, and one of the first grooves 322a and the second grooves 322b may be omitted from the second glass portion 320. That is, only one of the first groove 322a and the second groove 322b can be formed by an etching process.

According to an example, the first recess 322a may have a depth greater than the first depth T2. According to an example, the second recess 322b may have a depth greater than the first depth T2. As the first recess 322a and the second recess 322b are etched to be deeper than the first depth T2, the entire first area may be removed from the second glass portion 320.

According to an example, in the unfolding state of the transparent member 300, the upper surface of the first glass portion 310 and the upper surface of the second glass portion 320 may be positioned on different planes. Due to the first recess 322a formed in the upper side of the second glass portion 320, the upper surface of the second glass portion 320 may not be included in the plane including the upper surface of the first glass portion 310. For example, the upper surface of the second glass portion 320 may not be included in the plane including the upper surface of the first glass portion 310. In other words, for example, the upper surface of the second glass portion 320 may not be on the same plane as the upper surface of the first glass portion 310. Here, the upper surface of the first glass portion 310 may be the upper surface 300a of the transparent member 300. Here, the unfolding state of the transparent member 300 may refer to a state in which no bend exists in all areas of the transparent member 300.

According to an example, in the unfolding state of the transparent member 300, the lower surface of the first glass portion 310 and the lower surface of the second glass portion 320 may be positioned on different planes. Due to the second recess 322b formed in the lower side of the second glass portion 320, the lower surface of the second glass portion 320 may not be included in the plane including the lower surface of the first glass portion 310. For example, the lower surface of the second glass portion 320 may not be included in the plane including the lower surface of the first glass portion 310. In other words, for example, the lower surface of the second glass portion 320 may not be on the same plane as the lower surface of the first glass portion 310. Here, the lower surface of the first glass portion 310 may be the lower surface 300b of the transparent member 300.

According to an example, the first depth T2 and the second depth T4 may be different in size. For example, the first depth T2 may be greater than the second depth T4. According to an example, the ratio of the first depth T2 to the first thickness T1 may be substantially the same as the ratio of the second depth T4 to the second thickness T3. For example, when the first thickness T1 is 50 μm, and the second thickness T3 is 30 μm, the first depth T2 may be 7.5 μm, and the second depth may be 4.5 μm. By allowing the ratio of the first depth T2 to the first thickness T1 in the first glass portion 310 to be substantially the same as the ratio of the second depth T4 to the second thickness T3 in the second glass portion 320, the difference in expansion rate between the first glass portion 310 and the second glass portion 320 may be minimized. By minimizing the difference in the expansion rate between the first glass portion 310 and the second glass portion 320 having the different thicknesses, it is possible to prevent warpage that may occur in the transparent member 300 (especially the second glass portion 320).

According to an example, the second glass portion 320 may be formed to be horizontally symmetrical with respect to a virtual plane C that is perpendicular to the thickness direction of the transparent member 300 and passes through the transparent member 300. Here, the horizontal symmetry may mean that the second glass portion 320 is positioned in an area not affected by the first depth T2.

The virtual plane C may be, e.g., a plane perpendicular to the thickness direction of the transparent member 300 and dividing the average thickness of the transparent member 300 by half, but is not limited thereto. The virtual plane C may be, e.g., a plane perpendicular to the thickness direction of the transparent member 300 and dividing the average thickness of the first glass portion 310 by half, but is not limited thereto. Here, the thickness direction may refer to the Z1-axis direction. Alternatively, the thickness direction may refer to a direction from the lower surface 300b of the transparent member 300 to the upper surface 300a of the transparent member 300.

By forming the second glass portion 320 horizontally symmetrically with respect to the virtual plane C, stress may be evenly dispersed to the first glass portions 310 positioned on two opposite sides of the second glass portion 320.

According to an example, the boundary between the first glass portion 310 and the second glass portion 320 may have a surface/plane level difference (e.g., step or bump).

According to an example, although not illustrated, the transparent member 300 may further include a refractive index matching portion. For example, the refractive index matching portion may be disposed around at least one of the first glass portion 310 or the second glass portion 320 to match the refractive indexes of light formed by the difference in thickness between the first glass portion 310 and the second glass portion 320. The refractive index matching portion may be formed of, e.g., a transparent material. The refractive index matching portion may be formed of, e.g., a urethane-based, acrylic-based, or silicon-based material. The refractive index matching portion may have substantially the same refractive index as that of the base layer 301.

Referring to FIG. 7B, the transparent member 300 may further include a resin portion 340. The resin portion 340 may be disposed on the second glass portion 320 of the transparent member 300. The resin portion 340 may be arranged to fill the groove formed in the second glass portion 320. The resin portion 340 may include a first resin portion 340a and a second resin portion 340b. The first resin portion 340a may be filled in the first groove 322a. The second resin portion 340b may be filled in the second groove 322b. The resin portion 340 may be filled, for example, in at least one of the first groove 322a or the second groove 322b. By filling at least one of the first groove 322a or the second groove 322b with the resin portion 340, the step between the upper surface 300a and the lower surface 300b of the transparent member 300 can be removed.

The resin portion 340 shown in FIG. 7B may be a portion of the first adhesive member (e.g., the first adhesive member in FIG. 4b) or a portion of the second adhesive member (e.g., the second adhesive member in FIG. 4b) when the transparent member 300 is included in the flexible display (e.g., the flexible display 230 in FIG. 4b). For example, the first resin portion 340a may be a portion of the first adhesive member P1. For example, the second resin portion 340b may be a portion of the second adhesive member P2.

Hereinafter, transparent members according to various embodiments of the disclosure, which may be manufactured using the manufacturing process of FIG. 5, are described with reference to FIGS. 8 to 10, 11A, 11B, 11C, and 12 to 14.

Figure 8:
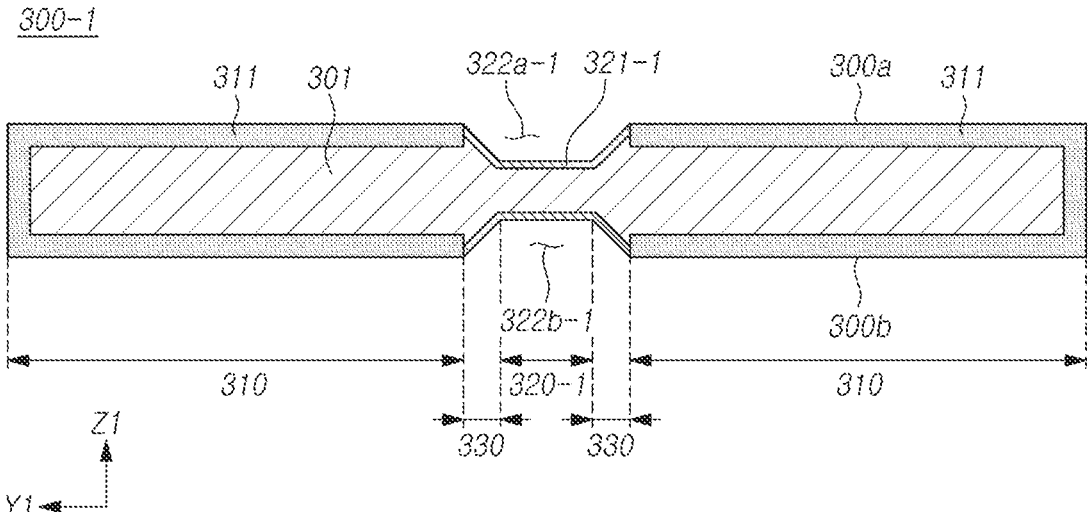
FIG. 8 is a cross-sectional view illustrating a transparent member according to an embodiment of the disclosure.

FIG. 8 is a cross-sectional view illustrating a transparent member according to an embodiment of the disclosure.

A transparent member 300-1 of FIG. 8 may be a cross section of the transparent member 300-1 with respect to the cross section taken along line V1-V1' of the flexible display (e.g., the flexible display 230 of FIG. 4A) of FIG. 4A. In FIG. 8, the thickness of the first glass portion 310, the first depth of the first area 311, the thickness of the second glass portion 320-1, and the second depth of the second area 321-1 have been described with reference to FIG. 7A and are not described below. A detailed description of the components described with reference to FIG. 7A among the components of FIG. 8 will be omitted. For convenience of description, the thickness of the transparent member 300-1 may be somewhat exaggerated in FIG. 8.

Referring to FIG. 8, the transparent member 300-1 according to an embodiment is entirely the same as or similar to the transparent member 300 of FIG. 7 but is different in that the transparent member 300-1 further includes a third portion 330. The following description focuses primarily on the differences.

According to an example, the third portion 330 may be disposed between the first glass portion 310 and the second glass portion 320-1. The third portion 330 may be disposed so that one side contacts an edge of the first glass portion 310 and the other side contacts an edge of the second glass portion 320-1. The third portion 330 may have an inclined slope. The third portion 330 may be formed to be inclined downward from, e.g., the first glass portion 310 toward the second glass portion 320-1. The third portion 330 may be formed to be inclined to connect, e.g., the first glass portion 310 and the second glass portion 320-1. The slope of the third portion 330 may have, e.g., a flat slope or a curved slope.

According to an example, the third portion 330 may be formed by the etching process S30 of FIG. 5. In the etching process S30, the upper recess 322a-1 and the lower recess 322b-1 may be formed around the second glass portion 320-1 and the third portion 330. Accordingly, the chemical enhancement depth of the third portion 330 may be the same as or similar to the chemical enhancement depth of the second glass portion 320-1.

By adding the third portion 330 to the boundary between the first glass portion 310 and the second glass portion 320-1 of the transparent member 300-1, the thickness of the base layer 301 may be gradually changed to enhance visibility of the transparent member 300-1.

Figure 9:
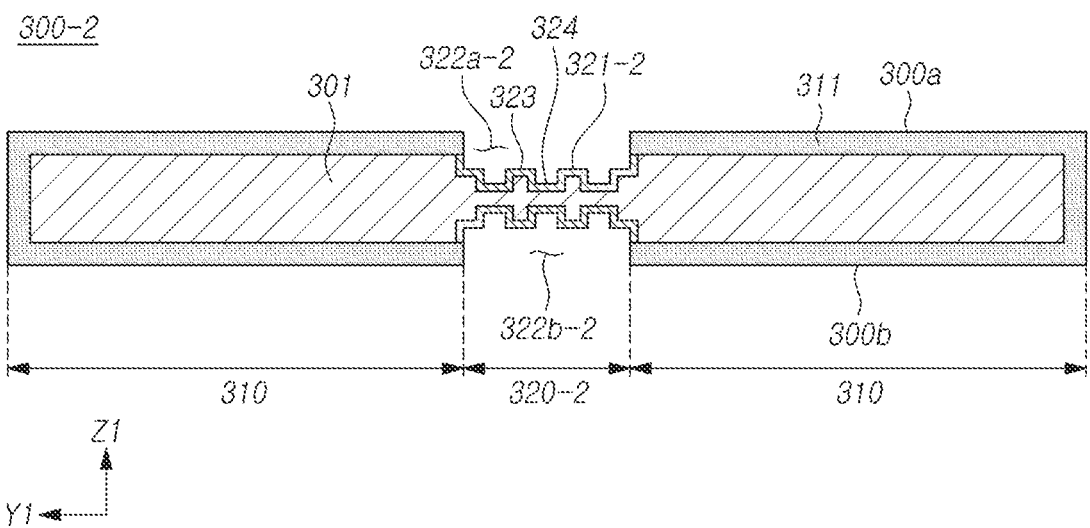
FIG. 9 is a cross-sectional view illustrating a transparent member according to an embodiment of the disclosure.

FIG. 9 is a cross-sectional view illustrating a transparent member according to an embodiment of the disclosure.

The transparent member 300-2 of FIG. 9 may be a cross section of the transparent member 300-2 with respect to the cross section taken along line V1-V1' of the flexible display (e.g., the flexible display 230 of FIG. 4A) of FIG. 4A. In FIG. 9, the thickness of the first glass portion 310, the first depth of the first area 311, the thickness of the second glass portion 320-2, and the second depth of the second area 321-2 have been described with reference to FIG. 7A, and are not described below. A detailed description of the components described with reference to FIG. 7A among the components of FIG. 9 will be omitted. For convenience of description, the thickness of the transparent member 300-2 may be somewhat exaggerated in FIG. 9.

Referring to FIG. 9, the transparent member 300-2 according to an embodiment is entirely the same as or similar to the transparent member 300 of FIG. 7A, but is different in the shape of the second glass portion 320-2. The following description focuses primarily on the differences.

According to an example, one surface of the second glass portion 320-2 of the transparent member 300-2 may have a pattern in which a concave portion 324 and the convex portion 323 are alternately disposed. For example, at least one of the upper surface or the lower surface of the second glass portion 320-2 may have a pattern in which the concave portion 324 and the convex portion 323 are alternately disposed. For example, the pattern shapes of the upper and lower surfaces of the second glass portion 320-2 may be formed to be horizontally symmetrical.

According to an example, a boundary between the concave portion 324 and the convex portion 323 may be formed to have a surface/plane level difference (e.g., step or bump) vertically. For example, the alternating patterns of the concave portion 324 and the convex portion 323 may have a cross section having a rectangular wave shape as a whole.

According to an example, the surface pattern of the second glass portion 320-2 may be formed by the etching process S30 of FIG. 5. In the etching process S30, the upper recess 322a-2 and the lower recess 322b-2 may be formed around the second glass portion 320-2.

According to an example, bending performance and/or impact strength performance may be enhanced by alternately disposing the concave portion 324 and the convex portion 323 in the second glass portion 320-2. For example, impact strength performance may be enhanced by the convex portion 323. For example, bending performance may be enhanced by the concave portion 324.

Figure 10:
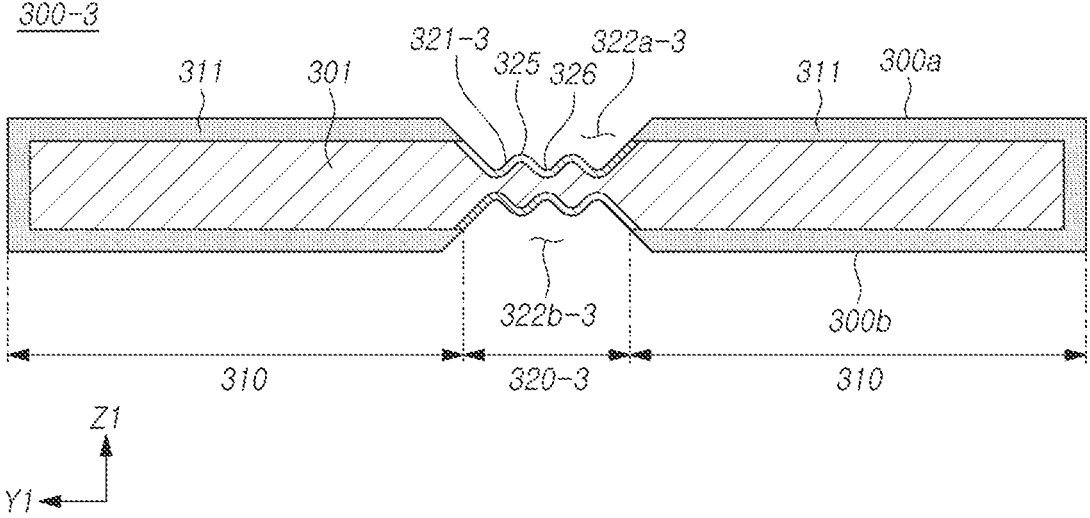
FIG. 10 is a cross-sectional view illustrating a transparent member according to an embodiment of the disclosure.

FIG. 10 is a cross-sectional view illustrating a transparent member according to an embodiment of the disclosure.

The transparent member 300-3 of FIG. 10 may be a cross section of the transparent member 300-3 with respect to the cross section taken along line V1-V1' of the flexible display (e.g., the flexible display 230 of FIG. 4A) of FIG. 4A. In FIG. 10, the thickness of the first glass portion 310, the first depth of the first area 311, the thickness of the second glass portion 320-3, and the second depth of the second area 321-3 have been described with reference to FIG. 7A and are not described below. A detailed description of the components described with reference to FIG. 7A among the components of FIG. 10 will be omitted. For convenience of description, the thickness of the transparent member 300-3 may be somewhat exaggerated in FIG. 10.

Referring to FIG. 10, the transparent member 300-3 according to an embodiment is entirely the same as or similar to the transparent member 300 of FIG. 7A, but is different in the shape of the second glass portion 320-3. The following description focuses primarily on the differences.

According to an example, one surface of the second glass portion 320-3 of the transparent member 300-3 may have a pattern in which a concave portion 326 and a convex portion 325 are alternately disposed. For example, at least one of the upper surface or the lower surface of the second glass portion 320-3 may have a pattern in which the concave portion 326 and the convex portion 325 are alternately disposed. For example, the pattern shapes of the upper and lower surfaces of the second glass portion 320-3 may be formed to be horizontally symmetrical.

According to an example, the alternating pattern of the concave portion 326 and the convex portion 325 may have a wave-shaped cross section. For example, the alternating patterns of the concave portion 326 and the convex portion 325 may overall have a curved shape.

According to an example, the surface pattern of the second glass portion 320-3 may be formed by the etching process S30 of FIG. 5. In the etching process S30, the upper recess 322a-3 and the lower recess 322b-3 may be formed around the second glass portion 320-3.

According to an example, bending performance and/or impact strength performance may be enhanced by alternately disposing the concave portion 326 and the convex portion 325 in the second glass portion 320-3. For example, impact strength performance may be enhanced by the convex portion 325. For example, bending performance may be enhanced by the concave portion 326.

Figure 11A:
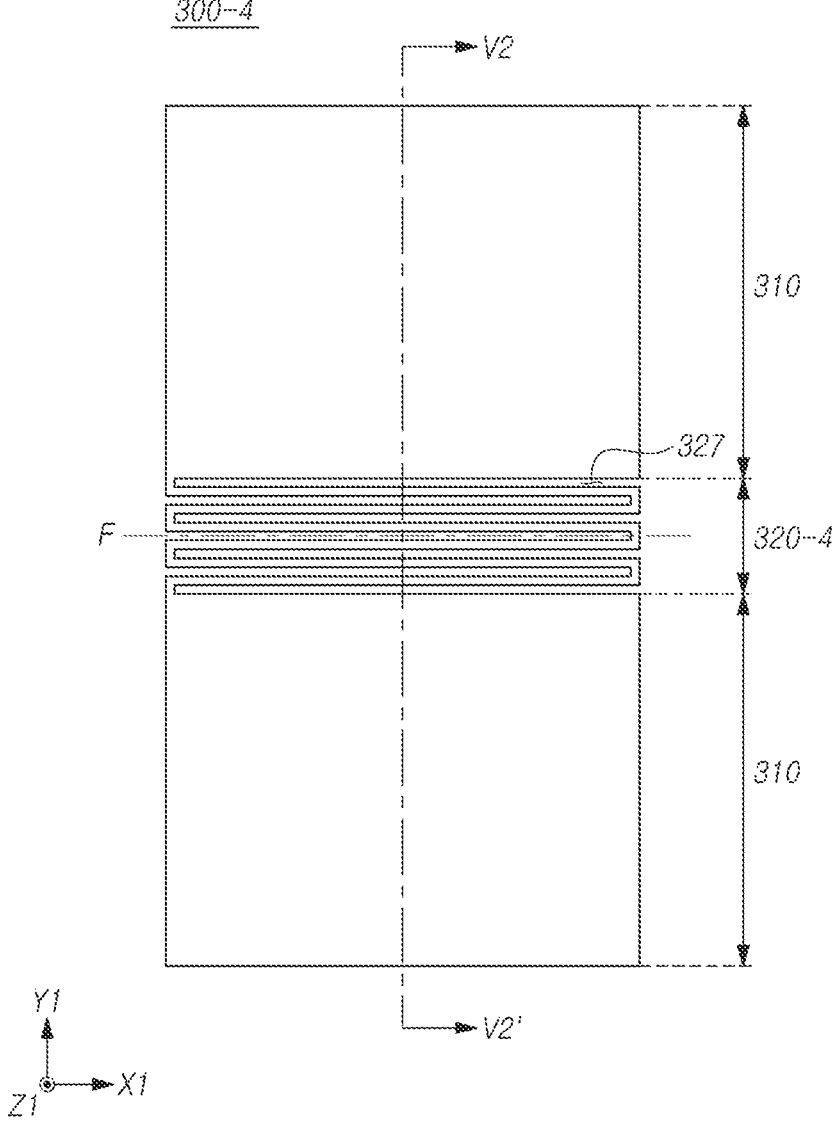
FIGS. 11A and 11B are views illustrating a transparent member according to various embodiments of the disclosure.
Figure 11B:
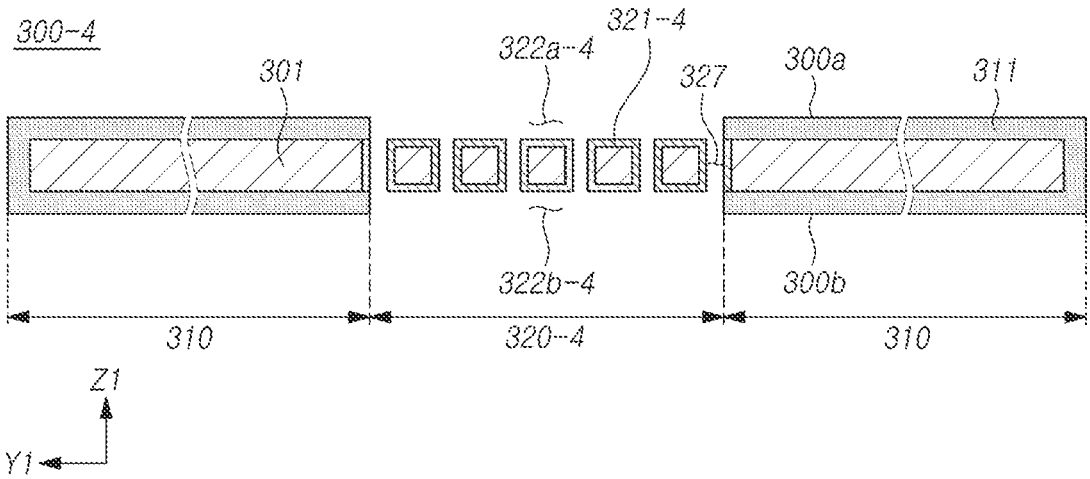

FIGS. 11A and 11B are views illustrating a transparent member according to various embodiments of the disclosure.

FIG. 11A is a top view of a transparent member 300-4 according to an embodiment of the disclosure. FIG. 11B is a cross-sectional view of a transparent member 300-4 taken along line V2-V2' according to an embodiment of the disclosure.

In FIGS. 11A and 11B, the thickness of the first glass portion 310, the first depth of the first area 311, the thickness of the second glass portion 320-4, and the second depth of the second area 321-4 have been described with reference to FIG. 7A, and are not described below. A detailed description of the components described with reference to FIG. 7A among the components of FIGS. 11A and 11B will be omitted.

Referring to FIGS. 11A and 11B, the transparent member 300-4 according to an embodiment is entirely the same as or similar to the transparent member 300 of FIG. 7A, but is different in the shape of the second glass portion 320-4. The following description focuses primarily on the differences.

According to an example, the second glass portion 320-4 of the transparent member 300-4 may be formed by penetrating a portion thereof. The second glass portion 320-4 may be formed to be symmetrical with respect to the folding axis F but is not limited thereto.

According to an example, the second glass portion 320-4 may include a through hole 327. For example, the through hole 327 may be formed to be symmetrical with respect to the folding axis F but is not limited thereto. The through hole 327 may be formed to extend in a direction parallel to the folding axis F. A plurality of through-holes 327 may be disposed to be spaced apart from each other by a predetermined interval along a direction perpendicular to the folding axis F.

According to an example, the second glass portion 320-4 may include a second area 321-4. The second area 321-4 may be formed not only on the upper surface and the lower surface of the second glass portion 320-4 but also on the surrounding surface of the through-hole 327.

According to an example, the pattern of the through hole 327 of the second glass portion 320-4 may be formed by the etching process S30 of FIG. 5. In the etching process S30, the upper recess 322a-4 and the lower recess 322b-4, as well as the through-hole 327, may be formed around the second glass portion 320-4.

As illustrated, a through hole may be formed in the second glass portion 320-4 to enhance bending performance of the transparent member 300-4.

Figure 11C:
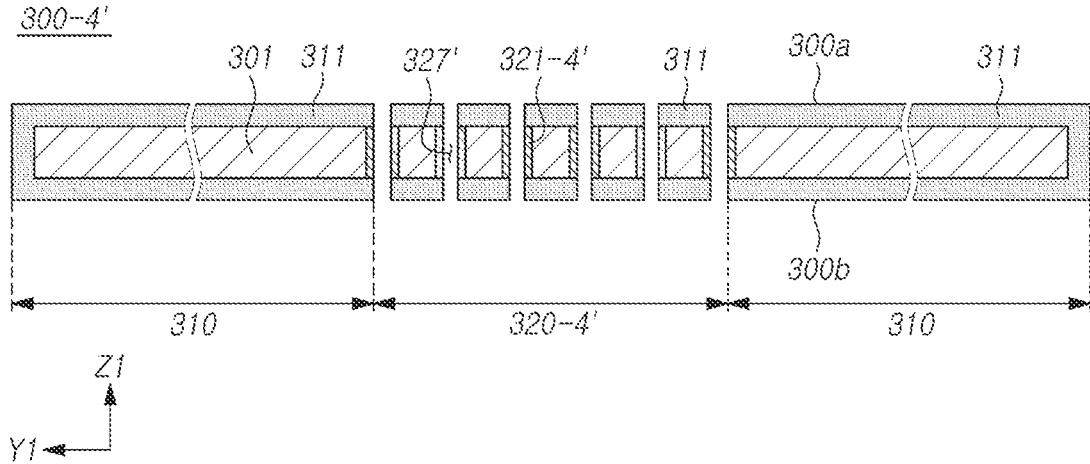
FIG. 11C is a cross-sectional view illustrating a transparent member according to an embodiment of the disclosure.

FIG. 11C is a cross-sectional view illustrating a transparent member according to an embodiment of the disclosure.

Referring to FIG. 11C, the thickness of the first glass portion 310, the first depth of the first area 311, the thickness of the second glass portion 320-4', and the second depth of the second area 321-4' have been described with reference to FIG. 7A, and are not described below. A detailed description of the components described with reference to FIG. 7A among the components of FIG. 11C will be omitted.

The transparent member 300-4' illustrated in FIG. 11C may have a shape that is the same as or similar to the shape in the planar view of the transparent member 300-4 illustrated in FIG. 11A. The transparent member 300-4' illustrated in FIG. 11C is similar to the transparent member 300-4 described with reference to FIGS. 11A and 11B in that a plurality of through-holes 327' are formed in the second glass portion 320-4'. The description of the shape or pattern of the through-hole 327' of FIG. 11C is replaced with the description of the through-hole 327 made with reference to FIGS. 11A and 11B. Referring to FIG. 11C, unlike other embodiments of the disclosure, the thickness of the second glass portion 320-4' of the transparent member 300-4' may be substantially the same as the thickness of the first glass portion 310. The bending performance of the second glass portion 320-4' may be enhanced by forming a plurality of through-holes 327' while maintaining the same thickness as that of the first glass portion 310.

According to an example, the upper surface and the lower surface of the second glass portion 320-4' of the transparent member 300-4' may be formed of the first area 311. Here, the upper surface of the second glass portion 320-4' may be a surface corresponding to the upper surface 300a of the transparent member 300-4'. Here, the lower surface of the second glass portion 320-4' may be a surface corresponding to the lower surface 300b of the transparent member 300-4'. In the etching process S30 of FIG. 5, since etching for forming recesses is not performed on the upper and lower surfaces of the second glass portion 320-4', the first chemically reinforced area 311 formed by the first chemical reinforcement S20 may remain on the upper and lower surfaces of the second glass portion 320-4'.

According to an example, the vertical surface of the second glass portion 320-4' of the transparent member 300-4' may be formed of the second area 321-4'. Here, the vertical surface of the second glass portion 320-4' may refer to a surface in contact with the through-hole 327'. A second area 321-4' that is thinner than the first area 311 may be formed on the vertical surface of the second glass portion 320-4'. Accordingly, even if the width is reduced by the plurality of through-holes 327', the strength of the transparent member 300-4' may be enhanced by forming a thin second area 321-4' corresponding thereto by using the manufacturing process of FIG. 5.

Figure 12:
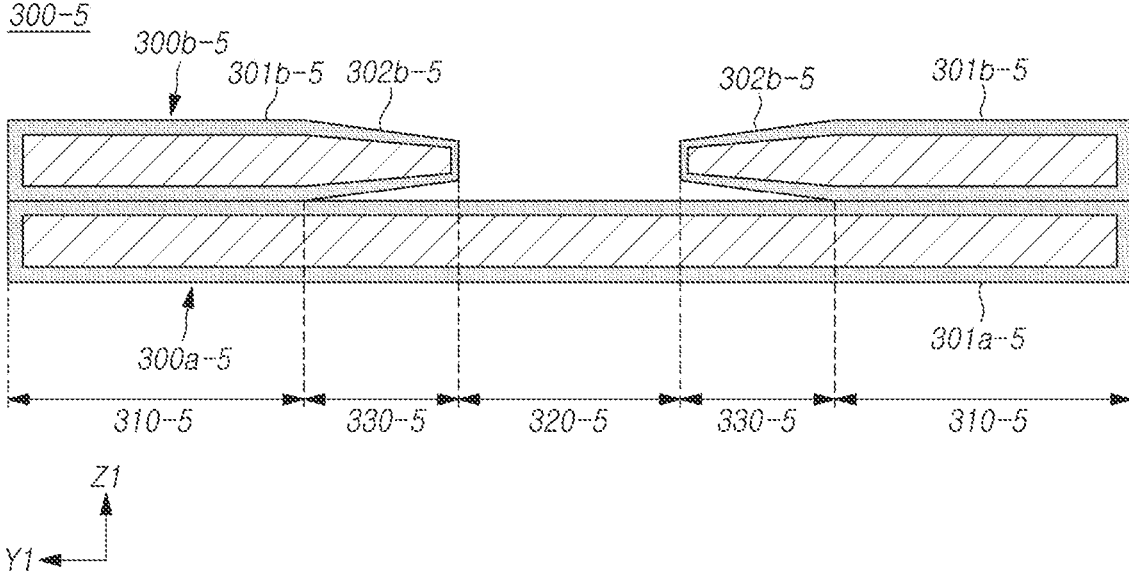
FIG. 12 is a cross-sectional view illustrating a transparent member according to an embodiment of the disclosure.

FIG. 12 is a cross-sectional view illustrating a transparent member according to an embodiment of the disclosure.

For convenience of description, the thickness of the transparent member 300-5 may be somewhat exaggerated in FIG. 12.

Referring to FIG. 12, the transparent member 300-5 may include a first transparent member 300a-5 and a second transparent member 300b-5. The first transparent member 300a-5 may correspond to, e.g., substantially all areas of the flexible display (e.g., the flexible display 230 of FIG. 4A). For example, at least a portion of the second transparent member 300b-5 may correspond to a first area (e.g., the first area 230a of FIG. 4A) of the flexible display 230. The transparent member 300-5 may have a two-level stacked structure in which the second transparent member 300b-5 is partially stacked on the first transparent member 300a-5. The refractive indices of the first transparent member 300a-5 and the second transparent member 300b-5 may be substantially the same but are not limited thereto.

According to an example, the transparent member 300-5 may include a first glass portion 310-5 corresponding to a non-flexible area of the flexible display 230, a second glass portion 320-5 corresponding to a portion of the flexible area of the flexible display 230, and a third portion 330-5 connecting the first glass portion 310-5 and the second glass portion 320-5. For example, at least a portion of the third portion 330-5 may be positioned near an edge of a second area (e.g., the second area 230*b* of FIG. 4A) of the flexible display 230.

According to an example, the first transparent member 300*a*-5 may include a first area 301*a*-5 near a surface thereof. The first area 301*a*-5 may have, e.g., substantially the same reinforcement depth throughout the entire surface of the first transparent member 300*a*-5.

According to an example, the second transparent member 300*b*-5 may include a second area 301*b*-5 formed in a portion corresponding to the first glass portion 310-5 and a third reinforced area 302*b*-5 corresponding to the third portion 330-5. The reinforcement depth of the second area 301*b*-5 may be substantially the same as, e.g., the reinforcement depth of the first area 301*a*-5, but is not limited thereto. The reinforcement depth of the third reinforced area 302*b*-5 may be smaller than the reinforcement depth of the second area 301*b*-5.

According to an example, the shape of the portion corresponding to the third portion 330-5 of the second transparent member 300*b*-5 may be formed by the etching process S30 of FIG. 5. The third reinforced area 302*b*-5 formed in the third portion 330-5 of the second transparent member 300*b*-5 may be formed by the second chemical reinforcement process S50 of FIG. 5.

By forming an inclined surface on the third portion 330-5 of the second transparent member 300*b*-5, visibility of a boundary between the first glass portion 310-5 and the second glass portion 320-5 may be enhanced.

Figure 13:
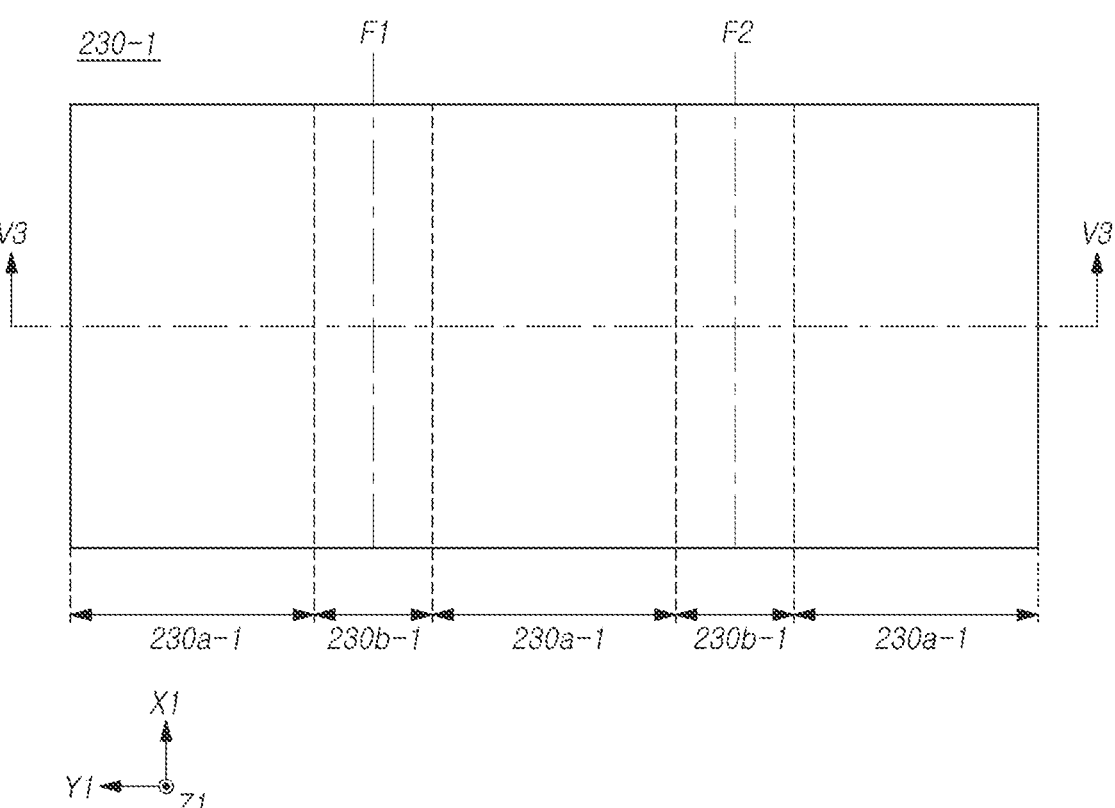
FIG. 13 is a plan view illustrating a flexible display folded multiple times according to an embodiment of the disclosure.

FIG. 13 is a plan view illustrating a flexible display folded multiple times according to an embodiment of the disclosure.

Referring to FIG. 13, a flexible display 230-1 may have a plurality of folding axes F1 and F2. For example, the folding axes F1 and F2 may include a first folding axis F1 and a second folding axis F2 spaced apart from each other. The first folding axis F1 and the second folding axis F2 may be parallel to each other, for example.

According to an example, the flexible display 230-1 may include a plurality of first areas 230*a*-1 and a plurality of second areas 230*b*-1. The plurality of second areas 230*b*-1 may be formed around, e.g., the first folding axis F1 and the second folding axis F2, respectively. The plurality of first areas 230*a*-1 may be formed to extend from, e.g., the second area 230*b*-1. The first area 230*a*-1 may refer to a flat area or a non-flexible area that maintains a flat surface even when the flexible display 230-1 is folded about the folding axes F1 and F2. The second area 230*b*-1 may refer to a bending area or a flexible area that is bent when the flexible display 230-1 is folded about the folding axes F1 and F2.

Figure 14:
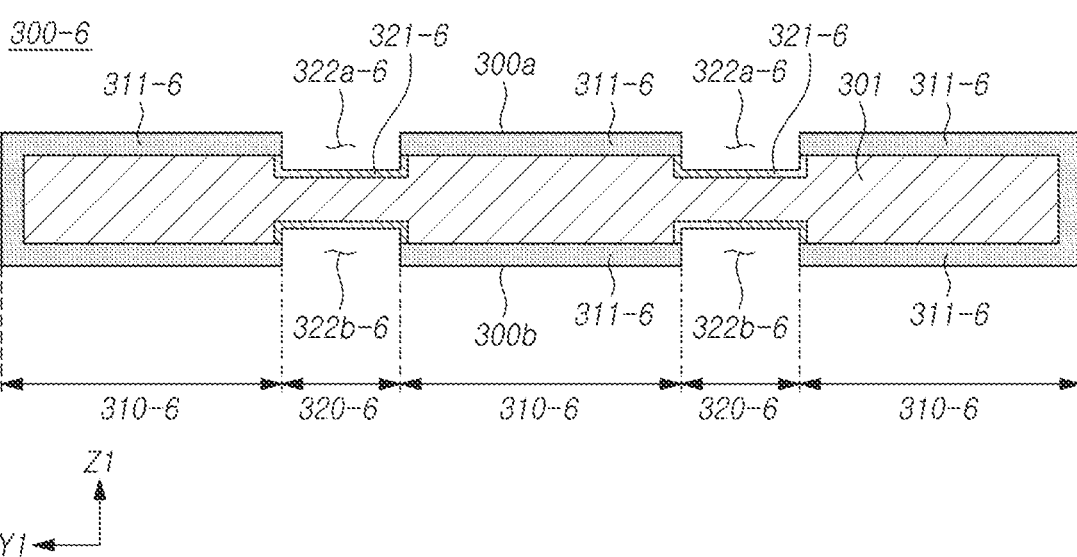
FIG. 14 is a cross-sectional view illustrating a transparent member included in a flexible display of FIG. 13 according to an embodiment of the disclosure.

The flexible display 230-1 may include a display panel and a transparent member (e.g., a transparent member 300-6 of FIG. 14). Like the flexible display 230-1, the display panel may include a flexible area (e.g., the second area 230*b*-1) and a non-flexible area (e.g., the first area 230*a*-1) adjacent to the flexible area.

The display panel may be provided to display an image. The display panel may be, e.g., a light emitting display panel. The display panel may be, e.g., an organic light emitting display panel or a quantum dot light emitting display panel. The light emitting layer of the organic light emitting display panel may include an organic light emitting material. The light emitting layer of the quantum dot light emitting display panel may include quantum dots and quantum rods. The display panel may be flexible.

The transparent member 300-6 (or window) may be disposed on, e.g., the display panel. Different components (e.g., input detection units) may be disposed on the transparent member 300-6 and the display panel. The transparent member 300-6 may include an optically transparent insulating material. Accordingly, the image generated by the display panel may be easily transferred to the user through the transparent member 300-6.

The transparent member 300-6 may transmit the image from the display panel while mitigating the external impact, thereby preventing the display panel from being damaged or malfunctioning due to the external impact. Here, the external impact is a force applied from the outside, such as pressure and stress, and may refer to a force that causes damage to the display panel.

FIG. 14 is a cross-sectional view illustrating a transparent member included in a flexible display of FIG. 13 according to an embodiment of the disclosure.

The transparent member 300-6 of FIG. 14 may be a cross section of the transparent member 300-6 with respect to the cross section taken along line V3-V3' of the flexible display (e.g., the flexible display 230-1 of FIG. 13) of FIG. 13. In FIG. 14, the thickness of the first glass portion 310-6, the first depth of a first area 311-6, the thickness of the second glass portion 320-6, and the second depth of a second area 321-6 have been described with reference to FIG. 7A and are not described below. A detailed description of the components described with reference to FIG. 7A among the components of FIG. 14 will be omitted. For convenience of description, the thickness of the transparent member 300-6 may be somewhat exaggerated in FIG. 14.

Referring to FIG. 14, the transparent member 300-6 may include a plurality of first glass portions 310-6 and a plurality of second glass portions 320-6. The first glass portion 310-6 may extend from one edge of the second glass portion 320-6. One second glass portion 320-6 may be disposed, e.g., between two adjacent first glass portions 310-6.

According to an example, the first glass portion 310-6 may correspond to a non-flexible area of the flexible display 230-1 or a display panel (not shown). According to an example, the second glass portion 320-6 may correspond to a flexible area of the flexible display 230-1 or a display panel.

According to an example, the second glass portion 320-6 may include an upper recess 322*a*-6 and a lower recess 322*b*-6. As the upper recess 322*a*-6 and the lower recess 322*b*-6 are formed, internal stress may be evenly dispersed to the two first glass portions 310-6 positioned on two opposite sides of the second glass portion 320-6. The second glass portion 320-6 may be formed to be horizontally symmetrical for even stress dispersion.

The flexible display 230-1 and the transparent member 300-6 that are folded twice have been described with reference to FIGS. 13 and 14, but this is merely an example, and a flexible display and a transparent member that are folded three or more times may also be implemented as described above.

Figure 15A:
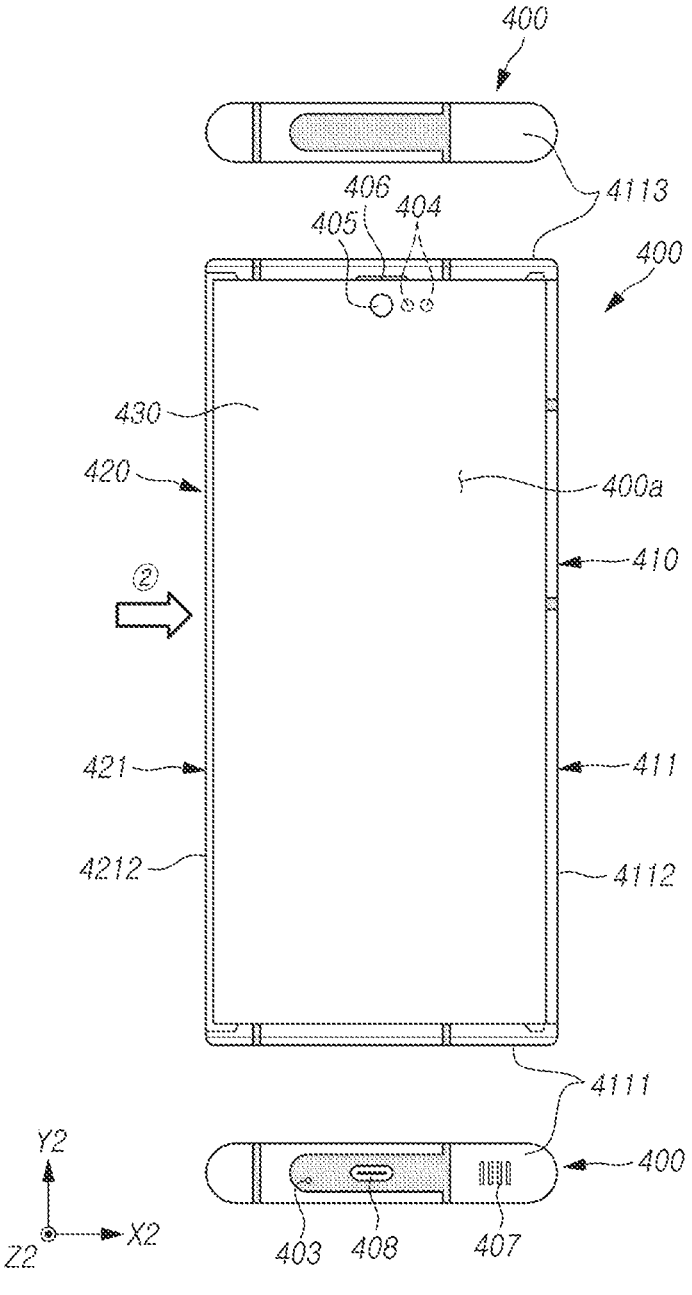
FIGS. 15A and 15B are front and rear views illustrating an electronic device in a closed state according to various embodiments of the disclosure.
Figure 15B:
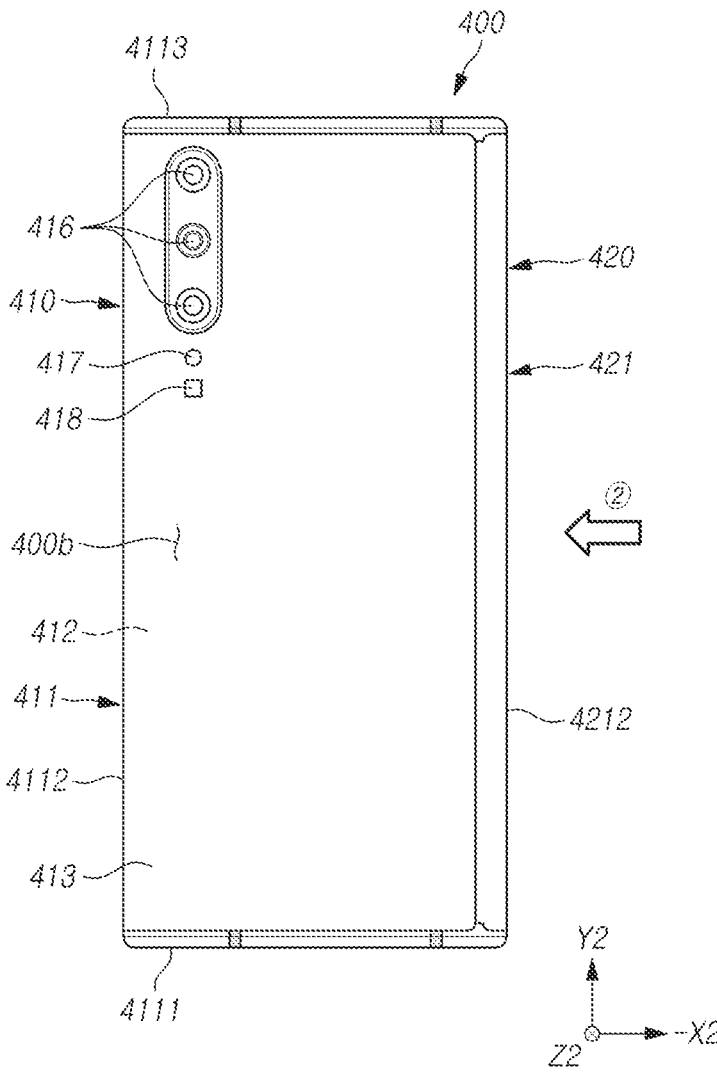
Figure 16A:
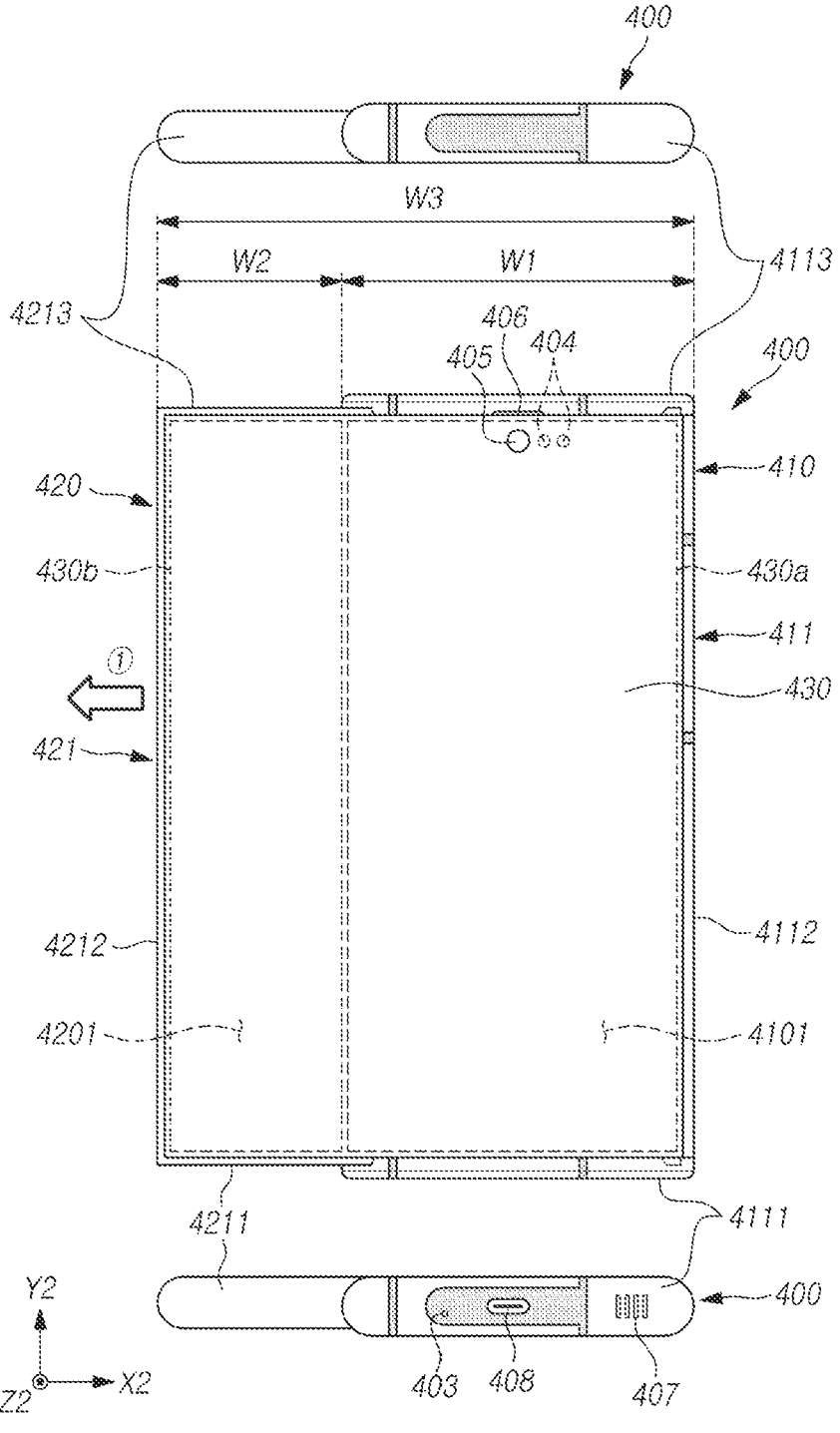
FIGS. 16A and 16B are front and rear views illustrating an electronic device in an open state according to various embodiments of the disclosure.
Figure 16B:
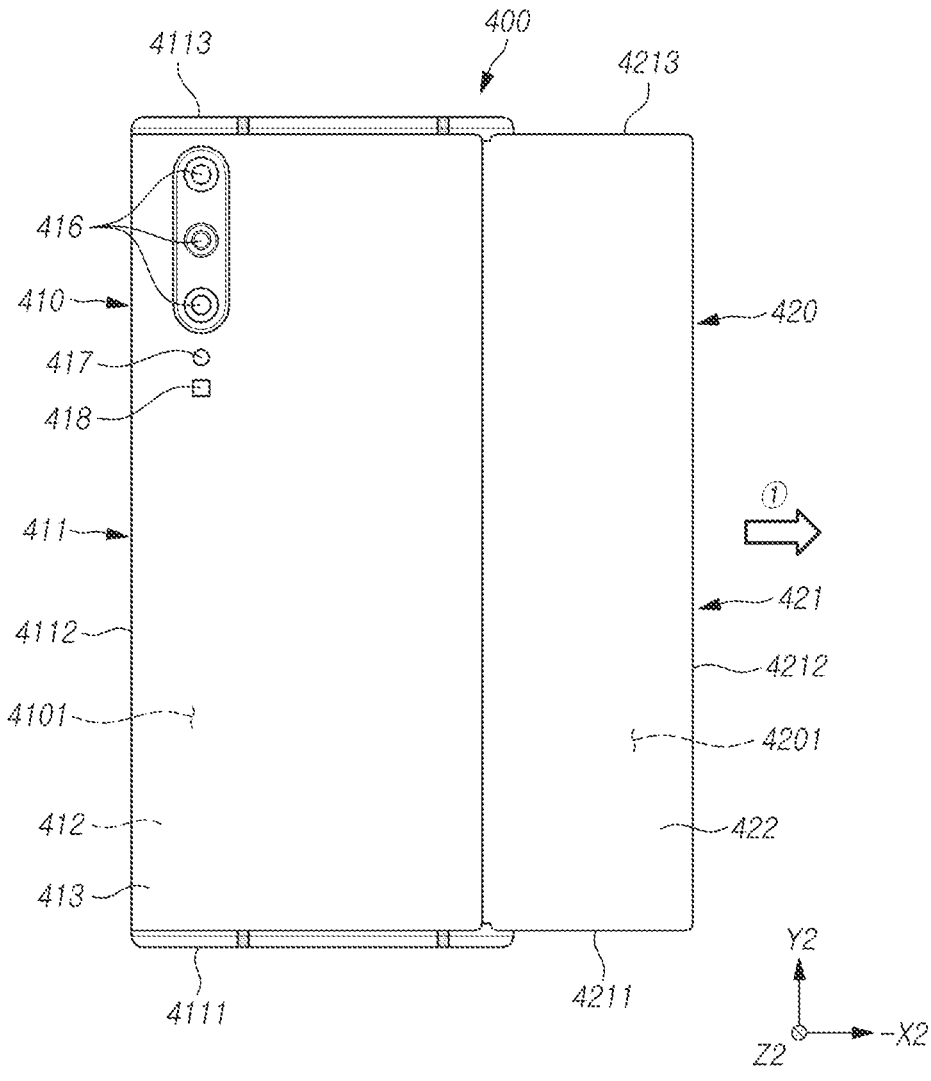

FIGS. 15A and 15B are front and rear views illustrating an electronic device in a closed state according to various embodiments of the disclosure. FIGS. 16A and 16B are front and rear views illustrating an electronic device in an open state according to various embodiments of the disclosure.

In FIGS. 15A and 15B, or FIGS. 16A and 16B, an electronic device 400 may be at least partially similar to the electronic device 101 of FIG. 1 or may further include other embodiments of the electronic device 101.

Referring to FIGS. 15A and 15B, or FIGS. 16A and 16B, an electronic device 400 according to an embodiment may include a first housing 410 (e.g., a first housing structure or a base housing) or a second housing 420 (e.g., a second housing structure or a slide housing). The electronic device 400 may include a flexible display 430 (e.g., an expandable display, a stretchable display, a rollable display, or a display assembly) (e.g., the display module 160 of FIG. 1) fastened to be slidable or rollable. The electronic device 400 may have a structure in which at least two housings are stacked front to rear to be slidable in a designated direction (e.g., a left-right direction or an upper-lower direction). For example, as one housing slides along another housing in a designated direction (e.g., the left-right direction or the upper-lower direction), the display area of the flexible display 430 may vary.

For example, the second housing 420 may be coupled to the first housing 410 to be movable in a designated direction (e.g., the X2-axis direction (the right direction)) and within a designated distance from the first housing 410. The flexible display 430 may be disposed on the front surface of the electronic device 400 to be supported through at least a portion of the first housing 410 and the second housing 420.

The electronic device 400 may switch from the open state (stretched state, unbended state or first state) to the closed state (bended state or second state) as at least a portion of the second housing 420 is received in a first receiving portion 4101 of the first housing 410. Here, the first receiving portion 4101 may refer to a space formed inside the first housing 410. The electronic device 400 may switch from the closed state to the open state as at least the portion of the second housing 420, received in the first receiving portion 4101, is slid out of the first receiving portion 4101. The open state may refer to, e.g., a state in which the second area 430b of the flexible display 430 is maximized, and the closed state may refer to, e.g., a state in which the second area 430b of the flexible display 430 is minimized. Alternatively, the open state may refer to a state in which the second housing 420 is maximally slid out (roll-out or draw-out) of the first housing 410, and the closed state may refer to a state in which the second housing 420 is maximally slid in (roll-in or draw-in) to the first housing 410.

The electronic device 400 may lead to the display area of the flexible display 430 being varied by sliding the second housing 420 along a designated direction (e.g., the X2-axis direction (direction ②) or the –X2-axis direction (direction ①)) from the first housing 410.

The display area of the flexible display 430 may vary depending on the slide-in operation (e.g., the movement in the X2-axis direction (direction ②)) or the slide-out operation (e.g., the movement in the –X2-axis direction (direction ①)). The flexible display 430 may perform, e.g., a slide-in operation or a slide-out operation by an external force (e.g., the user's manipulation) or an internal force (e.g., a separate driving module provided therein). The slide-in operation may be a series of operations for reducing the size of the display area by the flexible display 430. The slide-out operation may be a series of operations for increasing the size of the display area by the flexible display 430. Hereinafter, for convenience of description, a state in which the display area of the flexible display 430 is maximized by the slide-out operation is referred to as an open state, and a state in which the display area of the flexible display 430 is minimized by the slide-in operation is referred to as a closed state. For convenience of description, in the following description, the state of the flexible display 430 before the slide-in or slide-out operation commences is denoted as a first state or an initial state, and the state of the flexible display 430 after the slide-in or slide-out operation has been done is denoted as a second state or a switching state.

The flexible display 430 may be disposed so that a first area 430a corresponding to at least a portion is not received in the first receiving portion 4101 of the first housing 410 or the second receiving portion 4201 of the second housing 420. Here, the first area 430a may refer to a flat area disposed to be always visible from the outside regardless of whether the flexible display 430 is slid in or out. The first area 430a may be used, e.g., for the electronic device 400 to display an image according to an operation on the front surface. The first area 430a of the flexible display 430 may be disposed to be visible from the outside (e.g., the front surface).

In the flexible display 430, the second area 430b corresponding to at least a portion may be received in the first receiving portion 4101 of the first housing 410 or the second receiving portion 4201 of the second housing 420. Here, the second area 430b may be an area in which an area visible from the outside varies according to the slide-in or slide-out of the flexible display 430. The second area 430b may be deactivated not to be used to display the image according to the operation of the electronic device 400 or activated to be used to display the image according to the operation, on the rear surface, of the electronic device 400. The second area 430b of the flexible display 430 received in the receiving portion (e.g., the first receiving portion 4101 or the second receiving portion 4201) may be disposed to be visible from the outside or to be visible from the rear surface alone, but not from the front surface. The size of the second area 430b may be increased by the slide-out operation or decreased by the slide-in operation. The second area 430b may be activated to be used to display the image according to the operation of the electronic device 400, only on the portion visible from the outside as at least a portion is slid out.

The electronic device 400 may include a front surface 400a (e.g., a first surface), a rear surface 400b (e.g., a second surface) facing away from the front surface 400a, and a side surface (not shown) surrounding a space between the front surface 400a and the rear surface 400b. The side surface may be at least one of an upper surface, a lower surface, a left surface, or a right surface with respect to the front surface 400a. However, this is an example, and a first side member 411 and a second side member 421 may have surfaces corresponding to one or two of the four surfaces of the first housing 410 and the second housing 420. Hereinafter, for convenience of description, a case of having three surfaces is described as an example.

The electronic device 400 may include a first housing 410 and a second housing 420. The first housing 410 may include a first side member 411. The second housing 420 may include a second side member 421. The first side member 411 may form an edge corresponding to at least three surfaces (e.g., the upper, lower, and right surfaces of the front surface) among the four surfaces of the first housing 410. The second side member 421 may form an edge corresponding to at least three surfaces (e.g., the upper, lower, and left surfaces of the front surface) among the four surfaces of the second housing 420.

The first side member 411 may include at least one of a first side surface 4111 (e.g., a lower surface of the first housing 410), a second side surface 4112 (e.g., a right surface of the first housing 410), or a third side surface 4113 (e.g., an upper surface of the first housing 410) with respect to the front surface. The first side surface 4111 may have a first length along a first direction (e.g., X2-axis direction). The second side surface 4112 may extend to have a second length longer than the first length along a direction (e.g., Y2-axis direction) substantially perpendicular to the first side surface 4111. The third side surface 4113 may extend substantially parallel to the first side surface 4111 from the second side surface 4112 and may have the first length. The first side member 411 may be, e.g., at least partially formed of a conductive material (e.g., metal). The first side member 411 may include, e.g., a first supporting member 412 extending to at least a portion of the first receiving unit 4101 of the first housing 410.

The second side member 421 may include at least one of a fourth side surface 4211 (e.g., a lower surface of the second housing 420), a fifth side surface 4212 (e.g., a left surface of the second housing 420), or a sixth side surface 4213 (e.g., an upper surface of the second housing 420) with respect to the front surface. The fourth side surface 4211 at least partially corresponds to the first side surface 4111 and may have a third length. The fifth side surface 4212 may extend substantially parallel to the second side surface 4112 from the fourth side surface 4211 and may have a fourth length larger than the third length. The sixth side surface 4213 may extend substantially parallel to the third side surface 4113 from the fifth side surface 4212 and may have the third length. The second side member 421 may be, e.g., at least partially formed of a conductive material (e.g., metal). The second side member 421 may include, e.g., a second supporting member 422 extending to at least a portion of the second receiving unit 4201 of the second housing 420.

The first side surface 4111 and the fourth side surface 4211 or the third side surface 4113 and the sixth side surface 4213 may be coupled to be slidable on each other. In this case, the whole or part of the fourth side surface 4211 overlaps the first side surface 4111 and may thus be disposed to be substantially invisible from the outside. Further, the whole or part of the sixth side surface 4213 overlaps the third side surface 4113 and may thus be disposed to be substantially invisible from the outside. For example, the fourth side surface 4211 or the sixth side surface 4213 may be disposed to be at least partially visible from the outside in the closed state.

When slid in, the second supporting member 422 included in the second side member 421 overlaps the first supporting member 412 included in the first side member 411 and may thus be disposed to be substantially invisible from the outside. For example, in a state not fully slid in, a portion of the second supporting member 422 may overlap the first supporting member 412 to be invisible from the outside, and the rest of the second supporting member 422 may be disposed not to overlap the first supporting member 412 to be visible from the outside.

The electronic device may include a rear cover 413. The rear cover 413 may be disposed on at least a portion of the first housing 410, on the rear surface 400*b* of the electronic device. The rear cover 413 may be disposed through at least a portion of, e.g., the first supporting member 412. The rear cover 413 may be formed integrally with, e.g., the first side member 411. The rear cover 413 may be formed of, e.g., polymer, laminated or colored glass, ceramic, metal (e.g., aluminum, stainless steel (STS), or magnesium), or a combination of at least two thereof. The rear cover 413 may extend, e.g., to at least a portion of the first side member 411. At least a portion of the first supporting member 412 may be replaced with, e.g., the rear cover 413. The electronic device 400 may further include another rear cover (e.g., second rear cover) which is disposed on, or replaced with, at least a portion of the second supporting member 422, in the second housing 420.

The electronic device 400 may include a flexible display 430 disposed to be supported by at least a portion of the first housing 410 or the second housing 420. The flexible display 430 may include a first area 430*a* (e.g., flat portion) and/or a second area 430*b* (e.g., a bent portion, a bendable portion, or a rolling portion). The first area 430*a* may be an area that is always visible from the outside of all areas of the flexible display 430. When slid in, the second area 430*b* which may extend from the first area 430*a* may be received into the first receiving portion 4101 of the first housing 410 or the second receiving portion 4201 of the second housing 420 to be invisible from the outside and, when slid out, slid out of the first receiving portion 4101 or second receiving portion 4201 to be visible from the outside. The first area 430*a* may be disposed to be supported by the first housing 210. The area slid out of the first receiving portion 4101 or second receiving portion 4201 of the first area 430*a* or the second area 430*b*, may be activated to display an image, and the area received in the first receiving portion 4101 or second receiving portion 4201, of the second area 430*b* may be deactivated to not display an image.

The second area 430*b* of the flexible display 430 may extend from the first area 430*a* in a state in which the second housing 420 is slid out in a designated direction (direction ①). To this end, the second area 430*b* may form substantially the same plane as the first area 430*a* and may be disposed to be visible from the outside.

The second area 430*b* of the flexible display 430 may be received in the second receiving portion 4201 of the second housing 420 to be invisible from the outside or to be invisible from the front while being visible from the back, in a state slid in along a designated direction (direction ②).

The first housing 410 and/or the second housing 420 may be operated to slide on each other so that the entire width is variable. As an example, in the closed state, the electronic device 400 may be configured to have a first width W1 between the second side surface 4112 and the fifth side surface 4212. Further, the electronic device 400 may be configured to have a third width W3 that is larger than the first width W1 as a whole by being moved to have the second width W2 in the open state. In the closed state, the flexible display 430 included in the electronic device 400 may have a display area substantially corresponding to the first width W1 and, in the open state, have an extended display area substantially corresponding to the third width W3.

The slide-in and/or slide-out operation of the electronic device 400 may be automatically performed. The electronic device 400 may receive, e.g., a slide-in or slide-out request and operate the driving module disposed therein. The slide-in or slide-out request may be performed through a designated operation button disposed in the electronic device 400 and/or through a touch to a corresponding object displayed on the flexible display 430. As an example, upon detecting a slide-in and/or slide-out event, the processor (e.g., the processor 120 of FIG. 1) of the electronic device 400 may operate to control the slide of the second housing 420 through the driving module. The processor (e.g., the processor 120 of FIG. 1) of the electronic device 400 may operate to control the display screen of the flexible display 430 to execute an application program or display an object in various manners, corresponding to the changed display area of the flexible display 430 according to, e.g., the closed state, open state, or intermediate state (including, e.g., a free-stop state).

The electronic device 400 may include at least one of an input module (e.g., a microphone 403), a sound output module (e.g., a receiver 406 for phone calls or speaker 407), sensor modules 404 and 417, a camera module (e.g., a first camera module 405 or a second camera module 416), a connector port 408, a key input device (not shown), or an indicator (not shown), disposed in the first receiving portion 4101 of the first housing 410. The electronic device 400 may be configured to omit at least one of the above-described components or add other components. At least one of the above-described components may be disposed in the second receiving portion 4201 of the second housing 420.

The input module may include a plurality of microphones disposed to detect the direction of sound. The sound output module may include, e.g., the receiver 406 for phone calls and the speaker 407. In the open state, the speaker 407 may be disposed to face the outside through at least one speaker hole, formed in the first housing 410. The connector port 408 may be disposed to face the outside through the connector port formed in the first housing 410. The receiver 406 for phone calls may include a speaker (e.g., a piezo speaker) operated without a separate speaker hole.

The sensor modules 404 and 417 may generate an electrical signal or data value corresponding to an internal operating state or external environmental state of the electronic device 400. The sensor modules 404 and 417 may include a first sensor module 404 (e.g., proximity sensor or illuminance sensor) disposed on the front surface 400a of the electronic device 400 and/or a second sensor module 417 (e.g., heart rate monitoring (HRM) sensor) disposed on the rear sensor 400b. The first sensor module 404 may be disposed under the flexible display 430, e.g., on the front surface 400a of the electronic device 400. The first sensor module 404 and/or the second sensor module 417 may include at least one of the proximity sensor, the illuminance sensor, the TOF) sensor, the ultrasonic sensor, the fingerprint recognition sensor, the gesture sensor, the gyro sensor, the air pressure sensor, the magnetic sensor, the accelerometer, the grip sensor, the color sensor, the IR sensor, the biometric sensor, the temperature sensor, or the humidity sensor.

The camera module may include the first camera module 405 disposed on the front surface 400a of the electronic device 400 and the second camera module 416 disposed on the rear surface 400b. The first and/or second camera module 405 and 416 may include one or more lenses, an image sensor, and/or an ISP. For example, the first camera module 405 may be disposed under the flexible display 430 and be configured to capture a subject through a portion of the active area of the flexible display 430. The flash 418 may be disposed on the second camera module 416. The flash 418 may include, e.g., a light emitting diode (LED) or a xenon lamp.

The first camera module 405 among the camera modules or some sensor module 404 among the sensor modules 404 and 417 may be disposed to detect the external environment through the flexible display 430. For example, the first camera module 405 or some sensor module 404 may be disposed to contact the external environment through an opening or a transmissive area formed in the flexible display 430, in the first receiving portion 4101 of the first housing 410. The area of the flexible display 430 facing the first camera module 405 may be a portion of the area displaying content and be formed as a transmissive area having a designated transmittance. The transmissive area may be formed to have a transmittance ranging from about 5% to about 20%. The transmissive area may include an area overlapping an effective area (e.g., an angle-of-view area) of the first camera module 405 through which light incident on the image sensor to obtain an image passes. For example, the transmissive area of the flexible display 430 may include an area having a lower pixel density and/or wiring density than the surrounding area. The transmissive area may replace the above-described opening. The camera module 405 may include an under display camera (UDC). The sensor module 404 may be disposed to perform its functions without being visually exposed through the flexible display 430 in the internal space of the electronic device 400.

Figure 17A:
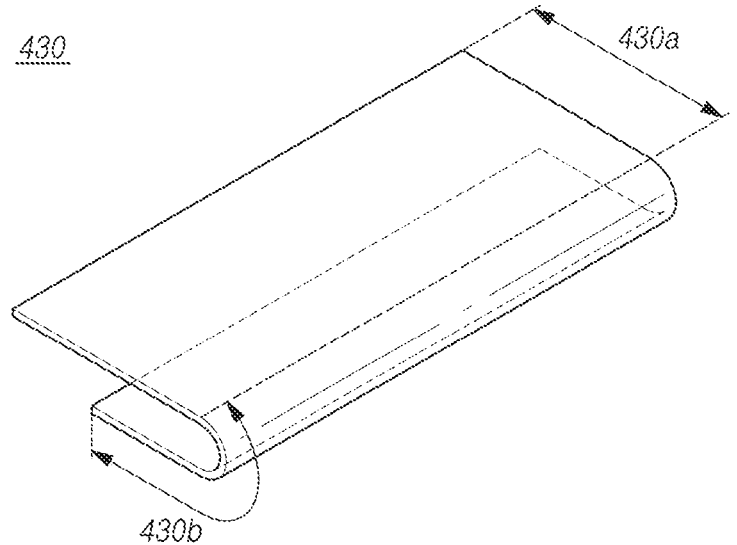
FIGS. 17A and 17B are perspective views illustrating a flexible display according to various embodiments of the disclosure.
Figure 17B:
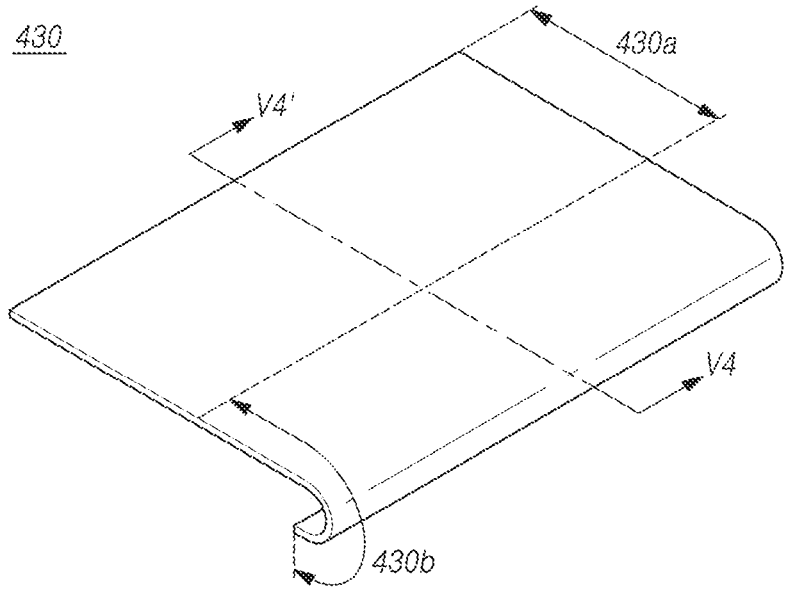

FIGS. 17A and 17B are perspective views illustrating a flexible display according to various embodiments of the disclosure.

Referring to FIGS. 17A and 17B, the flexible display 430 may include a first area 430a and a second area 430b extending from the first area 430a. The first area 430a may refer to a flat area or a non-flexible area that maintains a flat surface even when the electronic device (e.g., the electronic device 400 of FIG. 15A) slides between the closed state and the open state. The second area 430b may refer to a bending area or a flexible area that is bent when the electronic device 400 slides between the closed state and the open state. The first area 430a and the second area 430b may be disposed so that one surface of each area contacts one surface of the other area.

Figure 18:
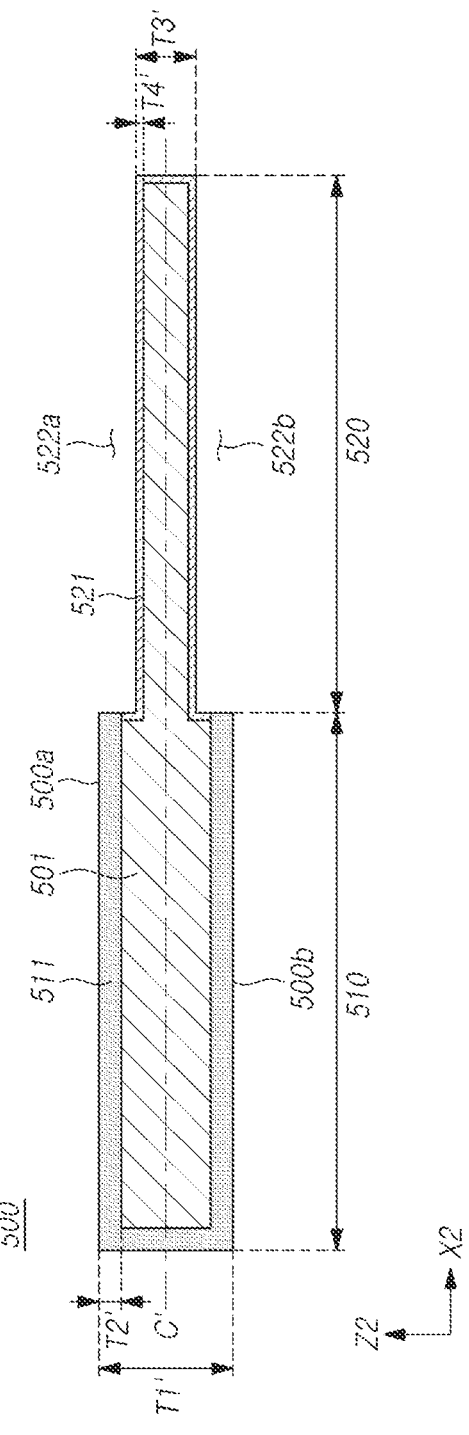
FIG. 18 is a cross-sectional view illustrating a transparent member according to an embodiment of the disclosure.
Figure 19:
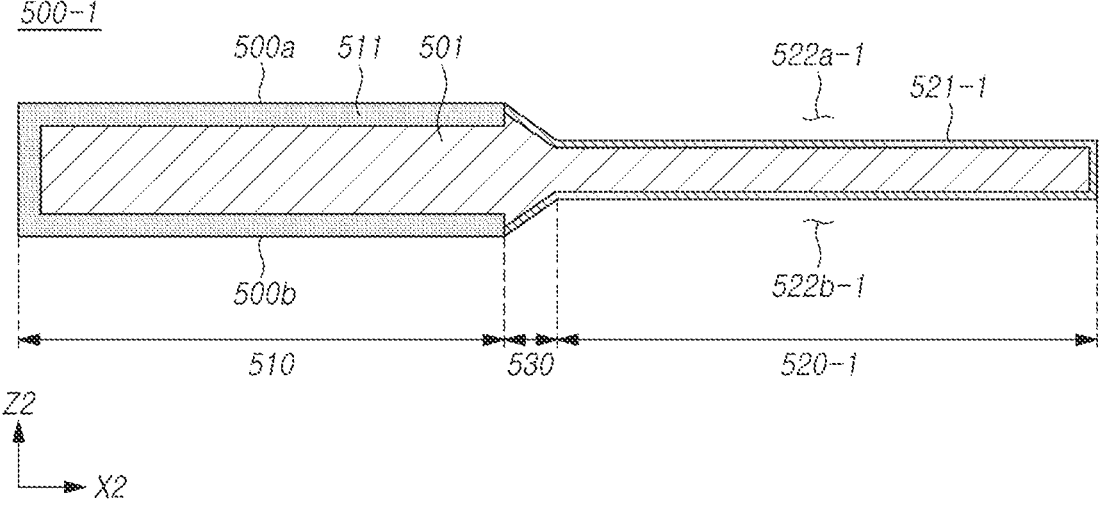
FIG. 19 is a cross-sectional view illustrating a transparent member according to an embodiment of the disclosure.

The flexible display 430 may include a display panel and a transparent member (e.g., a transparent member 500 of FIG. 18 or the transparent member 500-1 of FIG. 19). Like the flexible display 430, the display panel may include a flexible area (e.g., the second area 430b) and a non-flexible area (e.g., the first area 430a) adjacent to the flexible area.

The display panel may be provided to display an image. The display panel may be, e.g., a light emitting display panel, but is not limited thereto. The display panel may be, e.g., an organic light emitting display panel or a quantum dot light emitting display panel. The light emitting layer of the organic light emitting display panel may include an organic light emitting material. The light emitting layer of the quantum dot light emitting display panel may include quantum dots and quantum rods. The display panel may be flexible.

The transparent member 500 (or window) may be disposed on, e.g., the display panel. Different components (e.g., input detection units) may be disposed on the transparent member 500 and the display panel. The transparent member 500 may include an optically transparent insulating material. Accordingly, the image generated by the display panel may be easily transferred to the user through the transparent member 500.

The transparent member 500 may transmit the image from the display panel while mitigating the external impact, thereby preventing the display panel from being damaged or malfunctioning due to the external impact. Here, the external impact is a force applied from the outside, such as pressure and stress, and may refer to a force that causes damage to the display panel.

FIG. 18 is a cross-sectional view illustrating a transparent member according to an embodiment of the disclosure.

The transparent member 500 of FIG. 18 may be a cross section of the transparent member 500 with respect to the cross section taken along line V4-V4' of the flexible display (e.g., the flexible display 430 of FIG. 17B) of FIG. 17A. For convenience of description, the thickness of the transparent member 500 may be somewhat exaggerated in FIG. 18.

Referring to FIG. 18, the transparent member 500 may include a first glass portion 510 and a second glass portion 520. The first glass portion 510 may extend from one edge of the second glass portion 520.

According to an example, the first glass portion 510 may correspond to a non-flexible area of the flexible display 430 or a display panel (not shown). The first glass portion 510 may have a first thickness T1'. Here, the first thickness T1' may refer to a length between the upper surface 500a and the lower surface 500b of the transparent member 500 in the first glass portion 510. Alternatively, the first thickness T1' may refer to the length of the first glass portion 510 in the Z2-axis direction. The first thickness T1' may be larger than, e.g., the second thickness T3'. The first thickness T1' may be, e.g., 50 μm to 500 μm, but is not limited thereto.

According to an example, the first glass portion 510 may include a first area 511. The first area 511 may have a first depth T2'. Here, the first depth T2' may refer to the length of the chemically reinforced area from the surface of the first glass portion 510. The first depth T2' may be determined, e.g., in the first chemical reinforcement process S20 of FIG. 5. The first depth T2' may have, e.g., a length of 5% to 20% of the first thickness T1', but is not limited thereto.

According to an example, the second glass portion 520 may correspond to a flexible area of the flexible display 430 or a display panel (not shown). The second glass portion 520 may have a second thickness T3'. Here, the second thickness T3' may refer to a length between the upper surface 500a and the lower surface 500b of the transparent member 500 in the second glass portion 520. Alternatively, the second thickness T3' may refer to the length of the second glass portion 520 in the Z2-axis direction. The second thickness T3' may be smaller than, e.g., the first thickness T1'. The second thickness T3' may be, e.g., 30 μm to 60 μm, but is not limited thereto.

According to an example, the second glass portion 520 may include a second area 521. The second area 521 may have a second depth T4' different from the first depth T2. Here, the second depth T4' may refer to the length of the chemically reinforced area from the surface of the second glass portion 520. The second depth T4' may be determined, e.g., in the second chemical reinforcement process S50 of FIG. 5. The second depth T4' may have, e.g., a length of 5% to 20% of the second thickness T3', but is not limited thereto.

According to an example, the second glass portion 520 may include recesses 522a and 522b formed in the upper side and the lower side. The recesses 522a and 522b may include, e.g., a first recess 522a in the second glass portion 520 toward the upper surface 500a of the transparent member 500 and a second recess 522b in the second glass portion 520 toward the lower surface 500b of the transparent member 500. In the second glass portion 522, recesses 522a and 522b may be formed in the upper and lower sides, thereby forming a top-bottom notch structure. According to an embodiment of the disclosure, stress may be dispersed by forming the recesses 522a and 522b in both the upper and lower sides of the second glass portion 520.

According to an example, in the unfolding state of the transparent member 500, the upper surface of the first glass portion 510 and the upper surface of the second glass portion 520 may be positioned on different planes. Due to the first recess 522a formed in the upper side of the second glass portion 520, the upper surface of the second glass portion 520 may not be included in the plane including the upper surface of the first glass portion 510. For example, the upper surface of the second glass portion 520 may not be included in the plane including the upper surface of the first glass portion 510. In other words, for example, the upper surface of the second glass portion 520 may not be on the same plane as the upper surface of the first glass portion 510. Here, the upper surface of the first glass portion 510 may be the upper surface 500a of the transparent member 500. Here, the unfolding state of the transparent member 500 may refer to a state in which no bend exists in all areas of the transparent member 500.

According to an example, in the unfolding state of the transparent member 500, the lower surface of the first glass portion 510 and the lower surface of the second glass portion 520 may be positioned on different planes. Due to the second recess 522b formed in the lower side of the second glass portion 520, the lower surface of the second glass portion 520 may not be included in the plane including the lower surface of the first glass portion 510. For example, the lower surface of the second glass portion 520 may not be included in the plane including the lower surface of the first glass portion 510. In other words, for example, the lower surface of the second glass portion 520 may not be on the same plane as the lower surface of the first glass portion 510. Here, the lower surface of the first glass portion 510 may be the lower surface 500b of the transparent member 500.

According to an example, the first depth T2' and the second depth T4' may be different in size. For example, the first depth T2' may be greater than the second depth T4'. According to an example, the ratio of the first depth T2' to the first thickness T1' may be substantially the same as the ratio of the second depth T4' to the second thickness T3'. For example, when the first thickness T1' is 50 μm, and the second thickness T3' is 30 μm, the first depth T2' may be 7.5 μm, and the second depth may be 4.5 μm. By allowing the ratio of the first depth T2' to the first thickness T1' in the first glass portion 510 to be substantially the same as the ratio of the second depth T4' to the second thickness T3' in the second glass portion 520, the difference in expansion rate between the first glass portion 510 and the second glass portion 520 may be minimized. By minimizing the difference in the expansion rate between the first glass portion 510 and the second glass portion 520 having the different thicknesses, it is possible to prevent warpage that may occur in the transparent member 500 (especially the second glass portion 520).

According to an example, the second glass portion 520 may be formed to be horizontally symmetrical with respect to a virtual plane C' that is perpendicular to the thickness direction of the transparent member 500 and passes through the transparent member. The virtual plane C' may be, e.g., a plane perpendicular to the thickness direction of the transparent member 500 and dividing the average thickness of the transparent member 500 by half, but is not limited thereto. The virtual plane C' may be, e.g., a plane perpendicular to the thickness direction of the transparent member 500 and dividing the average thickness of the first glass portion 510 by half, but is not limited thereto. Here, the thickness direction may refer to the Z2-axis direction. Alternatively, the thickness direction may refer to a direction from the lower surface 500b of the transparent member 500 to the upper surface 500a of the transparent member 500. By forming the second glass portion 520 horizontally symmetrically with respect to the virtual plane C', stress may be evenly dispersed to the first glass portions 510 positioned on two opposite sides of the second glass portion 520.

According to an example, the boundary between the first glass portion 510 and the second glass portion 520 may have a surface/plane level difference (e.g., step or bump).

According to an example, although not illustrated, the transparent member 500 may further include a refractive index matching portion. For example, the refractive index matching portion may be disposed around at least one of the first glass portion 510 or the second glass portion 520 to match the refractive indexes of light formed by the difference in thickness between the first glass portion 510 and the second glass portion 520. The refractive index matching portion may be formed of, e.g., a transparent material. The refractive index matching portion may be formed of, e.g., a urethane-based, acrylic-based, or silicon-based material. The refractive index matching portion may have substantially the same refractive index as that of a base layer 501.

FIG. 19 is a cross-sectional view illustrating a transparent member according to an embodiment of the disclosure.

Referring to FIG. 19, a transparent member 500-1 may be a cross section of the transparent member 500-1 with respect to the cross section taken along line V4-V4' of the flexible display (e.g., the flexible display 430 of FIG. 17B) of FIG. 17B. In FIG. 19, the thickness of the first glass portion 510, the first depth of the first area 511, the thickness of the second glass portion 520-1, and the second depth of the second area 521-1 have been described with reference to FIG. 18, and are not described below. A detailed description of the components described with reference to FIG. 18 among the components of FIG. 19 will be omitted. For convenience of description, the thickness of the transparent member 500-1 may be somewhat exaggerated in FIG. 19.

The transparent member 500-1 according to an embodiment is entirely the same as or similar to the transparent member 500 of FIG. 18, but is different in that the transparent member 300-1 further includes a third portion 530. The following description focuses primarily on the differences.

According to an example, the third portion 530 may be disposed between the first glass portion 510 and the second glass portion 520-1. The third portion 530 may be disposed so that one side contacts an edge of the first glass portion 510 and the other side contacts an edge of the second glass portion 520-1. The third portion 530 may have an inclined/declined slope. The third portion 530 may be formed to be inclined downward from, e.g., the first glass portion 510 toward the second glass portion 520-1. The third portion 530 may be formed to be inclined to connect, e.g., the first glass portion 510 and the second glass portion 520-1. The slope of the third portion 530 may be a flat slope, but is not limited thereto, and may be a curved slope.

According to an example, the third portion 530 may be formed by the etching process S30 of FIG. 5. In the etching process S30, the upper recess 522a-1 and the lower recess 522b-1 may be formed around the second glass portion 520-1 and the third portion 530. Accordingly, the chemical enhancement depth of the third portion 530 may be the same as or similar to the chemical enhancement depth of the second glass portion 520-1.

By adding the third portion 530 to the boundary between the first glass portion 510 and the second glass portion 520-1 of the transparent member 500-1, the thickness of the base layer 501 may be gradually changed to enhance visibility of the transparent member 500-1.

Figure 20:
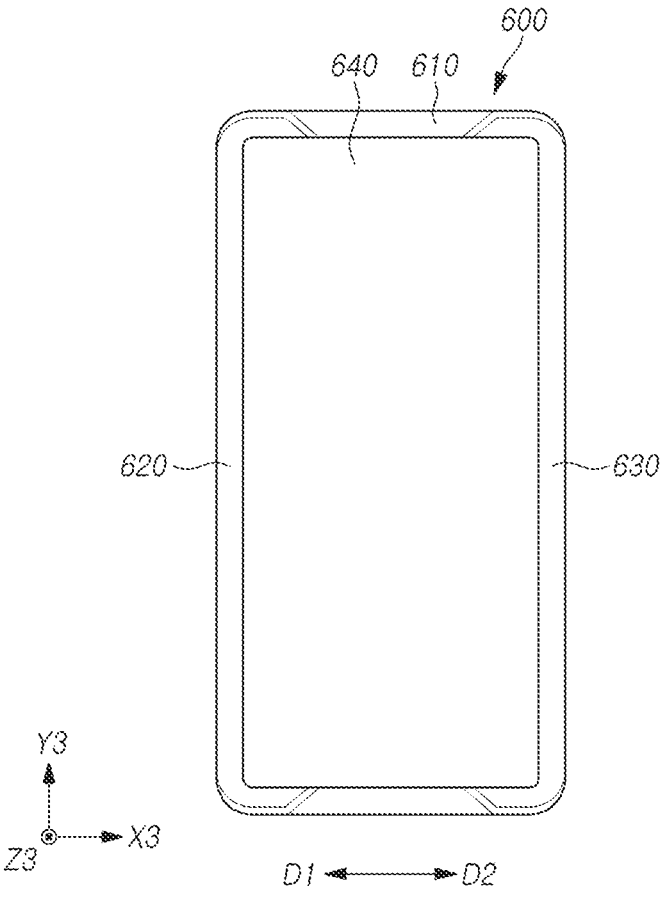
FIG. 20 is a view illustrating an electronic device in a closed state according to an embodiment of the disclosure.
Figure 20:
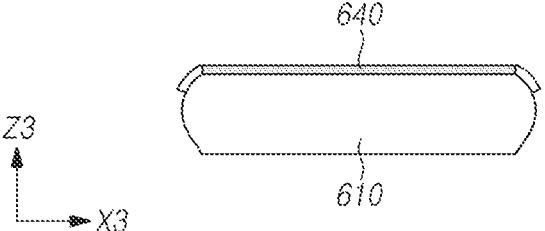
Figure 21:
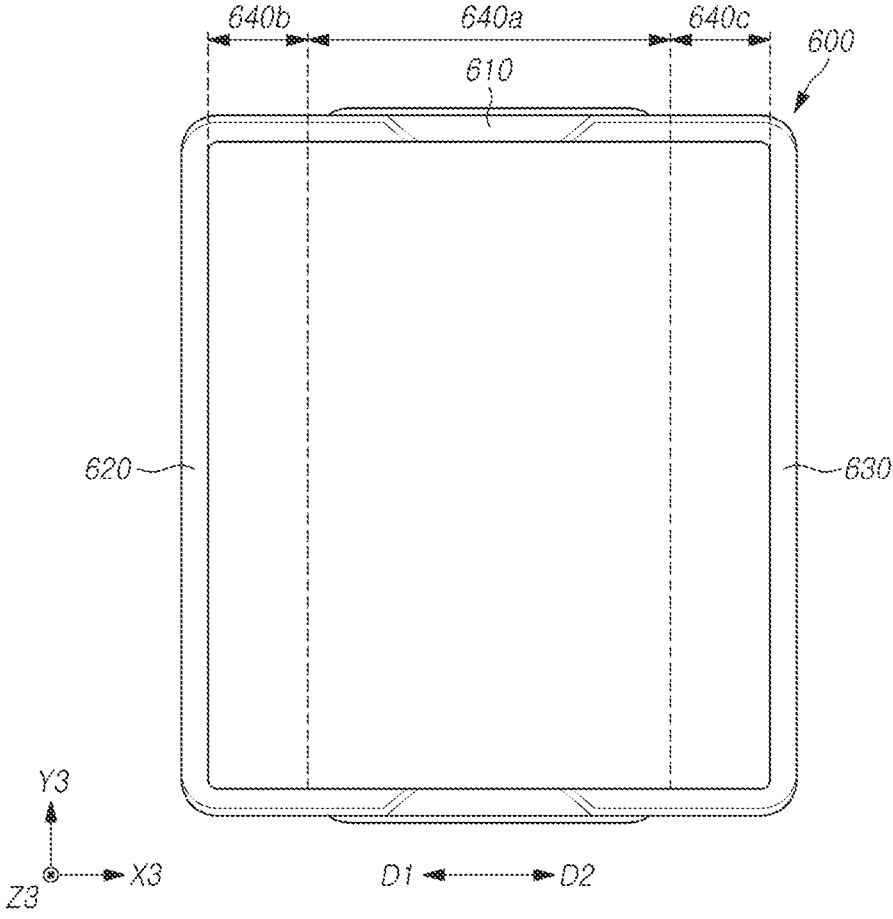
FIG. 21 is a view illustrating an electronic device in an open state according to an embodiment of the disclosure.
Figure 21:
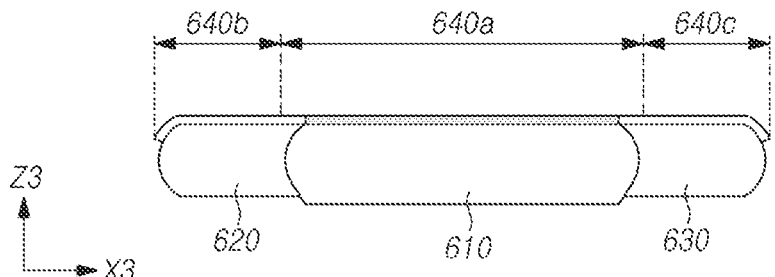

FIG. 20 is a view illustrating an electronic device in a closed state according to an embodiment of the disclosure. FIG. 21 is a view illustrating an electronic device in an open state according to an embodiment of the disclosure.

An electronic device 600 of FIGS. 20 and 21 may be at least partially similar to the electronic device 101 of FIG. 1 and/or may include other embodiments of the electronic device 101. Some of the components of the electronic device 600 illustrated in FIGS. 20 and 21 may be the same as or similar to some of the components of the electronic device 400 illustrated in FIGS. 15A, 15B, 16A, and 16B. Hereinafter, descriptions of duplicate configurations will be omitted.

Referring to FIGS. 20 and 21, an electronic device 600 according to an embodiment may include all or some of a first housing 610, a second housing 620, a third housing 630, and a flexible display 640.

The second housing 620 and the third housing 630 may be symmetrical with respect to the center line of the first housing 610, but are not limited thereto. Here, the center line of the first housing 610 may refer to a virtual line in the Z3-axis direction that divides the first housing in half.

The second housing 620 may be coupled to the first housing 610 to be movable in a designated direction and within a designated distance from the first housing 610. For example, the designated direction may be the first direction D1. At least a portion of the second housing 620 may be received in the first housing 610. The second housing 620 may slide relative to the first housing 610 while at least a portion of the second housing 620 is received in the first housing 610.

The third housing 630 may be coupled to the first housing 610 to be movable in a designated direction and within a designated distance from the first housing 610. For example, the designated direction may be the second direction D2. The second direction D2 may be a direction opposite to the first direction D1, but is not limited thereto. Although not shown, the second direction may be a direction perpendicular to the first direction D1. At least a portion of the third housing 630 may be received in the first housing 610. The third housing 630 may slide relative to the first housing 610 while at least a portion of the third housing 630 is received in the first housing 610.

As the second housing 620 and/or the third housing 630 slides relative to the first housing 610, the flexible display 640 may switch between an open state and a closed state. Here, the open state may refer to a state in which the area in which the flexible display 640 is exposed to the front surface of the electronic device 600 is maximized. Alternatively, the open state may refer to a state in which the second housing 620 and the third housing 630 are maximally slid out from the first housing 610. Here, the closed state may refer to a state in which the area in which the flexible display 640 is exposed to the front surface of the electronic device 600 is minimized. Alternatively, the closed state may refer to a state in which the second housing 620 and the third housing 630 are maximally slid into the first housing 610. The flexible display 640 may have an intermediate state between the open state and the closed state depending on the degree of exposure to the front surface of the electronic device 600.

The flexible display 640 may be received across the first housing 610, the second housing 620, and the third housing. For example, the flexible display 640 may be disposed on the front surface of the electronic device 600 to be supported through at least a portion of the first housing 610, the second housing 620, and the third housing 630.

For example, as the second housing 620 or the third housing 630 slides in a designated direction with respect to the first housing 610, the display area of the flexible display 640 may vary. The second housing 620 and the third housing 630 may operate independently of each other. For example, the second housing 620 may slide relative to the first housing 610 regardless of the movement or position of the third housing 630. For example, the third housing 630 may slide relative to the first housing 610 regardless of the movement or position of the second housing 620. However, the disclosure is not limited thereto, and the second housing 620 and the third housing 630 may operate symmetrically with respect to the center line of the first housing 610.

The flexible display 640 may include a first area 640a and second areas 640b and 640c extending from the first area 640a. The first area 640a may be an area in which a state of being exposed to the front surface of the electronic device 600 is maintained. The first area 640a may be, e.g., a non-flexible area that maintains a flat surface in the flexible display 640. The second areas 640b and 640c may be areas variably exposed to the front surface of the electronic device 600 according to the operating state of the electronic device 600. For example, the second areas 640b and 640c may be flexible areas that may be bent. For example, in the closed state, only the first area 640a of the flexible display 640 may be exposed to the front surface of the electronic device 600. For example, in the open state, all of the first area 640a and the second areas 640b and 640c of the flexible display 640 may be exposed to the front surface of the electronic device 600. The size of the second areas 640b and 640c exposed to the front surface of the electronic device 600 may vary depending on the degree to which the second housing 620 and the third housing 630 slide out with respect to the first housing 610.

The second areas 640b and 640c of the flexible display 640 may include a 2-1$^{th}$ area 640b and a 2-2$^{th}$ area 640c. The 2-1 area 640b and the 2-2 area 640c each may be disposed adjacent to the first area 640a. For example, the 2-1$^{th}$ area 640b may extend from one side (e.g., an edge in the −X3-axis direction) of the first area 640a. For example, the 2-2$^{th}$ area 640c may extend from another side (e.g., an edge in the +X3-axis direction) of the first area 640a.

Figure 22A:
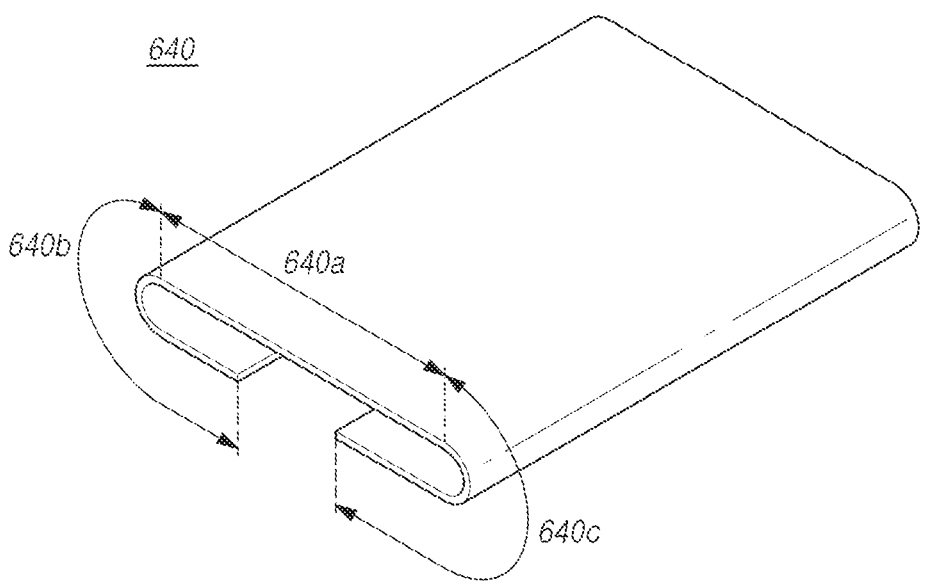
FIGS. 22A and 22B are perspective views illustrating a flexible display according to various embodiments of the disclosure.
Figure 22B:
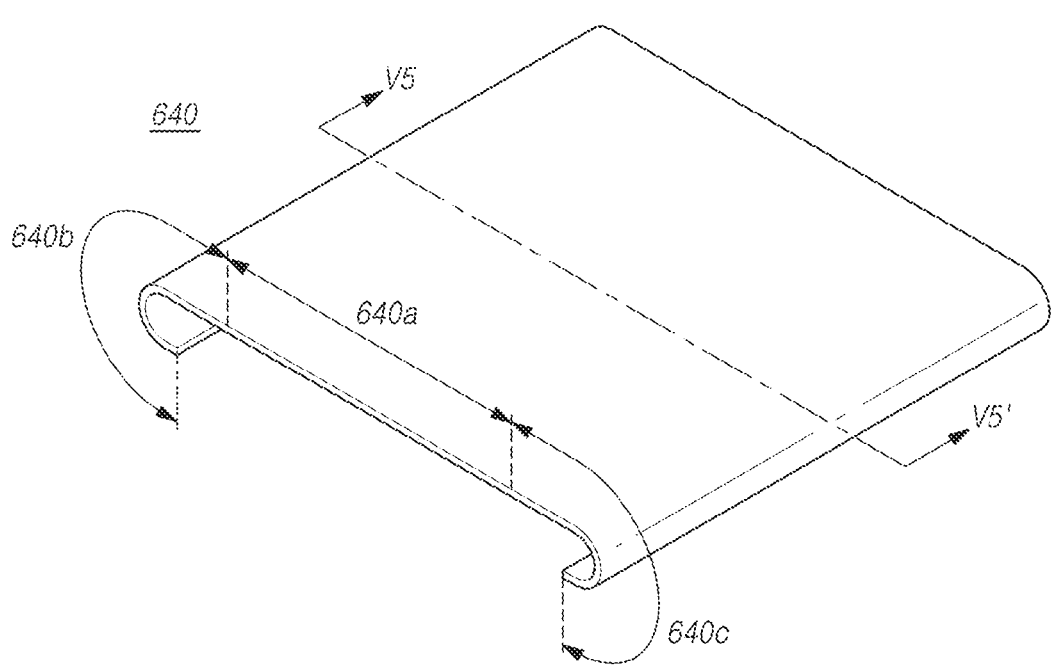

FIGS. 22A and 22B are perspective views illustrating a flexible display according to various embodiments of the disclosure.

Referring to FIGS. 22A and 22B, the flexible display 640 may include a first area 640a and second areas 640b and 640c extending from the first area 640a.

Figure 23:
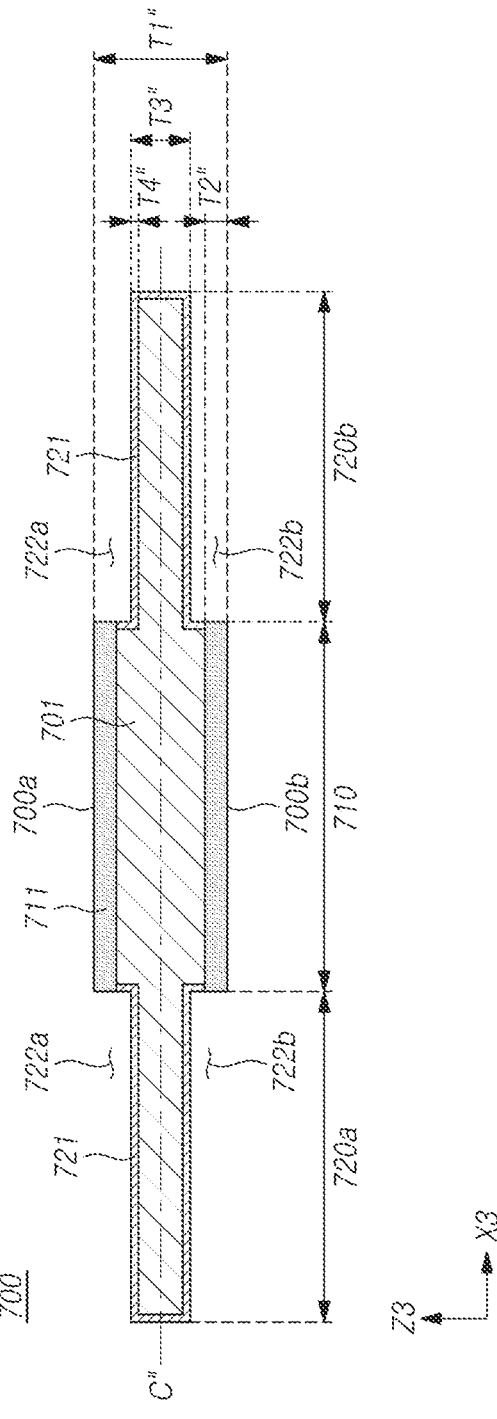
FIG. 23 is a cross-sectional view illustrating a transparent member according to an embodiment of the disclosure.
Figure 24:
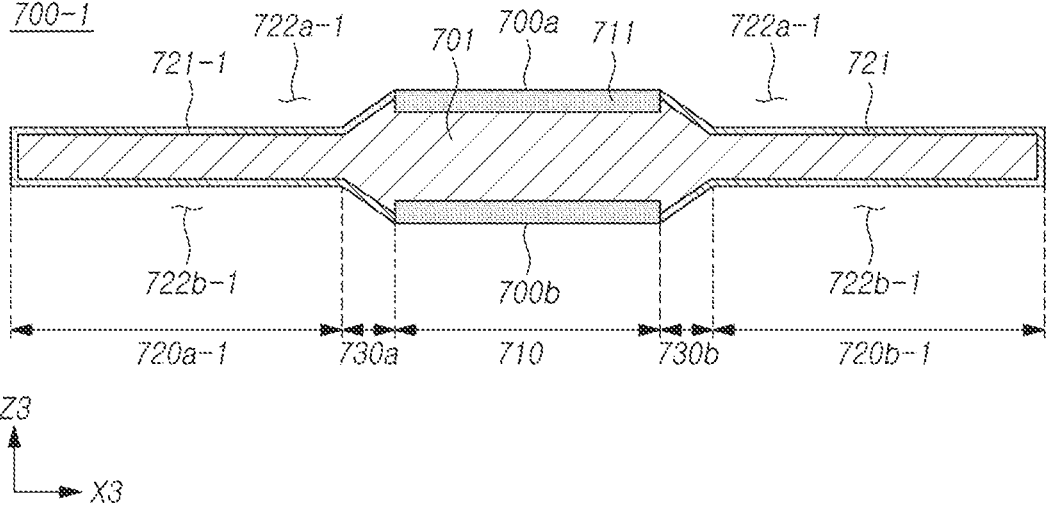
FIG. 24 is a cross-sectional view illustrating a transparent member according to an embodiment of the disclosure.

The flexible display 640 may include a display panel and a transparent member (e.g., a transparent member 700 of FIG. 23 or the transparent member 700-1 of FIG. 24). Like the flexible display 640, the display panel may include a flexible area (e.g., the second areas 630b and 640c) and a non-flexible area (e.g., the first area 640a) adjacent to the flexible area.

The display panel may be provided to display an image. The display panel may be, e.g., a light emitting display panel, but is not limited thereto. The display panel may be, e.g., an organic light emitting display panel or a quantum dot light emitting display panel. The light emitting layer of the organic light emitting display panel may include an organic light emitting material. The light emitting layer of the quantum dot light emitting display panel may include quantum dots and quantum rods. The display panel may be flexible.

The transparent member 700 (or window) may be disposed on, e.g., the display panel. Different components (e.g., input detection units) may be disposed on the transparent member 700 and the display panel. The transparent member 700 may include an optically transparent insulating material.

Accordingly, the image generated by the display panel may be easily transferred to the user through the transparent member 700.

The transparent member 700 may transmit the image from the display panel while mitigating the external impact, thereby preventing the display panel from being damaged or malfunctioning due to the external impact. Here, the external impact is a force applied from the outside, such as pressure and stress, and may refer to a force that causes damage to the display panel.

FIG. 23 is a cross-sectional view illustrating a transparent member according to an embodiment of the disclosure.

Referring to FIG. 23, the transparent member 700 may be a cross section of the transparent member 700 with respect to the cross section taken along line V5-V5' of the flexible display (e.g., the flexible display 640 of FIG. 22B) of FIG. 22B. For convenience of description, the thickness of the transparent member 700 may be somewhat exaggerated in FIG. 23.

The transparent member 700 may include a first glass portion 710 and second glass portions 720a and 720b. The first glass portion 710 may extend from one edge of the second glass portion 720a and 720b. The second glass portion 720a and 720b may be disposed, e.g., between two first glass portions 710. A 2-1th portion 720a may be disposed on one side of one first glass portion 710, and a 2-2th portion 720b may be disposed on the other side of the first glass portion 710.

According to an example, the first glass portion 710 may correspond to a non-flexible area of the flexible display 640 or a display panel (not shown). The first glass portion 710 may have a first thickness T1". Here, the first thickness T1" may refer to a length between an upper surface 700a and a lower surface 700b of the transparent member 700 in the first glass portion 710. Alternatively, the first thickness T1" may refer to the length of the first glass portion 710 in the Z3-axis direction. The first thickness T1" may be larger than, e.g., the second thickness T3". The first thickness T1" may be, e.g., 50 μm to 500 μm, but is not limited thereto.

According to an example, the first glass portion 710 may include a first area 711. The first area 711 may have a first depth T2". Here, the first depth T2" may refer to the length of the chemically reinforced area from the surface of the first glass portion 710. The first depth T2" may be determined, e.g., in the first chemical reinforcement process S20 of FIG. 5. The first depth T2" may have, e.g., a length of 5% to 20% of the first thickness T1", but is not limited thereto.

According to an example, the second glass portion 720a and 720b may correspond to a flexible area of the flexible display 640 or a display panel (not shown). The second glass portion 720a and 720b may have a second thickness T3". Here, the second thickness T3" may refer to a length between the upper surface 700a and the lower surface 700b of the transparent member 700 in the second glass portion 720a and 720b. Alternatively, the second thickness T3" may refer to the length of the second glass portion 720a and 720b in the Z3-axis direction. The second thickness T3" may be smaller than, e.g., the first thickness T1". The second thickness T3" may be, e.g., 30 μm to 50 μm, but is not limited thereto.

According to an example, the second glass portion 720a and 720b may include a second area 721. The second area 721 may have a second depth T4" different from the first depth T2". Here, the second depth T4" may refer to the length of the chemically reinforced area from the surface of the second glass portion 720a and 720b. The second depth T4" may be determined, e.g., in the second chemical reinforcement process S50 of FIG. 5. The second depth T4" may have, e.g., a length of 5% to 20% of the second thickness T3", but is not limited thereto.

According to an example, the second glass portion 720a and 720b may include recesses 722a and 722b formed in the upper side and the lower side. The recesses 722a and 722b may include, e.g., a first recess 722a in the second glass portion 720a and 720b toward the upper surface 700a of the transparent member 700 and a second recess 722b in the second glass portion 720a and 720b toward the lower surface 700b of the transparent member 700. According to an embodiment of the disclosure, internal stress of the first glass portion 710 may be dispersed by forming the recesses 722a and 722b in both the upper and lower sides of the second glass portion 720a and 720b.

According to an example, in the unfolding state of the transparent member 700, the upper surface of the first glass portion 710 and the upper surface of the second glass portion 720a and 720b may be positioned on different planes. Due to the first recess 722a formed in the upper side of the second glass portion 720a and 720b, the upper surface of the second glass portion 720a and 720b may not be included in the plane including the upper surface of the first glass portion 710. For example, the upper surface of the second glass portion 720a and 720b may not be included in the plane including the upper surface of the first glass portion 710. In other words, for example, the upper surface of the second glass portion 720a and 720b may not be on the same plane as the upper surface of the first glass portion 710. Here, the upper surface of the first glass portion 710 may be the upper surface 700a of the transparent member 700. Here, the unfolding state of the transparent member 700 may refer to a state in which no bend exists in all areas of the transparent member 700.

According to an example, in the unfolding state of the transparent member 700, the lower surface of the first glass portion 710 and the lower surface of the second glass portion 720a and 720b may be positioned on different planes. Due to the second recess 722b formed in the lower side of the second glass portion 720a and 720b, the lower surface of the second glass portion 720a and 720b may not be included in the plane including the lower surface of the first glass portion 710. For example, the lower surface of the second glass portion 720a and 720b may not be included in the plane including the lower surface of the first glass portion 710. In other words, for example, the lower surface of the second glass portion 720a and 720b may not be on the same plane as the lower surface of the first glass portion 510. Here, the lower surface of the first glass portion 710 may be the lower surface 700b of the transparent member 700.

According to an example, the first depth T2" and the second depth T4" may be different in size. For example, the first depth T2" may be greater than the second depth T4". According to an example, the ratio of the first depth T2" to the first thickness T1" may be substantially the same as the ratio of the second depth T4" to the second thickness T3". For example, when the first thickness T1" is 50 μm, and the second thickness T3" is 30 μm, the first depth T2" may be 7.5 μm, and the second depth may be 4.5 μm. By allowing the ratio of the first depth T2" to the first thickness T1" in the first glass portion 710 to be substantially the same as the ratio of the second depth T4" to the second thickness T3" in the second glass portion 720a and 720b, the difference in expansion rate between the first glass portion 710 and the second glass portion 720a and 720b may be minimized. By minimizing the difference in the expansion rate between the first glass portion 710 and the second glass portion 720a and 720b having the different thicknesses, it is possible to prevent warpage that may occur in the transparent member 700 (especially the second glass portion 720a and 720b).

According to an example, the second glass portion 720a and 720b may be formed to be horizontally symmetrical with respect to a virtual plane C" that is perpendicular to the thickness direction of the transparent member 700 and passes through the transparent member. The virtual plane C" may be, e.g., a plane perpendicular to the thickness direction of the transparent member 700 and dividing the average thickness of the transparent member 700 by half, but is not limited thereto. The virtual plane C" may be, e.g., a plane perpendicular to the thickness direction of the transparent member 700 and dividing the average thickness of the first glass portion 710 by half, but is not limited thereto. Here, the thickness direction may refer to the Z3-axis direction. Alternatively, the thickness direction may refer to a direction from the lower surface 700b of the transparent member 700 to the upper surface 700a of the transparent member 700. By forming the second glass portion 720a and 720b horizontally symmetrically with respect to the virtual plane C", stress may be evenly dispersed to the first glass portions 710 positioned on two opposite sides of the second glass portion 720a and 720b.

According to an example, the boundary between the first glass portion 710 and the second glass portion 720a and 720b may have a surface/plane level difference (e.g., step or bump).

According to an example, although not illustrated, the transparent member 700 may further include a refractive index matching portion. For example, the refractive index matching portion may be disposed around at least one of the first glass portion 710 or the second glass portion 720a and 720b to match the refractive indexes of light formed by the difference in thickness between the first glass portion 710 and the second glass portion 720a and 720b. The refractive index matching portion may be formed of, e.g., a transparent material. The refractive index matching portion may be formed of, e.g., a urethane-based, acrylic-based, or silicon-based material. The refractive index matching portion may have substantially the same refractive index as that of the base layer 701.

FIG. 24 is a cross-sectional view illustrating a transparent member according to an embodiment of the disclosure.

Referring to FIG. 24, the transparent member 700-1 may be a cross section of the transparent member 700-1 with respect to the cross section taken along line V5-V5' of the flexible display (e.g., the flexible display 640 of FIG. 22B) of FIG. 22B. In FIG. 24, the thickness of the first glass portion 710, the first depth of the first area 711, the thickness of the second glass portion 720a-1 and 720b-1, and the second depth of the second area 721-1 have been described with reference to FIG. 23, and are not described below. A detailed description of the components described with reference to FIG. 23 among the components of FIG. 24 will be omitted. For convenience of description, the thickness of the transparent member 700-1 may be somewhat exaggerated in FIG. 24.

The transparent member 700-1 according to an embodiment is entirely the same as or similar to the transparent member 700 of FIG. 23, but is different in that the transparent member 700-1 further includes a third portion 730a and 730b. The following description focuses primarily on the differences.

According to an example, the third portion 730a and 730b may be disposed between the first glass portion 710 and the second glass portion 720a-1 and 720b-1. The third portion 730a and 730b may be disposed so that one side contacts an edge of the first glass portion 710 and the other side contacts an edge of the second glass portion 720a-1 and 720b-1. The third portion 730a and 730b may have an inclined/declined slope. The third portion 730a and 730b may be formed to be inclined downward from, e.g., the first glass portion 710 toward the second glass portion 720a-1 and 720b-1. The third portion 730a and 730b may be formed to be inclined to connect, e.g., the first glass portion 710 and the second glass portion 720a-1 and 720b-1. The slope of the third portion 730a and 730b may be a flat slope, but is not limited thereto, and may be a curved slope.

According to an example, the third portion 730a and 730b may be formed by the etching process S30 of FIG. 5. In the etching process S30, the upper recess 722a-1 and the lower recess 722b-1 may be formed around the second glass portion 720a-1 and 720b-1 and the third portion 730a and 730b. Accordingly, the chemical enhancement depth of the third portion 730a and 730b may be the same as or similar to the chemical enhancement depth of the second glass portion 720a-1 and 720b-1.

By adding the third portion 730a and 730b to the boundary between the first glass portion 710 and the second glass portion 720a-1 and 720b-1 of the transparent member 700-1, the thickness of the base layer 701 may be gradually changed to enhance visibility of the transparent member 700-1.

Figure 25:
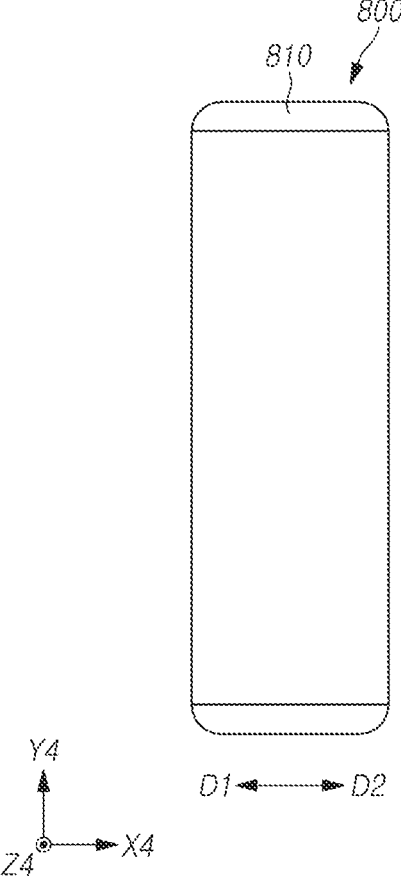
FIG. 25 is a view illustrating an electronic device in a closed state according to an embodiment of the disclosure.
Figure 25:
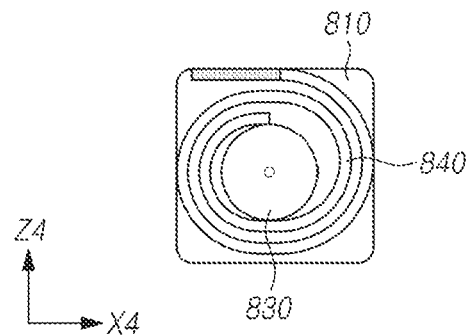
Figure 26:
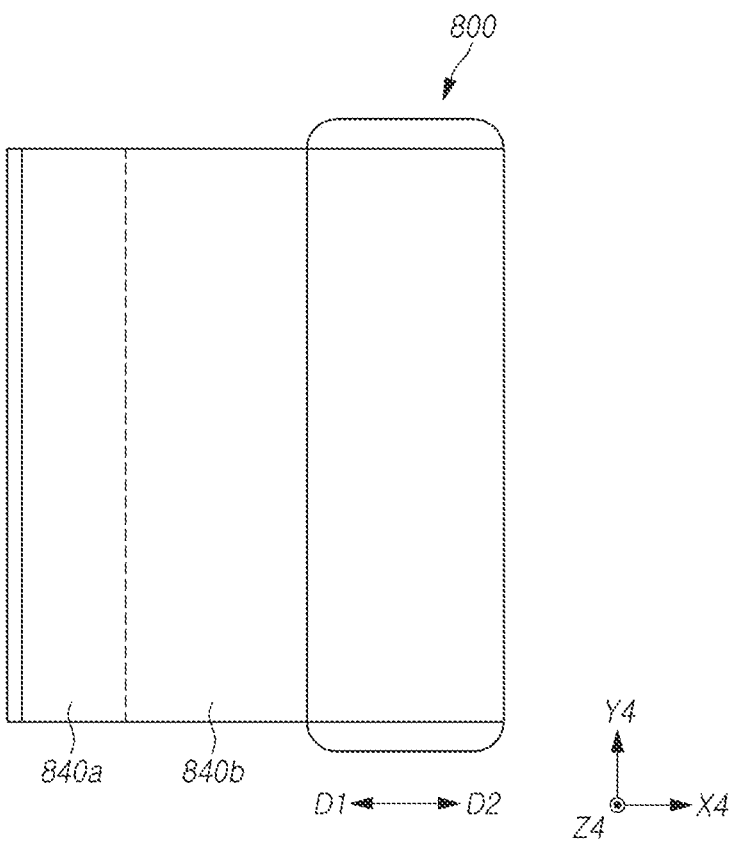
FIG. 26 is a view illustrating an electronic device in an open state according to an embodiment of the disclosure.
Figure 26:
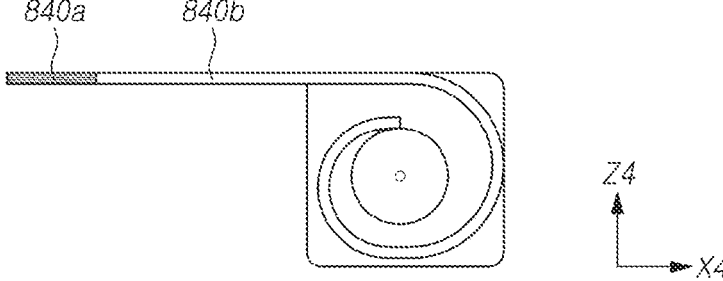

FIG. 25 is a view illustrating an electronic device in a closed state according to an embodiment of the disclosure. FIG. 26 is a view illustrating an electronic device in an open state according to an embodiment of the disclosure.

An electronic device 800 of FIGS. 25 and 26 may be at least partially similar to the electronic device 101 of FIG. 1 or may include other embodiments of the electronic device 101.

Referring to FIGS. 25 and 26, an electronic device 800 according to an embodiment may include a housing 810, a flexible display 840, and a roller member 830. For example, at least a portion of the flexible display 840 and the roller member 830 may be received in the housing 810. The electronic device 800 may be disposed inside the housing 810 in a state in which the flexible display 840 is rolled around the roller member 830. The flexible display 840 may have a structure that provides a display area in which a screen is displayed by being pulled out of the housing 810 and unfolded by the user's manipulation or a mechanical operation of the roller member 830.

An opening (not shown) may be formed on one side of the housing 810 to allow the flexible display 840 to move. The flexible display 840 may be exposed by moving to the outside of the housing 810 through an opening or may be received in the housing 810. The roller member 830 may be rotatably coupled to the housing 810. The roller member 830 may be surrounded by at least a portion of the flexible display 840. As the roller member 830 rotates relative to the housing 810 inside the housing 810, the flexible display 840 may move outward or inward of the housing 810.

The flexible display 840 may be wound or wrapped around the roller member 830. One end of the flexible display 840 may be connected to the roller member 830. The flexible display 840 may be directly connected to, e.g., the roller member 830, or may be indirectly connected to the roller member 830 through a medium (not shown) for transferring a signal.

The flexible display 840 may include a first area 840a and a second area 840b extending from the first area 840a. The first area 840a may be, e.g., a non-flexible area that maintains a flat surface in the flexible display 840. The second area 840b may be, e.g., a flexible area that may be bent. An area of the second area 840b exposed to the outside may vary as the roller member 830 rotates.

The flexible display 840 may switch between an open state and a closed state as the roller member 830 rotates. Here, the open state may refer to a state in which an area in which the flexible display 840 rolled or wrapped around the roller member 830 is exposed to the outside of the housing 810 is maximized by rotation of the roller member 830. Here, the closed state may refer to a state in which the flexible display 840 is maximally rolled around the roller member 830. The flexible display 840 may have an intermediate state between the open state and the closed state depending on the degree to which the flexible display 840 is exposed to the outside of the housing 810.

In the closed state of the flexible display 840, the first area 840a may be exposed to the outside. However, the disclosure is not limited thereto, and all areas of the flexible display 840 may not be exposed to the outside in the closed state of the flexible display 840.

Figure 27:
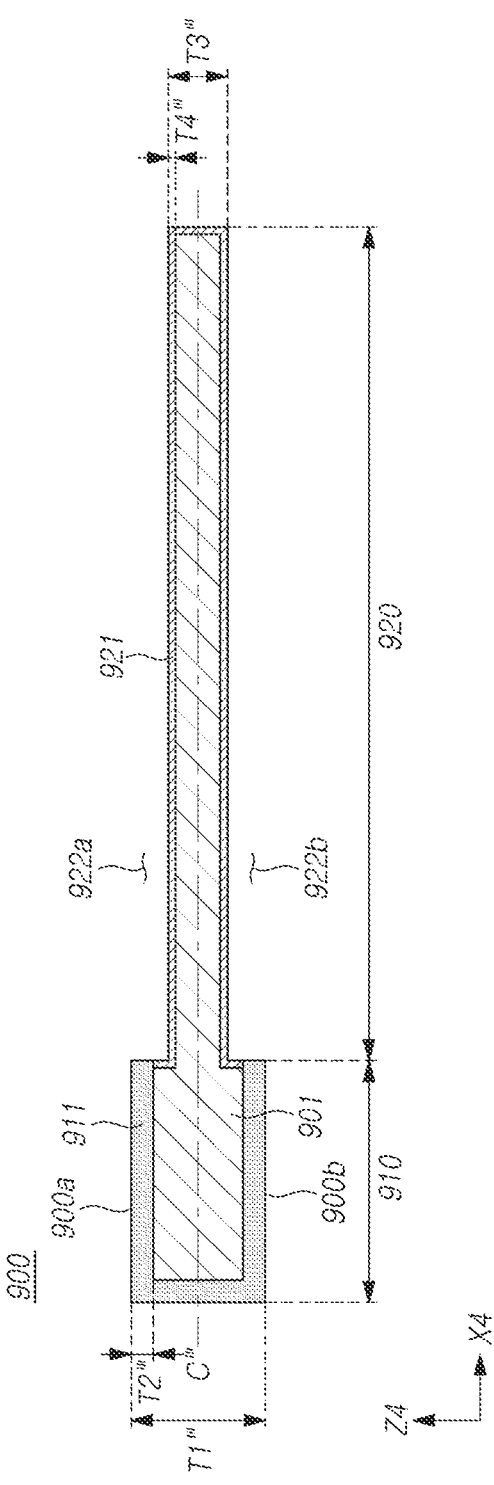
FIG. 27 is a cross-sectional view illustrating a transparent member according to an embodiment of the disclosure.
Figure 28:
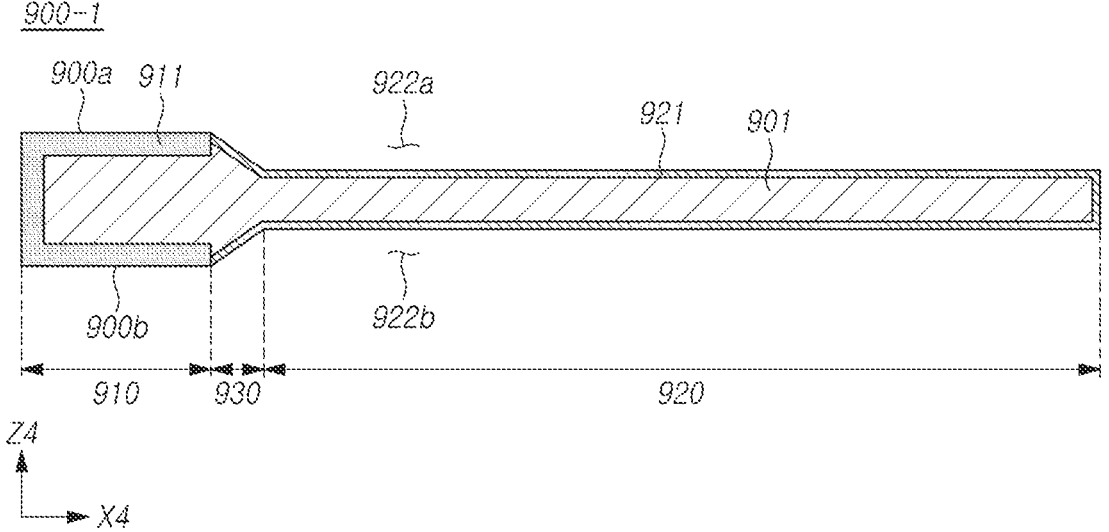
FIG. 28 is a cross-sectional view illustrating a transparent member according to an embodiment of the disclosure.

The flexible display 840 may include a display panel and a transparent member (e.g., a transparent member 900 of FIG. 27 or the transparent member 900-1 of FIG. 28).

The display panel may be provided to display an image. The display panel may be, e.g., a light emitting display panel, but is not limited thereto. The display panel may be, e.g., an organic light emitting display panel or a quantum dot light emitting display panel. The light emitting layer of the organic light emitting display panel may include an organic light emitting material. The light emitting layer of the quantum dot light emitting display panel may include quantum dots and quantum rods. The display panel may be flexible.

The transparent member 900 (or window) may be disposed on, e.g., the display panel. Different components (e.g., input detection units) may be disposed on the transparent member 900 and the display panel. The transparent member 900 may include an optically transparent insulating material. Accordingly, the image generated by the display panel may be easily transferred to the user through the transparent member 900.

The transparent member 900 may transmit the image from the display panel while mitigating the external impact, thereby preventing the display panel from being damaged or malfunctioning due to the external impact. Here, the external impact is a force applied from the outside, such as pressure and stress, and may refer to a force that causes damage to the display panel.

FIG. 27 is a cross-sectional view illustrating a transparent member according to an embodiment of the disclosure.

For convenience of description, the thickness of the transparent member 900 may be somewhat exaggerated in FIG. 27.

Referring to FIG. 27, the transparent member 900 may include a first glass portion 910 and a second glass portion 920. The first glass portion 910 may extend from one edge of the second glass portion 920.

According to an example, the first glass portion 910 may correspond to a non-flexible area of the flexible display 840 or a display panel (not shown). The first glass portion 910 may have a first thickness T1'''. Here, the first thickness T1''' may refer to a length between an upper surface 900a and a lower surface 900b of the transparent member 900 in the first glass portion 910. Alternatively, the first thickness T1''' may refer to the length of the first glass portion 910 in the Z4-axis direction. The first thickness T1''' may be larger than, e.g., the second thickness T3'''. The first thickness T1''' may be, e.g., 50 μm to 500 μm, but is not limited thereto.

According to an example, the first glass portion 910 may include a first area 911. The first area 911 may have a first depth T2'''. Here, the first depth T2''' may refer to the length of the chemically reinforced area from the surface of the first glass portion 910. The first depth T2''' may be determined, e.g., in the first chemical reinforcement operation S20 of FIG. 5. The first depth T2''' may have, e.g., a length of 5% to 20% of the first thickness T1''', but is not limited thereto.

According to an example, the second glass portion 920 may correspond to a flexible area of the flexible display 840 or a display panel (not shown). The second glass portion 920 may have a second thickness T1'''. Here, the second thickness T1''' may refer to a length between the upper surface 900a and the lower surface 900b of the transparent member 900 in the second glass portion 920. Alternatively, the second thickness T1''' may refer to the length of the second glass portion 920 in the Z4-axis direction. The second thickness T3''' may be smaller than, e.g., the first thickness T1'''. The second thickness T1''' may be, e.g., 30 μm to 60 μm, but is not limited thereto.

According to an example, the second glass portion 920 may include a second area 921. The second area 921 may have a second depth T4''' different from the first depth T2'''. Here, the second depth T4''' may refer to the length of the chemically reinforced area from the surface of the second glass portion 920. The second depth T4''' may be determined, e.g., in the second chemical reinforcement process S50 of FIG. 5. The second depth T4''' may have, e.g., a length of 5% to 20% of the second thickness T3''', but is not limited thereto.

According to an example, the second glass portion 920 may include recesses 922a and 922b formed in the upper side and the lower side. The recesses 922a and 922b may include, e.g., a first recess 922a in the second glass portion 920 toward the upper surface 900a of the transparent member 900 and a second recess 922b in the second glass portion 920 toward the lower surface 900b of the transparent member 900. In the second glass portion 922, recesses 922a and 922b may be formed in the upper and lower sides, thereby forming a top-bottom notch structure. According to an embodiment of the disclosure, stress may be dispersed by forming the recesses 922a and 922b in both the upper and lower sides of the second glass portion 920.

According to an example, in the unfolding state of the transparent member 900, the upper surface of the first glass portion 910 and the upper surface of the second glass portion 920 may be positioned on different planes. Due to the first recess 922a formed in the upper side of the second glass portion 920, the upper surface of the second glass portion 920 may not be included in the plane including the upper surface of the first glass portion 910. For example, the upper surface of the second glass portion 920 may not be included in the plane including the upper surface of the first glass portion 910. In other words, for example, the upper surface of the second glass portion 920 may not be on the same plane as the upper surface of the first glass portion 910. Here, the upper surface of the first glass portion 910 may be the upper surface 900a of the transparent member 900. Here, the unfolding state of the transparent member 900 may refer to a state in which no bend exists in all areas of the transparent member 900.

According to an example, in the unfolding state of the transparent member 900, the lower surface of the first glass portion 910 and the lower surface of the second glass portion 920 may be positioned on different planes. Due to the second recess 922b formed in the lower side of the second glass portion 920, the lower surface of the second glass portion 920 may not be included in the plane including the lower surface of the first glass portion 910. For example, the lower surface of the second glass portion 920 may not be included in the plane including the lower surface of the first glass portion 910. In other words, for example, the upper surface of the second glass portion 920 may not be on the same plane as the upper surface of the first glass portion 910. Here, the lower surface of the first glass portion 910 may be the lower surface 900b of the transparent member 900.

According to an example, the first depth T2''' and the second depth T4''' may be different in size. For example, the first depth T2''' may be greater than the second depth T4'''. According to an example, the ratio of the first depth T2''' to the first thickness T1''' may be substantially the same as the ratio of the second depth T4''' to the second thickness T3'''. For example, when the first thickness T1''' is 50 μm, and the second thickness T3''' is 30 μm, the first depth T2''' may be 7.5 μm, and the second depth may be 4.5 μm. By allowing the ratio of the first depth T2''' to the first thickness T1''' in the first glass portion 910 to be substantially the same as the ratio of the second depth T4''' to the second thickness T3''' in the second glass portion 920, the difference in expansion rate between the first glass portion 910 and the second glass portion 920 may be minimized. By minimizing the difference in the expansion rate between the first glass portion 910 and the second glass portion 920 having the different thicknesses, it is possible to prevent warpage that may occur in the transparent member 900 (especially the second glass portion 920).

According to an example, the second glass portion 920 may be formed to be horizontally symmetrical with respect to a virtual plane C''' that is perpendicular to the thickness direction of the transparent member 900 and passes through the transparent member. The virtual plane C''' may be, e.g., a plane perpendicular to the thickness direction of the transparent member 900 and dividing the average thickness of the transparent member 900 by half, but is not limited thereto. The virtual plane C''' may be, e.g., a plane perpendicular to the thickness direction of the transparent member 900 and dividing the average thickness of the first glass portion 910 by half, but is not limited thereto. Here, the thickness direction may refer to the Z4-axis direction. Alternatively, the thickness direction may refer to a direction from the lower surface 900b of the transparent member 900 to the upper surface 900a of the transparent member 900. By forming the second glass portion 920 horizontally symmetrically with respect to the virtual plane C''', stress may be evenly dispersed to the first glass portions 910 positioned on two opposite sides of the second glass portion 920.

According to an example, the boundary between the first glass portion 910 and the second glass portion 920 may have a surface/plane level difference (e.g., step or bump).

According to an example, although not illustrated, the transparent member 900 may further include a refractive index matching portion. For example, the refractive index matching portion may be disposed around at least one of the first glass portion 910 or the second glass portion 920 to match the refractive indexes of light formed by the difference in thickness between the first glass portion 910 and the second glass portion 920. The refractive index matching portion may be formed of, e.g., a transparent material. The refractive index matching portion may be formed of, e.g., a urethane-based, acrylic-based, or silicon-based material. The refractive index matching portion may have substantially the same refractive index as that of a base layer 901.

FIG. 28 is a cross-sectional view illustrating a transparent member according to an embodiment of the disclosure.

Referring to FIG. 28, the thickness of the first glass portion 910, the first depth of the first area 911, the thickness of the second glass portion 920-1, and the second depth of the second area 921-1 have been described with reference to FIG. 27, and are not described below. A detailed description of the components described with reference to FIG. 27 among the components of FIG. 28 will be omitted. For convenience of description, the thickness of the transparent member 900-1 may be somewhat exaggerated in FIG. 28.

The transparent member 900-1 according to an embodiment is entirely the same as or similar to the transparent member 900 of FIG. 27, but is different in that the transparent member 300-1 further includes a third portion 930. The following description focuses primarily on the differences.

According to an example, the third portion 930 may be disposed between the first glass portion 910 and the second glass portion 920-1. The third portion 930 may be disposed so that one side contacts an edge of the first glass portion 910 and the other side contacts an edge of the second glass portion 920-1. The third portion 930 may have an inclined/declined slope. The third portion 930 may be formed to be inclined downward from, e.g., the first glass portion 910 toward the second glass portion 920-1. The third portion 930 may be formed to be inclined to connect, e.g., the first glass portion 910 and the second glass portion 920-1. The slope of the third portion 930 may be a flat slope, but is not limited thereto, and may be a curved slope.

According to an example, the third portion 930 may be formed by the etching process S30 of FIG. 5. In the etching process S30, the upper recess 922*a*-1 and the lower recess 922*b*-1 may be formed around the second glass portion 920-1 and the third portion 930. Accordingly, the chemical enhancement depth of the third portion 930 may be the same as or similar to the chemical enhancement depth of the second glass portion 920-1.

By adding the third portion 930 to the boundary between the first glass portion 910 and the second glass portion 920-1 of the transparent member 900-1, the thickness of the base layer 901 may be gradually changed to enhance visibility of the transparent member 900-1.

FIGS. 29 and 30 are tables illustrating a difference in expansion length of a transparent member with different thicknesses according to a chemical reinforcement depth proportion according to various embodiments of the disclosure.

FIG. 29 is an experimental example for describing an expansion length difference (mm) that occurs when all areas of a transparent member having differential thicknesses are formed to have the same reinforcement depth, according to an embodiment of the disclosure. Hereinafter, in the description of FIG. 29, the first glass portion of the transparent member may refer to a portion corresponding to the non-flexible area of the flexible display, and the second glass portion of the transparent member may refer to a portion corresponding to the flexible area of the flexible display.

Referring to FIG. 29, when all surfaces of the transparent member having the differential thickness are reinforced based on the reinforcement depth proportion of the first glass portion, there may be a difference in expansion length between the first glass portion and the second glass portion.

For example, if the reinforcement depths of the first glass portion and the second glass portions are formed to be the same as, e.g., 5 μm when the thickness of the first glass portion is 50 μm, and the thickness of the second glass portion is 30 μm, the reinforcement depth proportion of the first glass portion may be 10.0%, and the reinforcement depth proportion may be 16.7%. As the reinforcement depth proportions differ, a difference may occur in the expansion rate (0.09%) of the first glass portion and the expansion rate (0.14%) of the second glass portion. Depending on the difference in expansion rate, the difference in expansion length between the first glass portion and the second glass portion may be 0.06 mm, which may result in warpage.

For example, if the reinforcement depths of the first glass portion and the second glass portions are formed to be the same as, e.g., 8 μm when the thickness of the first glass portion is 80 μm, and the thickness of the second glass portion is 40 μm, the reinforcement depth proportion of the first glass portion may be 10.0%, and the reinforcement depth proportion may be 20%. As the reinforcement depth proportions differ, a difference may occur in the expansion rate (0.09%) of the first glass portion and the expansion rate (0.17%) of the second glass portion. Depending on the difference in expansion rate, the difference in expansion length between the first glass portion and the second glass portion may be 0.09 mm, which may result in warpage.

Referring to FIG. 29, when all surfaces of the transparent member having the differential thickness are reinforced based on the reinforcement depth proportion of the second glass portion, there may be a difference in expansion length between the first glass portion and the second glass portion.

For example, if the reinforcement depths of the first glass portion and the second glass portions are formed to be the same as, e.g., 4.5 μm when the thickness of the first glass portion is 50 μm, and the thickness of the second glass portion is 30 μm, the reinforcement depth proportion of the first glass portion may be 9.0%, and the reinforcement depth proportion may be 15%. As the reinforcement depth proportions differ, a difference may occur in the expansion rate (0.08%) of the first glass portion and the expansion rate (0.13%) of the second glass portion. Depending on the difference in expansion rate, the difference in expansion length between the first glass portion and the second glass portion may be 0.05 mm, which may result in warpage.

For example, if the reinforcement depths of the first glass portion and the second glass portions are formed to be the same as, e.g., 6 μm when the thickness of the first glass portion is 80 μm, and the thickness of the second glass portion is 40 μm, the reinforcement depth proportion of the first glass portion may be 7.5%, and the reinforcement depth proportion may be 15%. As the reinforcement depth proportions differ, a difference may occur in the expansion rate (0.06%) of the first glass portion and the expansion rate (0.13%) of the second glass portion. Depending on the difference in expansion rate, the difference in expansion length between the first glass portion and the second glass portion may be 0.06 mm, which may result in warpage.

FIG. 30 is an experimental example for describing that there is no difference in expansion length between the first glass portion and the second glass portion when the first depth and the second depth are formed to have the same reinforcement depth proportion according to an embodiment of the disclosure. The table of FIG. 30 is illustrative and does not limit the scope of the disclosure.

Referring to FIG. 30, according to various embodiments of the disclosure, it is possible to minimize the difference in expansion length by matching the reinforcement depth proportions by making the first depth T2, T2', T2", or T2'" of the first area 311, 511, 711, or 911 different from the second depth T4, T4', T4", or T4'" of the second area 321, 521, 721, and 921 regardless of the first thickness T1, T1', T1", or T1'"

of the first glass portion 310, 510, 710, or 910 and the second thickness T3, T3', T2", or T3'" of the second glass portion 320, 520, 720, or 920.

For example, the transparent member 300, 500, 700, or 900 according to an embodiment may be implemented so that the reinforcement depth proportions of all areas of the transparent member 300, 500, 700, or 900 are 15% regardless of the first thickness T1, T1', T1", and T1'" of the first glass portion 310, 510, 710, or 910 and the second thickness T3, T3', T3", or T3'" of the second glass portion 320, 520, 720, or 920. It is possible to minimize the difference in expansion length by matching the reinforcement depth proportion in the first glass portion 310, 510, 710, or 910 with the reinforcement depth proportion in the second glass portion 320, 520, 720, or 920. As a result, it is possible to prevent the transparent member 300, 500, 700, or 900 having different thicknesses from being twisted.

The flexible transparent member 300, 500, 700, or 900 according to an embodiment may include a first glass portion 310, 510, 710, or 910 having a first thickness T1, T1', T1", or T1'", a second glass portion 320, 520, 720, or 920 having a second thickness T3, T3', T3", or T3'" thinner than the first thickness T1, T1', T1", or T1'", and a resin portion disposed on the second glass portion 320, 520, 720, or 920. An upper surface of the second glass portion may be recessed in a downward direction with respect to an upper surface of the first glass portion. A lower surface of the second glass portion may be recessed in an upward direction with respect to a lower surface of the first glass portion. The resin portion may be filled in the recessed region.

According to an embodiment of the disclosure, the first glass portion 310, 510, 710, or 910 and the second glass portion 320, 520, 720, or 920 may be formed to be horizontally symmetrical.

According to an embodiment of the disclosure, the first glass portion 310, 510, 710, or 910 may include a first area 311, 511, 711, or 911 chemically reinforced inward from a surface by a first depth T2, T2', T2", or T2'". The second glass portion 320, 520, 720, or 920 may include a second area 321, 521, 721, or 921 chemically reinforced inward from a surface by a second depth T4, T4', T4", or T4'" different from the first depth T2, T2', T2", or T2'".

According to an embodiment of the disclosure, a ratio of the first depth T2, T2', T2", or T2'" to the first thickness T1, T1', T1", or T1'" may be substantially the same as a ratio of the second enhancement depth T4, T4', T4", or T4'" to the second thickness T3, T3', T3", or T3'".

According to an embodiment of the disclosure, a flexible display may comprise a display panel and a transparent member 300, 500, 700, or 900 disposed on the display panel. The transparent member 300, 500, 700, or 900 may include a first glass portion 310, 510, 710, or 910 having a first thickness T1, T1', T1", or T1'" and a second glass portion 320, 520, 720, or 920 having a second thickness T3, T3', T3", or T3'" smaller than the first thickness T1, T1', T1", or T1'". An upper surface of the second glass portion 320, 520, 720, or 920 may be recessed in a direction toward the display panel with respect to an upper surface of the first glass portion 310, 510, 710, or 910. A lower surface of the second glass portion 320, 520, 720, or 920 may be recessed in an opposite direction to the display panel with respect to a lower surface of the first glass portion 310, 510, 710, or 910.

According to an embodiment of the disclosure, the first glass portion 310, 510, 710, or 910 may include a first area 311, 511, 711, or 911 chemically reinforced inward from a surface by a first depth T2, T2', T2", or T2'". The second glass portion 320, 520, 720, or 920 may include a second area 321, 521, 721, or 921 chemically reinforced inward from a surface by a second depth T4, T4', T4", or T4'".

According to an embodiment of the disclosure, the first depth T2, T2', T2", or T2'" may be longer than the second depth T4, T4', T4", or T4'".

According to an embodiment of the disclosure, a ratio of the first depth T2, T2', T2", or T2'" to the first thickness T1, T1', T1", or T1'" may be substantially same as a ratio of the second depth T4, T4', T4", or T4'" to the second thickness T3, T3', T3", or T3'".

According to an embodiment of the disclosure, the first depth T2, T2', T2", or T2'" may have a length of 5% to 20% of the first thickness T1, T1', T1", or T1'". The second depth T4, T4', T4", or T4'" may have a length of 5% to 20% of the second thickness T3, T3', T3", or T3'".

According to an embodiment of the disclosure, the second glass portion 320, 520, 720, or 920 may have a stepped shape with respect to the first glass portion 310, 510, 710, or 910.

According to an embodiment of the disclosure, the transparent member 300, 500, 700, or 900 may include a third glass portion 330, 530, 730, or 930 formed to be sloped to connect the first glass portion 310, 510, 710, or 910 and the second glass portion 320, 520, 720, or 920.

According to an embodiment of the disclosure, the second glass portion 320, 520, 720, or 920 may have a penetrated portion.

According to an embodiment of the disclosure, at least one of an upper surface or a lower surface of the second glass portion 320, 520, 720, or 920 may have a pattern in which a concave portion 324 or 326 and a convex portion 323 or 325 are alternately disposed.

According to an embodiment of the disclosure, a boundary between the concave portion 324 and the convex portion 323 may be formed by a vertical step.

According to an embodiment of the disclosure, alternating pattern of the concave portion 326 and the convex portion 325 has a wave-shaped cross section.

According to an embodiment of the disclosure, the second glass portion 320, 520, 720 or 920 may be formed to be symmetrical with respect to a virtual plane that divides a thickness of the transparent member 300, 500, 700 or 900 in half.

According to an embodiment of the disclosure, the first depth T2, T2', T2", or T2'" may have a length of 5% to 20% of the first thickness T1, T1', T1", or T1'". The second depth T4, T4', T4", or T4'" may have a length of 5% to 20% of the second thickness T3, T3', T3", or T3'".

An electronic device according to an embodiment of the disclosure may comprise a housing including a first housing and a second housing, a hinge module connected with the first housing and the second housing, and a flexible display at least partially received in the first housing and the second housing. The flexible display may include a display panel and a transparent member 300, 500, 700, or 900 arranged on the display panel. The transparent member 300, 500, 700, or 900 may include a first glass portion 310, 510, 710, or 910 having a first thickness T1, T1', T1", or T1'" and a second glass portion 320, 520, 720, or 920 having a second thickness T3, T3', T3", or T3'" thinner than the first thickness T1, T1', T1", or T1'". An upper surface of the second glass portion 320, 520, 720, or 920 may be recessed in a direction toward the display panel with respect to an upper surface of the first glass portion 310, 510, 710, or 910. A lower surface of the second glass portion 320, 520, 720, or 920 may be recessed in an opposite direction to the display panel with respect to a lower surface of the first glass portion 310, 510, 710, or 910.

According to an embodiment of the disclosure, the second glass portion 320, 520, 720, or 920 may be formed to be symmetrical with respect to a virtual plane that divides a thickness of the transparent member 300, 500, 700 or 900 in half.

According to an embodiment of the disclosure, the first glass portion 310, 510, 710, or 910 may include a first area 311, 511, 711, or 911 chemically reinforced inward from a surface by a first depth T2, T2', T2", or T2'". The second glass portion 320, 520, 720, or 920 may include a second area 321, 521, 721, or 921 chemically reinforced inward from a surface by a second depth T4, T4', T4", or T4'" different from the first depth T2, T2', T2", or T2'".

According to an embodiment of the disclosure, a ratio of the first depth T2, T2', T2", or T2'" to the first thickness T1, T1', T1", or T1'" may be substantially the same as a ratio of the second enhancement depth T4, T4', T4", or T4'" to the second thickness T3, T3', T3", or T3'".

According to an embodiment of the disclosure, a flexible display may comprise a display panel and a transparent member 300, 500, 700, or 900 disposed on the display panel. The transparent member 300, 500, 700, or 900 may include a first glass portion 310, 510, 710 or 910 of a first thickness T1, T1', T1", or T1'" having a first area 311, 511, 711, or 911 of a first depth T2, T2', T2", or T2'" from a surface. The transparent member 300, 500, 700, or 900 may include a second glass portion 320, 520, 720, or 910 of a second thickness T3, T3', T3", or T3'" thinner than the first thickness T1, T1', T1", or T1'" having a second area 321, 521, 721, or 921 of a second depth T4, T4', T4", or T4'" smaller than the first depth T2, T2', T2", or T2'".

A method of manufacturing a transparent member according to an embodiment comprises chemically strengthening an entire surface of a glass for a first time, etching a portion of the glass that has been chemically strengthened for a first period, and chemically strengthening the entire surface of the partially etched glass for a second period shorter than the first period.

The terms as used herein are provided merely to describe some embodiments thereof, but are not intended to limit the disclosure. As used herein, the singular forms "a," "an," and "the" are intended to include the plural forms as well, unless the context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, the term 'and/or' should be understood as encompassing any and all possible combinations by one or more of the enumerated items. As used herein, the terms "include," "have," and "comprise" are used merely to designate the presence of the feature, component, part, or a combination thereof described herein, but use of the term does not exclude the likelihood of presence or adding one or more other features, components, parts, or combinations thereof. As used herein, the terms "first" and "second" may modify various components regardless of importance and/or order and are used to distinguish a component from another without limiting the components.

As used herein, the terms "configured to" may be interchangeably used with the terms "suitable for," "having the capacity to," "designed to," "adapted to," "made to," or "capable of" depending on circumstances. The term "configured to" does not essentially mean "specifically designed in hardware to." Rather, the term "configured to" may mean that a device can perform an operation together with another device or parts. For example, a 'device configured (or set) to perform A, B, and C' may be a dedicated device to perform the corresponding operation or may mean a general-purpose device capable of various operations including the corresponding operation.

Meanwhile, the terms "upper side", "lower side", and "front and rear directions" used in the disclosure are defined with respect to the drawings, and the shape and position of each component are not limited by these terms.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A flexible transparent member comprising:
a first glass portion having a first thickness;
a second glass portion having a second thickness that is thinner than the first thickness; and
at least one resin portion,
wherein an upper surface of the second glass portion is recessed in a downward direction with respect to an upper surface of the first glass portion and forms an upper recess,
wherein a lower surface of the second glass portion is recessed in an upward direction with respect to a lower surface of the first glass portion and forms a lower recess,
wherein the at least one resin portion is respectively disposed in at least one of the upper recess or the lower recess,
wherein the first glass portion is chemically reinforced inward from the upper surface and the lower surface of the first glass portion by a first depth,
wherein the second glass portion is chemically reinforced inward from the upper surface and the lower surface of the second glass portion by a second depth,
wherein the first depth has a length of 5% to 20% of a thickness of the first glass portion, and
wherein the second depth has a length of 5% to 20% of a thickness of the second glass portion.

2. The flexible transparent member of claim 1,
wherein the first glass portion and the second glass portion are formed to be horizontally symmetrical.

3. The flexible transparent member of claim 1,
wherein a first ratio of the first depth to the first thickness is substantially same as a second ratio of the second depth to the second thickness.

4. The flexible transparent member of claim 1,
wherein the first glass portion is chemically reinforced based on a first chemical reinforcement process,
wherein the second glass portion is chemically reinforced based on a second chemical reinforcement process, and
wherein the first chemical reinforcement process is different than the second chemical reinforcement process.

5. A flexible display comprising:
a display panel; and
a transparent member disposed on the display panel,
wherein the transparent member includes:
a first glass portion having a first thickness, and
a second glass portion having a second thickness that is thinner than the first thickness, wherein an upper surface of the second glass portion is recessed in a direction toward the display panel with respect to an upper surface of the first glass portion, wherein a lower surface of the second glass portion is recessed in an opposite direction to the display panel with respect to a lower surface of the first glass portion, wherein the first glass portion is chemically reinforced inward from the upper surface and the lower surface of the first glass portion by a first depth, wherein the second glass portion is chemically reinforced inward from the upper surface and the lower surface of the second glass portion by a second depth, wherein the first depth has a length of 5% to 20% of a thickness of the first glass portion, and wherein the second depth has a length of 5% to 20% of a thickness of the second glass portion.

6. The flexible display of claim 5, wherein the first depth is greater than the second depth.

7. The flexible display of claim 5, wherein a first ratio of the first depth to the first thickness is substantially same as a second ratio of the second depth to the second thickness.

8. The flexible display of claim 5, wherein the second glass portion has a stepped shape with respect to the first glass portion.

9. The flexible display of claim 5, wherein the transparent member further includes a third glass portion formed to be sloped to connect the first glass portion and the second glass portion.

10. The flexible display of claim 5, wherein the second glass portion has a penetrated portion.

11. The flexible display of claim 5, wherein at least one of the upper surface or the lower surface of the second glass portion has a pattern in which a concave portion and a convex portion are alternately disposed.

12. The flexible display of claim 11, wherein a boundary between the concave portion and the convex portion is formed by a vertical step.

13. The flexible display of claim 11, wherein the pattern in which the concave portion and the convex portion are alternately disposed has a wave-shaped cross section.

14. The flexible display of claim 5, wherein the second glass portion is formed to be symmetrical with respect to a virtual plane that divides a thickness of the transparent member in half.

15. The flexible display of claim 5, wherein the first glass portion is chemically reinforced based on a first chemical reinforcement process, wherein the second glass portion is chemically reinforced based on a second chemical reinforcement process, and wherein the first chemical reinforcement process is different than the second chemical reinforcement process.

16. An electronic device comprising:

a housing including a first housing and a second housing;

a hinge module connected with the first housing and the second housing; and a flexible display at least partially received in the first housing and the second housing, wherein the flexible display includes:

a display panel, and a transparent member arranged on the display panel, wherein the transparent member includes:

a first glass portion having a first thickness, and a second glass portion having a second thickness that is thinner than the first thickness, wherein an upper surface of the second glass portion is recessed in a direction toward the display panel with respect to an upper surface of the first glass portion, wherein a lower surface of the second glass portion is recessed in an opposite direction to the display panel with respect to a lower surface of the first glass portion, wherein the first glass portion is chemically reinforced inward from the upper surface and the lower surface of the first glass portion by a first depth, wherein the second glass portion is chemically reinforced inward from the upper surface and the lower surface of the second glass portion by a second depth, wherein the first depth has a length of 5% to 20% of a thickness of the first glass portion, and wherein the second depth has a length of 5% to 20% of a thickness of the second glass portion.

17. The electronic device of claim 16, wherein the second glass portion is formed to be symmetrical with respect to a virtual plane that divides a thickness of the transparent member in half.

18. The electronic device of claim 16, wherein a first ratio of the first depth to the first thickness is substantially same as a second ratio of the second depth to the second thickness.

19. The electronic device of claim 16, wherein the first glass portion is chemically reinforced based on a first chemical reinforcement process, wherein the second glass portion is chemically reinforced based on a second chemical reinforcement process, and wherein the first chemical reinforcement process is different than the second chemical reinforcement process.

* * * * *